(12) United States Patent
Tanabe et al.

(10) Patent No.: US 8,912,344 B2
(45) Date of Patent: Dec. 16, 2014

(54) DYE FOR PHOTOELECTRIC CONVERSION DEVICE AND PHOTOELECTRIC CONVERSION DEVICE

(75) Inventors: Junji Tanabe, Tokyo (JP); Atsushi Monden, Tokyo (JP); Masahiro Shinkai, Tokyo (JP); Toru Yano, Tokyo (JP); Yukiko Mae, Tokyo (JP); Yohei Aoyama, Tokyo (JP)

(73) Assignee: Adeka Corporation, Tokyo (JP)

( * ) Notice: Subject to any disclaimer, the term of this patent is extended or adjusted under 35 U.S.C. 154(b) by 566 days.

(21) Appl. No.: 13/141,993

(22) PCT Filed: Dec. 25, 2009

(86) PCT No.: PCT/JP2009/071547
§ 371 (c)(1),
(2), (4) Date: Jun. 24, 2011

(87) PCT Pub. No.: WO2010/074203
PCT Pub. Date: Jul. 1, 2010

(65) Prior Publication Data
US 2011/0253218 A1 Oct. 20, 2011

(30) Foreign Application Priority Data
Dec. 26, 2008 (JP) .................................. 2008-333597

(51) Int. Cl.
| | | |
|---|---|---|
| *C09B 23/04* | (2006.01) | |
| *C09B 23/06* | (2006.01) | |
| *C09B 23/08* | (2006.01) | |
| *C09B 23/01* | (2006.01) | |
| *H01L 51/00* | (2006.01) | |
| *C09B 23/10* | (2006.01) | |
| *H01G 9/20* | (2006.01) | |

(52) U.S. Cl.
CPC .......... *H01G 9/2059* (2013.01); *C09B 23/0016* (2013.01); *Y02E 10/542* (2013.01); *C09B 23/0058* (2013.01); *C09B 23/06* (2013.01); *H01L 51/0064* (2013.01); *C09B 23/102* (2013.01); *H01G 9/2031* (2013.01); *C09B 23/107* (2013.01); *C09B 23/0066* (2013.01); *C09B 23/083* (2013.01); *C09B 23/08* (2013.01); *C09B 23/086* (2013.01); *C09B 23/0025* (2013.01); *C09B 23/0008* (2013.01); *C09B 23/04* (2013.01)
USPC .......................................................... 548/426

(58) Field of Classification Search
CPC ........ C09B 23/04; C09B 23/06; C09B 23/08; C09B 23/083; C09B 23/086; C09B 23/102; C09B 23/107
USPC .......................................................... 548/426
See application file for complete search history.

(56) References Cited

U.S. PATENT DOCUMENTS

| | | |
|---|---|---|
| 2008/0236663 A1 | 10/2008 | Tanabe et al. |
| 2010/0003445 A1 | 1/2010 | Yano et al. |

FOREIGN PATENT DOCUMENTS

| | | |
|---|---|---|
| JP | A-60-205841 | 10/1985 |
| JP | A-02-264937 | 10/1990 |
| JP | A-2007-220412 | 8/2007 |
| JP | A-2008-166119 | 7/2008 |
| JP | A-2008-274230 | 11/2008 |
| JP | A-2008-277268 | 11/2008 |

OTHER PUBLICATIONS

Document No. 105:200577 retreived from CAPLUS, entered in STN on Nov. 28, 1986.*
Document No. 104:197113, retrieved from CAPLUS, entered in STN on Jun. 1, 1986.*
Document No. 103:96494, retrieved from CAPLUS, entered in STN on Sep. 22, 1985.*
Document No. 31:11915, retrieved from CAPLUS, entered in STN on Dec. 16, 2001.*
International Search Report issued in Application No. PCT/JP2009/071547; Dated Mar. 30, 2010 (With Translation).

* cited by examiner

*Primary Examiner* — Shawquia Young
(74) *Attorney, Agent, or Firm* — Oliff PLC

(57) ABSTRACT

A photoelectric conversion device capable of improving conversion efficiency is provided. The photoelectric conversion device includes a work electrode, a counter electrode, and an electrolyte-containing layer. In the work electrode, a metal oxide semiconductor layer supporting a dye is provided. The dye contains a cyanine compound. The cyanine compound has heterocyclic skeletons containing indolenine skeletons bonded with both ends of a methine chain, an anchor group introduced to a nitrogen atom contained in the indolenine skeletons, and a phenanthrene skeleton contained in one of the heterocyclic skeletons. In the case where light enters the dye, electron injection efficiency to the metal oxide semiconductor layer is improved.

15 Claims, 2 Drawing Sheets

DYE FOR PHOTOELECTRIC CONVERSION DEVICE AND PHOTOELECTRIC CONVERSION DEVICE

TECHNICAL FIELD

The present invention relates to a photoelectric conversion device using a dye and a dye suitably used for the photoelectric conversion device.

BACKGROUND ART

In the past, in various technology fields, dyes have been widely used. To take an example, in the photoelectric conversion device field such as a solar cell, dyes are used for a dye-sensitized photoelectric conversion device using a dye having photosensitization action. In the dye-sensitized photoelectric conversion device, high efficiency is able to be expected theoretically. In addition, the dye-sensitized photoelectric conversion device is regarded as a device that is significantly advantageous on the cost front more than an existing photoelectric conversion device using silicon semiconductor.

The dye-sensitized photoelectric conversion device has an electrode having oxide semiconductor as a dye support. In the dye-sensitized photoelectric conversion device, the dye absorbs incident light and is excited, and the excited dye injects electrons into the support. Thereby, photoelectron conversion is made. As the dye used for the dye-sensitized photoelectric conversion device, a ruthenium complex dye and an organic dye are known. In particular, the organic dye is comparatively stable and is able to be easily synthesized, and thus various studies have been made for the organic dye. Specifically, the technology using a cyanine dye having a carboxylic acid group as an anchor group for being absorbed to the oxide semiconductor electrode together with a structure in which an indolenine skeleton is bonded with both ends of a methine chain skeleton for the purpose of improving conversion efficiency or the like has been known (for example, refer to Patent Documents 1 and 2). Such a cyanine dye is used as a dye for an optical filter and an optical recording material as well (for example, refer to Patent Document 3).

PRIOR ART DOCUMENT

Patent Document

Patent Document 1: Japanese Unexamined Patent Application Publication No. 2007-220412
Patent Document 2: Japanese Unexamined Patent Application Publication No. 2008-166119
Patent Document 3: Japanese Unexamined Patent Application Publication No. 2008-274230

SUMMARY OF INVENTION

However, in the existing photoelectric conversion device using the cyanine dye, sufficient conversion efficiency has been hardly obtained. Specifically, the light absorption wavelength region width of the existing cyanine dye is not sufficiently wide. Thus, the conversion efficiency of the photoelectric conversion device dependent on the light absorption wavelength region width of the dye is hardly improved. Accordingly, more improvement of the conversion efficiency has been desired.

In view of the foregoing problems, it is a first object of the present invention to provide a dye for a photoelectric conversion device capable of improving conversion efficiency and a photoelectric conversion device.

A dye for a photoelectric conversion device of the present invention has a cyanine structure expressed by Formula (1). Further, a photoelectric conversion device of the present invention comprises an electrode having a dye and a support that supports the dye, and the dye contains a cyanine compound having the cyanine structure shown in Formula (1).

[Chemical formula 1]

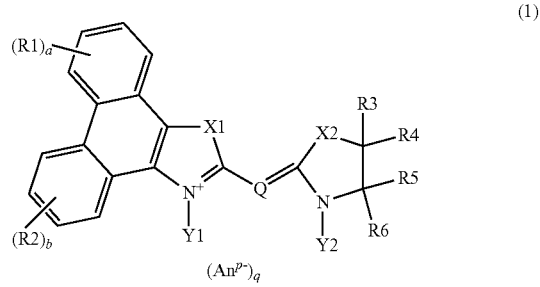

(1)

(R1 and R2 are respectively and independently a hydroxyl group, a nitro group, a cyano group, or a halogen atom; or an alkyl group, an alkoxy group, an aryl group, an arylalkyl group, or a derivative thereof. a and b are respectively and independently an integer number out of 0 to 4. R3 to R6 are respectively and independently a hydrogen atom, a hydroxyl group, a nitro group, a cyano group, or a halogen atom; or an alkyl group, an alkoxy group, an aryl group, an arylalkyl group, or a derivative thereof. At least one of R3 and R4 and at least one of R5 and R6 may be respectively detached to form double bond, or may be respectively linked with each other to form one or more ring structures. X1 is a group expressed by —C(R7)(R8)-, a group expressed by —N(R9)-, a sulfur atom, an oxygen atom, a selenium atom, or a tellurium atom. X2 is a group expressed by —C(R10)(R11)-, a group expressed by —N(R12)-, a sulfur atom, an oxygen atom, a selenium atom, or a tellurium atom. R7, R8, R10, and R11 are respectively and independently a hydrogen atom or a group expressed by Formula (2); or an alkyl group, an alkoxy group, an aryl group, an arylalkyl group, or a derivative thereof except for a group corresponding to the group shown in Formula (2). R9 and R12 are respectively and independently a hydrogen atom, a hydroxyl group, a nitro group, a cyano group, or a halogen atom; or an alkyl group, an alkoxy group, an aryl group; or an arylalkyl group, or a derivative thereof. Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency, p is 1 or 2, and q is a coefficient to maintain neutral electric charge.)

"Derivative" explained in Formula (1) means a group obtained by substituting one or more hydrogen atoms in a substituent group with other atom or other atom group. Examples of an atom introduced instead of a hydrogen atom include a halogen atom. Examples of an atom group introduced instead of a hydrogen atom include a hydroxyl group, a nitro group, a cyano group, an acyl group, a saturated cyclic hydrocarbon group, an unsaturated cyclic hydrocarbon group, an aromatic ring group, and a heterocyclic group. Further, "may be respectively detached to form double bond" means that, for example, it is possible that at least one of R3 and R4 and at least one of R5 and R6 shown in Formula (1) are detached, and a carbon atom to which R3 and R4 are introduced and a carbon atom to which R5 and R6 are introduced are double-bonded. The same is applied to bond between a carbon atom to which R3 and R4 are introduced and a carbon atom to which R5 and R6 are introduced in the after-mentioned Formula (3). Further, "anchor group" is a group having chemical or electrostatic affinity and binding ability in relation to a support that supports a compound.

[Chemical formula 2]

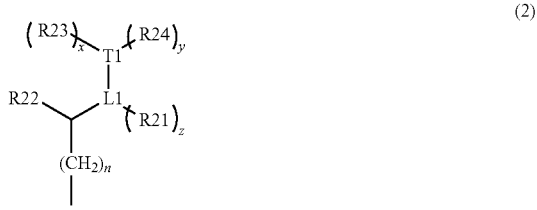

(2)

(Bond between L1 and T1 is double bond or triple bond. L1 represents a carbon atom. T1 represents a carbon atom, an oxygen atom, or a nitrogen atom. x, y, and z are respectively and independently 0 or 1 (x and y are 0 where T1 is an oxygen atom, and (y+z) is 0 or 1 where T1 is a nitrogen atom). R21 to R23 are respectively and independently a hydrogen atom, a hydroxyl group, a nitro group, a cyano group, a halogen atom, an alkyl group with carbon atomicity from 1 to 4 both inclusive, or a halogenated alkyl group with carbon atomicity from 1 to 4 both inclusive. R24 is a hydrogen atom, a hydroxyl group, a nitro group, a cyano group, a halogen atom, an alkyl group with carbon atomicity from 1 to 4 both inclusive, an alkoxy group with carbon atomicity from 1 to 4 both inclusive, a halogenated alkyl group with carbon atomicity from 1 to 4 both inclusive, or a halogenated alkoxy group with carbon atomicity from 1 to 4 both inclusive. R21 and R24/R22 and R23 may be respectively linked with each other to form one or more ring structures. n is an integer number out of 0 to 4.)

"Halogenation" of the halogenated alkyl group and the halogenated alkoxy group explained in Formula (2) means a group in which part or all of hydrogen atoms contained in the alkyl group and the alkoxy group are substituted by one or more atoms out of halogen elements.

In the dye for a photoelectric conversion device and the photoelectric conversion device of the present invention, the cyanine structure shown in Formula (1) contains the phenanthrene skeletons condensed with the five-membered ring skeleton as one of the heterocyclic skeletons introduced to both ends of the methine chain skeleton (Q). Thereby, due to broadened π conjugation as an entire molecule, the light absorption peak wavelength is shifted to longer wavelength side than the light absorption peak wavelength of a cyanine compound containing a benzene skeleton or a naphthalene skeleton instead of the phenanthrene skeleton. Meanwhile, the light absorption peak of the cyanine structure shown in Formula (1) is broadened in a state that the peak intensity is secured. Furthermore, in the cyanine structure shown in Formula (1), at least one of Y1 and Y2 bonded with a nitrogen atom contained in the five-membered ring section in the heterocyclic skeleton functions as an anchor group contributing to bond with the support. Thereby, if light is absorbed and excitation is initiated in the state of being supported by the support, electrons are efficiently injected into the support. That is, in the compound having the cyanine structure shown in Formula (1) (hereinafter referred to as the cyanine compound show in Formula (1)), if light is radiated in the state of being supported by the support, light in a wide wavelength region is absorbed and excitation is initiated, and electrons are efficiently injected into the support compared to the cyanine compound containing a benzene skeleton or a naphthalene skeleton instead of the phenanthrene skeleton. Thus, in a photoelectric conversion device using the cyanine compound shown in Formula (1) as a dye, the ratio of electron injection amount into the support in relation to radiated light amount is increased, and photoelectric conversion efficiency is improved.

In the dye for a photoelectric conversion device and the photoelectric conversion device of the present invention, the cyanine compound shown in Formula (1) may be a compound having a structure expressed by Formula (3). A general cyanine compound (a compound containing a structure in which heterocyclic skeletons are bonded with both ends of a methine chain skeleton) tends to have a structure in which carbon atoms and hetero atoms structuring the methine chain skeleton and the heterocyclic skeleton are arranged in a plane surface (highly planar structure). In the case where the planarity of a molecule structure is high, each molecule aggregates each other, and an aggregate such as a dimer is easily formed. A dye in which the aggregate is formed hardly contributes to photoelectric conversion. However, in the compound shown in Formula (3) in which the heterocyclic skeleton contained the indolenine skeleton, R7 and R8 are arranged to extend in the upper face side space and the lower face side space with respect to the plane containing the methine chain skeleton and the heterocyclic skeleton. Thus, the planarity is lowered as an entire molecule, and an aggregate is hardly formed. Thereby, in a photoelectric conversion device using the compound shown in Formula (3) as a dye, the ratio of the aggregate hardly contributing to photoelectric conversion in the entire dye supported by the support is lowered, and therefore photoelectric conversion efficiency becomes favorable.

[Chemical formula 3]

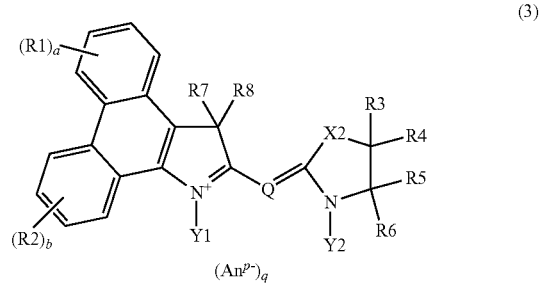

(3)

(R1 and R2 are respectively and independently a hydroxyl group, a nitro group, a cyano group, or a halogen atom; or an alkyl group, an alkoxy group, an aryl group, an arylalkyl group, or a derivative thereof. a and b are respectively and independently an integer number out of 0 to 4. R3 to R6 are respectively and independently a hydrogen atom, a hydroxyl group, a nitro group, a cyano group, or a halogen atom; or an alkyl group, an alkoxy group, an aryl group, an arylalkyl group, or a derivative thereof. At least one of R3 and R4 and at least one of R5 and R6 may be respectively detached to form double bond, or may be respectively linked with each other to form one or more ring structures. X2 is a group expressed by —C(R10)(R11)-, a group expressed by —N(R12)—, a sulfur atom, an oxygen atom, a selenium atom, or a tellurium atom. R7, R8, R10, and R11 are respectively and independently a hydrogen atom or the group shown in the foregoing Formula (2); or an alkyl group, an alkoxy group, an aryl group, an arylalkyl group, or a derivative thereof except for a group corresponding to the group shown in the Formula (2). R12 are respectively and independently a hydrogen atom, a hydroxyl group, a nitro group, a cyano group, or a halogen atom; or an alkyl group, an alkoxy group, an aryl group, an arylalkyl group, or a derivative thereof. Y1 and Y2 are respectively and independently an anchor group; or an alkyl group, an alkoxy group, an aryl group; or an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

In the dye for a photoelectric conversion device and the photoelectric conversion device of the present invention, the cyanine compound shown in Formula (1) may be a compound having a structure expressed by Formula (4). In this case, in the compound shown in Formula (4), R10, and R11 together with R7, R8 in Formula (4) are arranged to extend in both the upper face side space and the lower face side space with respect to the plane containing the methine chain skeleton and the heterocyclic skeleton. Thus, the planarity is further lowered as an entire molecule, and an aggregate is further hardly formed. Thereby, in a photoelectric conversion device using the compound shown in Formula (4) as a dye, the ratio of the aggregate hardly contributing to photoelectric conversion in the entire dye supported by the support is lowered, and therefore photoelectric conversion efficiency becomes favorable.

[Chemical formula 4]

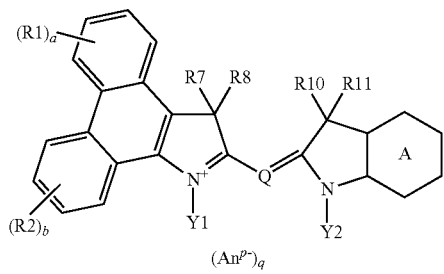

(4)

(R1 and R2 are respectively and independently a hydroxyl group, a nitro group, a cyano group, or a halogen atom; or an alkyl group, an alkoxy group, an aryl group, an arylalkyl group, or a derivative thereof a and b are respectively and independently an integer number out of 0 to 4. R7, R8 R10, R11 are respectively and independently a hydrogen atom or the group shown in the foregoing Formula (2); or an alkyl group, an alkoxy group, an aryl group, an arylalkyl group, or a derivative thereof except for a group corresponding to the group shown in Formula (2). Ring A is a benzene ring, a naphthalene ring, a phenanthrene ring, or a derivative thereof. Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

Further, in the dye for a photoelectric conversion device and the photoelectric conversion device of the present invention, the cyanine compound shown in Formula (1) may be a compound having a structure expressed by Formula (5). In this case, in the structure shown in Formula (5), both heterocyclic skeletons introduced to both ends of the methine chain skeleton contain a phenanthrene skeleton. Thus, electrons are more effectively injected to the support. In addition, the planarity is further lowered as an entire molecule, and an aggregate is further hardly formed. Thereby, in a photoelectric conversion device using the compound shown in Formula (5) as a dye, the ratio of the aggregate hardly contributing to photoelectric conversion in the entire dye supported by the support is lowered, and the ratio of electron injection amount into the support in relation to radiated light amount is increased. Accordingly, photoelectric conversion efficiency is further improved.

[Chemical formula 5]

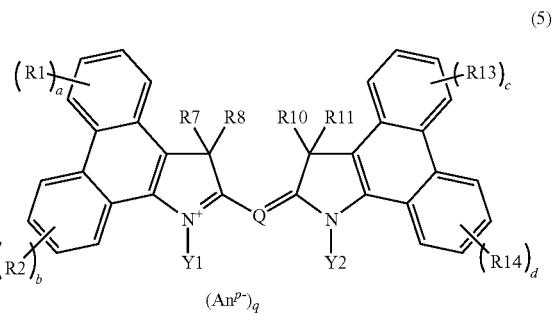

(5)

(R1, R2, R13, and R14 are respectively and independently a hydroxyl group, a nitro group, a cyano group, or a halogen atom; or an alkyl group, an alkoxy group, an aryl group, an arylalkyl group, or a derivative thereof. a to d are respectively and independently an integer number out of 0 to 4. R7, R8, R10, and R11 are respectively and independently a hydrogen atom or the group shown in the foregoing Formula (2); or an alkyl group, an alkoxy group, an aryl group, an arylalkyl group, or a derivative thereof except for a group corresponding to the group shown in Formula (2). Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

Further, in the dye for a photoelectric conversion device and the photoelectric conversion device of the present invention, at least one of R7, R8, R10, and R11 shown in Formula (1) or Formula (3) to Formula (5) is preferably the group shown in the foregoing Formula (2). Thereby, the sterically bulky group shown in Formula (2) is arranged to largely extend in at least one space out of the upper face side space and the lower face side space with respect to the plane containing the methine chain skeleton and the heterocyclic skeleton in the cyanine structure. Thus, as an entire molecule, sterically large size that is further hardly associated is obtained. Thereby, in a photoelectric conversion device using the dye, the ratio of the aggregate hardly contributing to photoelectric conversion in the entire dye supported by the support is lowered, and therefore photoelectric conversion efficiency is further improved.

Further, in the dye for a photoelectric conversion device and the photoelectric conversion device of the present invention, the anchor group shown in Formula (1) or Formula (3) to Formula (5) is preferably a group expressed by the —CH$_2$—CH$_2$—C(=O)—OH or a group expressed by —CH$_2$—CH$_2$—C(=O)—O$^-$. Further, both Y1 and Y2 shown in Formula (1) or Formula (3) to Formula (5) is preferably an anchor group. Thereby, since the dye is hardly exfoliated from a support, the ratio of electron injection amount into the support in relation to radiated light amount is increased. Accordingly, photoelectric conversion efficiency is more favorably made. Further, Q shown in Formula (1) or Formula (3) to Formula (5) is preferably a linkage group in which one or more cyano groups is introduced to a methine chain skeleton. Thereby, photoelectric conversion efficiency is further improved.

Further, in the photoelectric conversion device of the present invention, the support preferably contains zinc oxide (ZnO). Thereby, photoelectric conversion efficiency is further improved.

The dye for a photoelectric conversion device of the present invention contains the cyanine structure shown in Formula (1). Thus, compared to a dye not having the structure, excitation is generated by absorbing wider wavelength region light, and electron injection efficiency to the support that supports the dye is improved. Thus, according to the photoelectric conversion device of the present invention, since the dye supported by the support contains the compound having the cyanine structure shown in Formula (1), conversion efficiency is able to be improved. In this case, in the case where at least one of R7, R$^8$, R10, and R11 shown in Formula (1) is the group shown in the foregoing Formula (2), formation of an aggregate is more inhibited, and thus conversion efficiency is able to be more improved. Further, in the case where both Y1 and Y2 in Formula (1) are an anchor group, or in the case where Q in Formula (1) is a linkage group in which one or more cyano groups is introduced to a methine chain skeleton, higher conversion efficiency is able to be obtained.

Further, in particular, in the case where the support that supports the dye contains zinc oxide, conversion efficiency is able to be further improved.

BEST MODE FOR CARRYING OUT THE INVENTION

Figure 1:
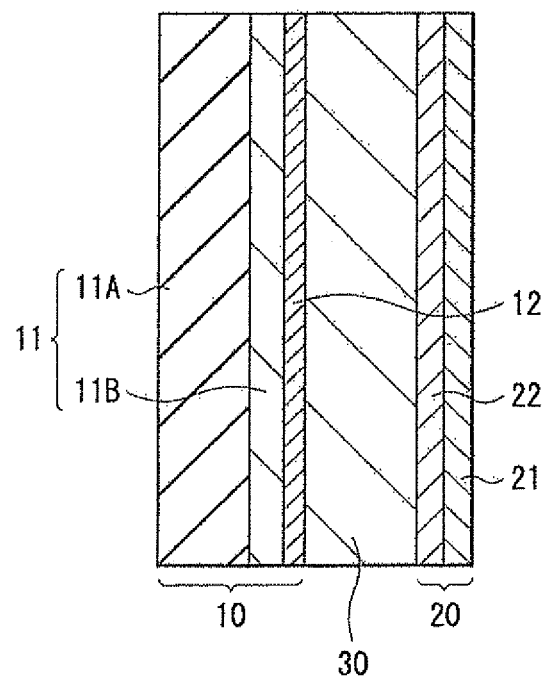
FIG. 1 is a cross sectional view illustrating a structure of a photoelectric conversion device using a dye according to an embodiment of the present invention.

An embodiment of the present invention will be hereinafter described in detail with reference to the drawings.

A dye according to the embodiment of the present invention is used for a dye-sensitized photoelectric conversion device (for a photoelectric conversion device), and has the cyanine structure expressed by Formula (1) (hereinafter referred to as the cyanine compound shown in Formula (1)). The cyanine compound shown in Formula (1) is, for example, a compound that has absorptive property (associativity) to a support containing a metal oxide semiconductor material or the like, and that absorbs light, is excited, and is able to inject electrons into the support thereof.

The structure shown in Formula (1) expresses that the cyanine compound has a resonance structure between a methine chain skeleton (Q) and two nitrogen atoms in heterocyclic skeletons introduced to both ends thereof. Thus, Formula (1) expresses a structure formula in a state that the nitrogen atom contained in the heterocyclic skeleton having a phenanthrene ring (nitrogen atom to which Y1 is introduced) is charged positively (N$^+$). However, the cyanine compound shown in Formula (1) is not limited to the structure shown in the structure formula. For example, the nitrogen atom bonded with Y2 in Formula (1) may be charged positively. In this case, it is possible to adopt resonance structure expressed by a structure formula in which double bond and single bond are alternately repeated in bond between carbon atoms in the methine chain skeleton and bond between the nitrogen atom to which Y1 is introduced and a carbon atom adjacent to Q side of the nitrogen atom so that double bond is formed between the nitrogen atom bonded with Y2 and a carbon atom adjacent to Q side of the nitrogen atom. Further, the compound expressed by other structure formula to have a resonance structure may be adopted. The same is applied to the after-mentioned structure formulas (for example, structure formulas of Formula (3) to Formula (5)).

[Chemcial formula 6]

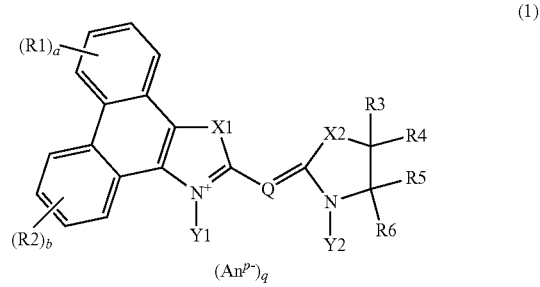

(1)

(R1 and R2 are respectively and independently a hydroxyl group, a nitro group, a cyano group, or a halogen atom; or an alkyl group, an alkoxy group, an aryl group, an arylalkyl group, or a derivative thereof. a and b are respectively and independently an integer number out of 0 to 4. R3 to R6 are respectively and independently a hydrogen atom, a hydroxyl group, a nitro group, a cyano group, or a halogen atom; or an alkyl group, an alkoxy group, an aryl group, an arylalkyl group, or a derivative thereof. At least one of R3 and R4 and at least one of R5 and R6 may be respectively detached to form double bond, or may be respectively linked with each other to form one or more ring structures. X1 is a group expressed by —C(R7)(R8)-, a group expressed by —N(R9)-, a sulfur atom, an oxygen atom, a selenium atom, or a tellurium atom. X2 is a group expressed by —C(R10)(R11)-, a group expressed by —N(R12)-, a sulfur atom, an oxygen atom, a selenium atom, or a tellurium atom. R7, R8, R10, and R11 are respectively and independently a hydrogen atom or a group expressed by Formula (2); or an alkyl group, an alkoxy group, an aryl group, an arylalkyl group, or a derivative thereof except for a group corresponding to the group shown in Formula (2). R9 and R12 are respectively and independently a hydrogen atom, a hydroxyl group, a nitro group, a cyano group, or a halogen atom; or an alkyl group, an alkoxy group, an aryl group, an arylalkyl group, or a derivative thereof. Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. An$^{p-}$ is an anion with p valency. p is 1 or 2, and q is a coefficient to maintain neutral electric charge.)

[Chemical formula 7]

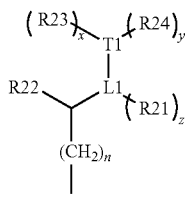

(2)

(Bond between L1 and T1 is double bond or triple bond. L1 represents a carbon atom, T1 represents a carbon atom, an oxygen atom, or a nitrogen atom. x, y, and z are respectively and independently 0 or 1 (x and y are 0 where T1 is an oxygen atom, and (y+z) is 0 or 1 where T1 is a nitrogen atom). R21 to R23 are respectively and independently a hydrogen atom, a hydroxyl group, a nitro group, a cyano group, a halogen atom, an alkyl group with carbon atomicity from 1 to 4 both inclusive, or a halogenated alkyl group with carbon atomicity from 1 to 4 both inclusive. R24 is a hydrogen atom, a hydroxyl group, a nitro group, a cyano group, a halogen atom, an alkyl group with carbon atomicity from 1 to 4 both inclusive, an alkoxy group with carbon atomicity from 1 to 4 both inclusive, a halogenated alkyl group with carbon atomicity from 1 to 4 both inclusive, or a halogenated alkoxy group with carbon atomicity from 1 to 4 both inclusive. R21 and R24/R22 and R23 may be respectively linked with each other to form one or more ring structures. n is an integer number out of 0 to 4.)

The cyanine compound shown in Formula (1) contains the heterocyclic skeletons containing a five-membered ring skeleton introduced to both ends of the methine chain skeleton (Q) and an anchor group introduced as at least one of Y1 and Y2 bonded with a nitrogen atom contained in the five-membered ring skeletons. At least one of both heterocyclic skeletons introduced to both ends of the methine chain skeleton contains a phenanthrene skeleton condensed with the five-membered ring skeleton. Since the cyanine compound shown in Formula (1) contains the methine chain skeleton with carbon atomicity from 1 to 7 both inclusive, the light absorption peak wavelength of the compound exists between ultraviolet light region and near-infrared light region. The light absorption peak wavelength is shifted to longer wavelength side than the light absorption peak wavelength of a cyanine compound containing a benzene skeleton or a naphthalene skeleton instead of the phenanthrene skeleton for the following reason. That is, since the phenanthrene skeleton is contained, π conjugation is widened as an entire molecule. In addition, the light absorption peak of the cyanine compound shown in Formula (1) is broadened in a state that the peak intensity is more secured than the light absorption peak of a cyanine compound not having a phenanthrene skeleton. That is, since the phenanthrene skeleton is contained, the width of the light absorption wavelength region of the cyanine compound shown in Formula (1) is wider than the width of the light absorption wavelength region of the cyanine compound not having a phenanthrene skeleton. In addition, since the anchor group contributing to bond with a support is introduced to at least one of the nitrogen atoms of both heterocyclic skeletons, if light is absorbed and excitation is initiated in the state of being supported by the support, electrons are efficiently injected into the support. Thereby, in the cyanine compound shown in Formula (1), if light containing elements in the ultraviolet light region, the visible light region, and the near-infrared light region is radiated in a state of being supported by the support, light element in a wide wavelength region thereof is absorbed and excitation is initiated, and electrons are efficiently injected into the support. Thus, in a photoelectric conversion device using the cyanine compound shown in Formula (1), the ratio of electron injection amount into the support in relation to radiated light amount is increased, and conversion efficiency is improved. As long as the cyanine compound shown in Formula (1) has the structure shown in Formula (1), a mirror image isomer thereof or a diastereomer thereof provides similar effect.

R1 and R2 explained in Formula (1) represent a group except for a hydrogen atom (hydrogen group) introduced to the phenanthrene skeleton. The type thereof is voluntary as long as R1 and R2 are one of the foregoing monovalent groups, and the number thereof (a and b in Formula (1)) is voluntary as long as the number is an integer number out of 0 to 4. In the case where the total of a and b is 2 or more and two out of the plurality of R1 and R2 are adjacent to each other, two adjacent groups may be bonded with each other to form one or more ring structures. However, in view of easiness of synthesis, R1 and R2 are preferably introduced as a univalent group without forming a ring structure.

In the case where R1 and R2 are a halogen atom, examples of the halogen atom include a fluorine atom, a chlorine atom, a bromine atom, and an iodine atom.

In the case where R1 and R2 are an alkyl group, an alkoxy group, an aryl group, an arylalkyl group, or a derivative thereof, the carbon atomicity that structures the skeleton thereof is voluntary. In this case, examples of an alkyl group, an alkoxy group, an aryl group, an arylalkyl group, or a derivative thereof include the following. That is, examples of an alkyl group and a derivative thereof include an alkyl group with carbon atomicity from 1 to 25 both inclusive such as a methyl group, an ethyl group, a propyl group, an isopropyl group, a butyl group, a secondary butyl group, a tertiary butyl group, an isobutyl group, an amyl group, an isoamyl group, a hexyl group, a cyclohexyl group, a cyclohexyl methyl group, a cyclohexyl ethyl group, a heptyl group, an isoheptyl group, a tertiary heptyl group, an n-octyl group, an isooctyl group, a tertiary octyl group, a 2-ethyhexyl group, a nonyl group, an isononyl group, a decyl group, a dodecyl group, a hexadecyl group, a dococyl group, and a tetracocyl group; a halogenated group thereof, and a group obtained by introducing one or more aromatic ring groups such as a phenyl group, one or more heterocyclic groups such as a thiophene group, one or more acyl groups such as an acetyl group, or one or more acid groups such as a carboxylic group to the foregoing groups. Examples of an alkoxy group and a derivative thereof include an alkoxy group with carbon atomicity from 1 to 20 both inclusive such as a methoxy group, an ethoxy group, a propyloxy group, an isopropyloxy group, a butyloxy group, a secondary butyloxy group, a tertiary butyloxy group, an isobutyloxy group, an amyloxy group, an isoamyloxy group, a tertiary amyloxy group, a hexyloxy group, a cyclohexyloxy group, a cyclohexylmethyloxy group, a cyclohexylethyloxy group, a heptyloxy group, an isoheptyloxy group, a tertiary heptyloxy group, an n-octyloxy group, an isooctyloxy group, a tertiary octyloxy group, a 2-ethyhexyloxy group, a nonyloxy group, an isononyloxy group, a decyloxy group, a dodecyloxy group, a hexadecyloxy group, and a dococyloxy group; a halogenated group thereof; and a group obtained by introducing one or more aromatic ring groups such as a phenyl group, one or more heterocyclic groups such as a thiophene group, one or more acyl groups such as an acetyl group, or one or more acid groups such as a carboxylic group to the foregoing groups. Examples of an aryl group and a derivative thereof include an aryl group with carbon atomicity from 6 to 30 both inclusive such as a phenyl group, a naphthyl group, an anthracene-1-yl group, a tetracenyl group, a pentacenyl group, a chrycenyl group, a triphenylenyl group, a pyrenyl group, a picenyl group, and a perylenyl group; a halogenated group thereof; and a group obtained by introducing one or more alkyl groups such as a methyl group, one or more alkoxy groups such as a methoxy group, one or more aromatic ring groups such as a phenyl group, one or more heterocyclic groups such as a thiophene group, one or more acyl groups such as an acetyl group, or one or more acid groups such as a carboxylic group to the foregoing groups. Examples of an arylalkyl group and a derivative thereof include an arylalkyl group with carbon atomicity from 7 to 30 both inclusive such as a benzyl group, a phenethyl group, 2-phenylpropane group, a diphenylmethyl group, a triphenylmethyl group, a styryl group, a cinnamyl group, a naphthylmethyl group, and a biphenylmethyl group; a halogenated group thereof; and a group obtained by introducing one or more alkyl groups such as a methyl group, one or more alkoxy groups such as a methoxy group, one or more aromatic ring groups such as a phenyl group, one or more heterocyclic groups such as a thiophene group, one or more acyl groups such as an acetyl group, or one or more acid groups such as a carboxylic group to the foregoing groups.

R3 to R6 explained in Formula (1) are a group introduced to the carbon atom contained in the five-membered heterocyclic ring on the side not having a phenanthrene skeleton in Formula (1), and R3 to R6 are voluntary as long as R3 to R6 are one of the foregoing monovalent groups. Specific examples of R3 to R6 include a hydrogen atom (hydrogen group) and a group similar to the monovalent group introduced as R1 and R2. Specially, at least one of R3 to R6 is preferably an alkyl group with carbon atomicity from 1 to 25 both inclusive, an alkoxy group with carbon atomicity from 1 to 20 both inclusive, an aryl group, an arylalkyl group, or a derivative thereof. A general cyanine compound (a compound containing a structure in which heterocyclic skeletons are bonded with both ends of a methine chain skeleton) tends to have a structure in which carbon atoms and hetero atoms structuring the methine chain skeleton and the heterocyclic skeleton are arranged in a plane surface, which is a so-called highly planar structure. In the case where the planarity of a molecule structure is high, each molecule aggregates each other as if each molecule overlaps with each other, and an aggregate such as a dimer is easily formed. A dye in which the aggregate is formed has low electron injection efficiency even if the dye is supported by a support, and thus the dye hardly contributes to photoelectric conversion. However, regarding R3 to R6 introduced to the carbon atoms contained in the heterocyclic skeletons, if double bond is not formed between the carbon atoms, R3 to R6 are arranged to extend in the upper face side space and the lower face side space with respect to the plane containing the methine chain skeleton and the heterocyclic skeleton. Thus, in the case where the foregoing group is introduced as one of R3 to R6, the planarity is lowered as an entire molecule, and each molecule hardly aggregates each other. Thus, if used for a photoelectric conversion device, the ratio of aggregate that hardly contributes to photoelectric conversion in the entire supported dye is decreased, resulting in high conversion efficiency. Specially, at least one of R3 to R6 is preferably a sterically bulky group such as an alkyl group with carbon atomicity from 6 to 25 both inclusive, an alkoxy group with carbon atomicity from 5 to 20 both inclusive, an aryl group, an arylalkyl group, and a derivative thereof, since thereby formation of an aggregate is more inhibited, and high effect is obtained.

However, as explained in Formula (1), at least one of R3 and R4 and at least one of R5 and R6 may be detached to form double bond, or may be respectively linked with each other to form one or more ring structures. It is needless to say that at least one of R3 and R4 and at least one of R5 and R6 may be detached to form double bond, and the other non-detached one out of R3 and R4 may be linked with the other non-detached one out of R5 and R6 to form one or more ring structures. Examples of the ring structure formed by the foregoing linkage include a benzene ring, a naphthalene ring, an anthracene ring, a phenanthrene ring, a cyclohexane ring, a cyclobutane ring, a cyclopentane ring, a cyclohexane ring, a cycloheptane ring, a piperidine ring, a piperazine ring, a pyrrolidine ring, a morpholine ring, a thiomorpholine ring, a pyridine ring, a pyradine ring, a pyrimidine ring, a pyridazine ring, a triazine ring, a quinoline ring, an isoquinoline ring, an imidazole ring, an oxazole ring, and an imidazolidine ring. In addition, the ring structure may be a more condensed structure composed of the foregoing plurality of ring structures, or may be a derivative thereof having one or more substituent groups. Specially, as the ring structure formed by linkage in R3 to R6, a benzene ring, a naphthalene ring, a phenanthrene ring, or a derivative thereof is preferable, since thereby electron injection efficiency to the support is easily increased more than in a case that other ring structure is formed.

X1 and X2 explained in Formula (1) are voluntary as long as X1 and X2 are one of the foregoing bivalent groups. In the case where X1 and X2 are a bivalent group containing a carbon atom (—C(R7)(R8)- or —C(R10)(R11)-), R7, R8, R10, and R11 are voluntary as long as R7, R8, R10, and R11 are the foregoing monovalent group. Specific examples of R7, R8, R10, and R11 include a hydrogen atom and a group similar to an alkyl group, an alkoxy group, an aryl group, an arylalkyl group, or a derivative thereof explained in the foregoing R1 to R6 except for the group shown in the aftermentioned Formula (2). Further, in the case where X1 and X2 are a bivalent group containing a nitrogen atom (—N(R9)- or —N(R12)-), examples of R9 and R12 include a group similar to the group introduced as the foregoing R1 to R6.

Further, R7, R8, R10, and R11 in Formula (1) may be the group shown in Formula (2). The group shown in Formula (2) is voluntary as long as the group is a group having the foregoing structure. Examples of the halogen atom explained in Formula (2) include an atom similar to the halogen atom explained in Formula (1). Examples of the group shown in Formula (2) include an unsaturated chain hydrocarbon group such as a vinyl group (—CH=$CH_2$), an aryl group (—$C_{1-12}$—CH=$CH_2$), a 1-propenyl group (—CH=CH—$CH_3$), an isopropenyl group (—C($CH_3$)=$CH_2$), a 1-butenyl group (—CH=CH—$CH_2$—$CH_3$), a 2-butenyl group (—$CH_2$—CH=CH—$CH_3$), a 2-methylaryl group (—$CH_2$—C($CH_3$)=$CH_2$), a 2-pentenyl group (—$CH_2$—CH=CH—$CH_2$—$CH_3$), an ethynyl group (—C≡CH), a 2-propynyl group (—$CH_2$—C≡CH), a 1-propynyl group (—C≡C—$CH_3$), a 2-butynyl group (—$CH_2$—C≡C—$CH_3$), and a 3-butynyl group (—$CH_2$—$CH_2$—C≡CH); an acyl group such as a formyl group, an acetyl group, a propionyl group, a butyryl group, a valeryl group, an isovaleryl group, a pivaloyl group, and a hexanoyl group, or a group having the foregoing acyl group at an end of an alkyl chain with carbon atomicity from 1 to 4 both inclusive; a group having a carboxylate ester bond (—C(=O)—O—); a group having a bond; and a cyano group or a group having a cyano group at an end of an alkyl chain with carbon atomicity from 1 to 4 both inclusive. Further, as the group shown in Formula (2) in the case that R21 and R24/R22 and R23 are linked with each other to form one or more ring structures, examples thereof include a cyclohexenyl group or a phenethyl group; the benzyl group shown in Formula (2-1), the tolylmethyl group (methylbenzyl group) shown in Formula (2-2); and the groups expressed by Formula (2-3) to Formula (2-6). Part or all of hydrogen atoms included in the foregoing groups may be substituted by a halogen atom.

[Chemical formula 8]

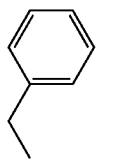  (2-1)

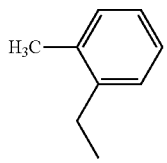  (2-2)

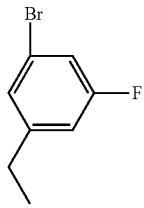  (2-3)

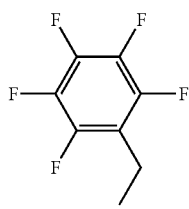  (2-4)

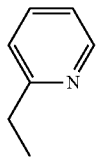  (2-5)

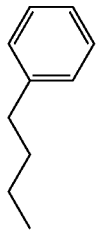  (2-6)

Specially, X1 in Formula (1) is preferably the group expressed by —C(R7)(R8)- or —N(R9)-, and is more preferably the group expressed by —C(R7)(R8)-. Further, similarly and specially, X2 in Formula (1) is preferably the group expressed by —C(R10)(R11)- or —N(R12)-, and is more preferably the group expressed by —C(R10)(R11)-, since thereby the planarity is lowered as an entire molecule, and thus formation of aggregate is inhibited, resulting in easily contributing to improvement of conversion efficiency. In these cases, it is preferable that R7 to R12 are sterically bulky group as described above so that the steric size of an entire molecule is increased, since thereby planarity is more decreased and thus higher effect is able to be obtained. In particular, X1 and X2 are respectively the group expressed by —C(R7)(R8)- and the group expressed by —C(R10)(R11)-. Thereby, R7, R8, R10, and R11 are arranged to extend in the upper face side space and the lower face side space with respect to the plane containing the methine chain skeleton and the heterocyclic skeleton. Thus, the planarity is lowered as an entire molecule, and each molecule hardly aggregates each other, resulting in further contributing to improvement of conversion efficiency. In this case, at least one of R7, R8, R10, and R11 is a sterically bulky group. Thus, specially, an alkyl group with carbon atomicity from 6 to 25 both inclusive or the group shown in Formula (2) is preferable, since thereby planarity as an entire molecule is more lowered, and high aggregate inhibition action is obtained.

In the case where two of R7, R8, R10, and R11 are sterically bulky groups, the sterically bulky groups are preferably introduced as R7 and R8, or R10 and R11 for the following reason. That is, in this case, R7 and R8, or R10 and R11 are arranged to more largely extend in the upper face side space and the lower face side space with respect to the plane containing the methine chain skeleton and the heterocyclic skeleton compared to a case that the sterically bulky groups are introduced as R7 and R10, or R8 and R11. Thus, the planarity is more lowered as an entire molecule, and a steric molecule structure is easily obtained. It is needless to say that the number of the sterically bulky groups introduced as R7, R8, R10, or R11 is preferably three than two, and more preferably four than three in order to obtain higher aggregation inhibition action.

Y1 and Y2 explained in Formula (1) are voluntary as long as Y1 and Y2 are the foregoing monovalent group. If at least one of Y1 and Y2 is an anchor group that gives a compound chemical or electrostatic affinity and binding ability in relation to a support, the dye is supported and electrons are efficiently injected into the support. Specially both Y1 and Y2 are preferably an anchor group, since thereby detachment from the support is more inhibited, and electron injection efficiency in relation to the support is more improved. Examples of the anchor group include a group expressed by Formula (6). For R30 explained in Formula (6), the structure thereof and the carbon atomicity thereof are voluntary as long as R30 is a saturated hydrocarbon group with (e+1) valency. Further, Z1 is a functional group to bond with the support or to be absorbed to the support. As long as one or more Z1 are contained in Formula (6), the number thereof (e) is voluntary. Examples of Z1 include a carboxylic acid group, a sulfonic acid group, a phosphoric group, a carboxylic acid ion group, a sulfonic acid ion group, and a phosphoric ion group. Specially, it is preferable that the carbon atomicity of R30 in Formula (6) is from 1 to 4 both inclusive and Z1 is a carboxylic acid group or a carboxylic acid ion group. In particular, a group expressed by —CH$_2$—CH$_2$—C(=O)—OH or a group expressed by —CH$_2$—CH$_2$—C(=O)—O$^-$ in which R30 is a divalent group with the carbon atomicity of 2 (ethylene group) and Z1 is the carboxylic acid group or the carboxylic acid ion group is preferable. The carboxylic acid group and the carboxylic acid ion group are a functional group that has high binding ability in relation to the support and has high electron withdrawing characteristics. Thus, by combining the carboxylic acid group or the carboxylic acid ion group with R30 with the foregoing carbon atomicity, electron injection efficiency and fixation characteristics are more improved. As long as the anchor group is introduced to at least one of Y1 and Y2 in Formula (1), other anchor group may be contained in the cyanine structure shown in Formula (1).

[Chemical formula 9]

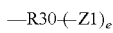
(6)

(R30 is a saturated hydrocarbon group with (e+1) valency. Z1 is an acid group or a group obtained by ionizing the acid group. e is an integer number greater than or equal to 1.)

Q explained in Formula (1) is voluntary as long as Q is a linkage group that has a methine chain (from monomethine to heptamethine) with carbon atomicity from 1 to 7 both inclusive as a skeleton. Q may further have substituent groups, or the substituent groups may be bonded with each other to form one or more ring structures. The carbon atomicity of the methine chain is from 1 to 7 both inclusive for the following reason. That is, light absorption in a wide range from ultraviolet light to visible light is thereby favorably available. One or more cyano groups are preferably introduced to a carbon atom structuring the methine chain skeleton. Thereby, fixing characteristics and electron injection efficiency to the support are improved, resulting in contribution to improvement of conversion efficiency. Examples of Q in Formula (1) include a linkage group expressed by Formula (7).

[Chemical formula 10]

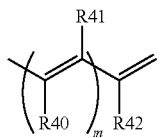
(7)

(R40 to R42 are respectively and independently a hydrogen atom or a substituent group. In the case where a plurality of R40 and a plurality of R41 are included, each R40/each R41 may be identical with each other, or may be different from each other. Adjacent ones out of R40 to R42 may be bonded with each other to form one or more ring structures. m is an integer number out of 0 to 3.)

The linkage group expressed by Formula (7) represents a group in which the carbon atomicity structuring the methine chain skeleton is an odd number out of 1 to 7. In the case where a substituent group is introduced in Q in which the carbon atomicity of the methine chain skeleton is an odd number as shown in Formula (7), the substituent group is preferably introduced to the carbon atom as a center of the methine chain skeleton. Thereby, electric charge bias balance as an entire molecule becomes favorable, and electron injection efficiency to the support is easily improved. As a substituent group in this case, a cyano group is more preferable, since thereby electric charge balance is improved, resulting in easily contributing to improvement of conversion efficiency. Specific examples of the linkage group shown in Formula (7) include the linkage groups expressed by Formula (7-1) to Formula (7-10). The linkage groups shown in Formula (7-1) to Formula (7-4) are specific examples of linkage group not having a ring structure. The linkage groups shown in Formula (7-5) to Formula (7-10) are specific examples of linkage group having a ring structure. Further, examples of a linkage group in which a substituent group is introduced to the carbon atom as a center of the methine chain skeleton in this case include a linkage group in which a substituent group is introduced as R43 in Formula (7-1) to Formula (7-10).

[Chemical formula 11]

(7-1)

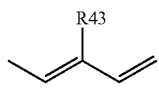
(7-2)

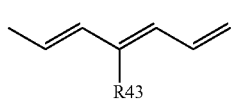
(7-3)

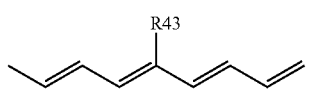
(7-4)

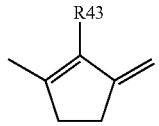
(7-5)

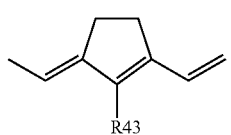
(7-6)

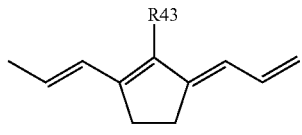
(7-7)

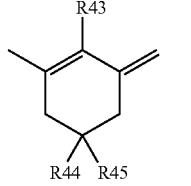
(7-8)

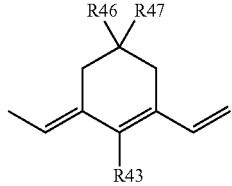
(7-9)

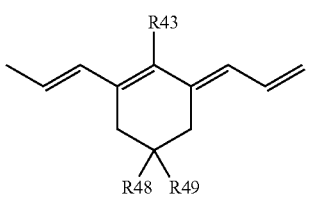

(7-10)

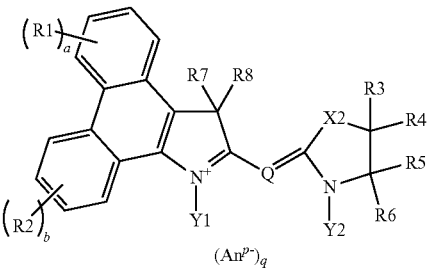

(3)

(R43 to R49 are respectively and independently a hydrogen atom, a hydroxyl group, a halogen atom, a cyano group, an aryl group with carbon atomicity from 6 to 30 both inclusive, a diphenyl amino group, an alkyl group with carbon atomicity from 1 to 8 both inclusive, or an alkoxyl group with carbon atomicity from 1 to 8 both inclusive.)

$An^{p-}$ explained in Formula (1) is voluntary as long as $An^{p-}$ is a counter anion to maintain neutral electric charge of the entire cyanine compound shown in Formula (1) and $An^{p-}$ is a monovalent or bivalent anion. In the case where p is 1, examples of anion (monovalent anion: $An^-$) include a halide ion such as a fluoride ion ($F^-$), a chloride ion ($Cl^-$), a bromide ion ($Br^-$), and an iodide ion ($I^-$); an inorganic anion such as a hexafluorophosphate ion ($PF_6^-$), a hexafluoroantimonate ion ($SbF_6^-$), a perchlorate ion ($ClO_4^-$), a tetrafluoroborate ion ($BF_4^-$), a chlorate ion, and a thiocyanate ion; an organic sulfonate anion such as a benzene sulfonate ion, a toluene sulfonate ion, a trifluoromethene sulfonate ion, a diphenylamine-4-sulfonate ion, a 2-amino-4-methyl-5-chlorobenzene sulfonate ion, a 2-amino-5-nitrobenzene sulfonate ion, an N-alkyldiphenylamine-4-sulfonate ion, and an N-aryldiphenylamine-4-sulfonate ion; an organic phosphate anion such as an octyl phosphate ion, a dodecyl phosphate ion, an octadecyl phosphate ion, a phenylphosphate ion, a nonylphenyl phosphate ion, and a 2,2'-methylene bis (4,6-di-t-buthylphenyl) phosphonate ion; a bistrifluoromethylsulfonylimide ion; a bisperfluorobutanesulfonylimide ion; a perfluoro-4-ethylcyclohexane sulfonate ion; a tetrakis(pentafluorophenyl) borate ion; and a tris(fluoroalkylsulfonyl)carbo anion. In the case where p is 2, examples of anion (bivalent anion: $An^{2-}$) include a sulfate ion ($SO_4^{2-}$), a benzenedisulfonate ion, and a naphthalene disulfonate ion. Further, q explained in Formula (1) is a coefficient to maintain neutral electric charge as the entire cyanine compound shown in Formula (1), and may be 0. In the case where q is 0, for example, one of Y1 and Y2 in Formula (1) has a monovalent ion group, a salt is formed in a molecule which is to be so-called inner salt. Further, in the case where q is 1, $An^{p-}$ becomes $An^-$ as a monovalent anion, and salt is formed to maintain neutral electric charge as the entire compound. Further, in the case where $An^{p-}$ is $An^{2-}$ as a bivalent anion, q is ½. That is, q is 0 or 1p.

The cyanine compound shown in Formula (1) is preferably a compound having the structure shown in Formula (3) in which X1 is a divalent group expressed by —C(R7)(R8)- (hereinafter referred to as the compound shown in Formula (3)), since thereby as described above, formation of the aggregate is inhibited, resulting in contribution to improvement of conversion efficiency. R1 to R8, X2, R10 to R12, Y1, Y2, and $(An^{p-})_q$ explained in Formula (1) are similarly applied for R1 to R8, X2, R10 to R12, Y1, Y2, and $(An^{p-})_q$ explained in Formula (3).

[Chemical formula 12]

(R1 and R2 are respectively and independently a hydroxyl group, a nitro group, a cyano group, or a halogen atom; or an alkyl group, an alkoxy group, an aryl group, an arylalkyl group, or a derivative thereof. a and b are respectively and independently an integer number out of 0 to 4. R3 to R6 are respectively and independently a hydrogen atom, a hydroxyl group, a nitro group, a cyano group, or a halogen atom; or an alkyl group, an alkoxy group, an aryl group, an arylalkyl group, or a derivative thereof. At least one of R3 and R4 and at least one of R5 and R6 may be respectively detached to form double bond, or may be respectively linked with each other to form one or more ring structures. X2 is a group expressed by —C(R10)(R11)-, a group expressed by —N(R12)-, a sulfur atom, an oxygen atom, a selenium atom, or a tellurium atom. R7, R8, R10, and R11 are respectively and independently a hydrogen atom or the group shown in the foregoing Formula (2); or an alkyl group, an alkoxy group, an aryl group, an arylalkyl group, or a derivative thereof except for a group corresponding to the group shown in Formula (2). R12 are respectively and independently a hydrogen atom, a hydroxyl group, a nitro group, a cyano group, or a halogen atom; or an alkyl group, an alkoxy group, an aryl group, an arylalkyl group, or a derivative thereof. Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

In the compound shown in Formula (3), at least one of R7, R8, R10, and R11 is preferably a sterically bulky group, and is preferably the group expressed by Formula (2) for a reason similar to the foregoing reason. Further, X2 is preferably the group expressed by —C(R10)(R11)- for a reason similar to the foregoing reason. Further, in the compound shown in Formula (3), it is preferable that at least one of R3 and R4 and at least one of R5 and R6 is detached to form double bond, and the other non-detached one out of R3 and R4 is linked with the other non-detached one out of R5 and R6 to form one or more ring structures, since thereby electron injection efficiency to the support becomes preferable, and thus higher effect is obtained. For a reason similar to the foregoing reason, both Y1 and Y2 are preferably an anchor group, and the anchor group is preferably the group expressed by —$CH^2$—$CH_2$— C(=O)—OH or the group expressed by —$CH_2$—$CH_2$—C (=O)—$O^-$. Further, for a reason similar to the foregoing reason, Q is preferably a linkage group in which one or more cyano groups is introduced to a methine chain skeleton.

The compound shown in Formula (3) is preferably a compound in which X2 is a group expressed by —C(R10)(R11)-, and which has the structure expressed by Formula (4) in which one or more ring structures is formed by detachment and linkage of R3 to R6 (hereinafter referred to as the compound shown in Formula (4)). In this case, since X2 is a group expressed by —C(R10)(R11)-, aggregate inhibition action is improved. In addition, since the ring structure is formed by detachment and linkage of R3 to R6, electron injection efficiency to the support is improved. R1, R2, R7, R8, R10, R11, Y1, Y2, and $(An^{p-})_q$ in Formula (3) are similarly applied to R1, R2, R7, R8, R10, R11, Y1, Y2, and $(An^{p-})_q$ explained in Formula (4).

[Chemical formula 13]

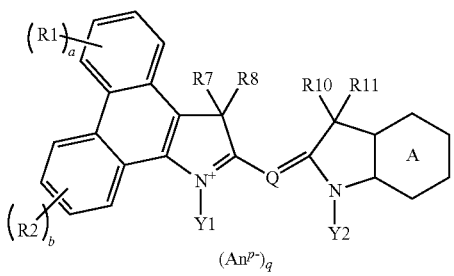

(4)

(R1 and R2 are respectively and independently a hydroxyl group, a nitro group, a cyano group, or a halogen atom; or an alkyl group, an alkoxy group, an aryl group, an arylalkyl group, or a derivative thereof. a and b are respectively and independently an integer number out of 0 to 4. R7, R8 R10, and R11 are respectively and independently a hydrogen atom or the group shown in Formula (2); or an alkyl group, an alkoxy group, an aryl group, an arylalkyl group, or a derivative thereof except for a group corresponding to the group shown in Formula (2). Ring A is a benzene ring, a naphthalene ring, a phenanthrene ring, or a derivative thereof. Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

The ring A explained in Formula (4) is voluntary as long as a benzene ring skeleton, a naphthalene ring skeleton, or a phenanthrene ring skeleton is included. The ring A may have one or more substituent groups. In the case where the ring A is a naphthalene ring or a phenanthrene ring, position where the ring is condensed with a five-membered heterocyclic ring is voluntary. The substituent group introduced to the ring A is voluntary. Examples of the substituent group include an alkyl group such as a methyl group, an ethyl group, and a butyl group; an alkoxy group such as a methoxy group and an ethoxy group; an aryl group such as a phenyl group; a phenylalkyl group such as a benzyl group; and a derivative thereof.

In the compound shown in Formula (4), at least one of R7, R8, R10, and R11 is preferably a sterically bulky group for the same reason as the foregoing reason, and specifically is preferably the group expressed by Formula (2). Further, for the same reason as the foregoing reason, both Y1 and Y2 are preferably an anchor group, and the anchor group is preferably a group expressed by —CH$_2$—CH$_2$—C(=O)—OH or a group expressed by —CH$_2$—CH$_2$—C(=O)—O$^-$. Further, Q is preferably a linkage group in which one or more cyano groups is introduced to a methine chain skeleton for the same reason as the foregoing reason.

The compound shown in Formula (4) is preferably a compound having the structure shown in Formula (5) in which the ring A is a phenanthrene ring or a derivative thereof (hereinafter referred to as the compound shown in Formula (5)). In this case, since both heterocyclic skeletons bonded with both ends of the methine chain (Q) contain the phenanthrene skeleton, wider wavelength region light is easily absorbed. R1, R2, R7, R8, R10, R11, Y1, Y2, and $(An^{p-})_q$ in Formula (4) are similarly applied to R1, R2, R7, R8, R10, R11, Y1, Y2, and $(An^{p-})_q$ explained in Formula (5). Further, examples of R13 and R14 explained in Formula (5) include those similar to R1 and R2.

[Chemical formula 14]

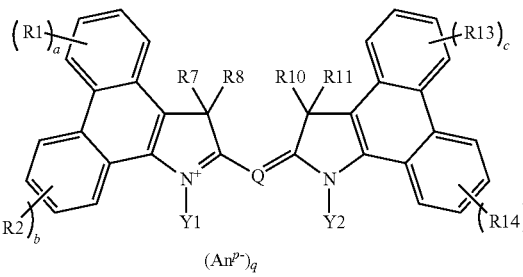

(5)

(R1, R2, R13, and R14 are respectively and independently a hydroxyl group, a nitro group, a cyano group, or a halogen atom; or an alkyl group, an alkoxy group, an aryl group, an arylalkyl group, or a derivative thereof. a to d are respectively and independently an integer number out of 0 to 4. R7, R8, R10, and R11 are respectively and independently a hydrogen atom or the group shown in the foregoing Formula (2); or an alkyl group, an alkoxy group, an aryl group, an arylalkyl group, or a derivative thereof except for a group corresponding to the group shown in Formula (2). Y1 and Y2 are respectively and independently an anchor group; or an alkyl group, an alkoxy group, an aryl group, an arylalkyl group, or a derivative thereof. At least one of Y1 and Y2 is an anchor group. Q is a linkage group that has a methine chain with carbon atomicity from 1 to 7 both inclusive as a skeleton. $An^{p-}$ is an anion with p valency. p is 1 or 2, and q is a coefficient to maintain neutral electric charge.)

In the compound shown in Formula (5), at least one of R7, R8, R10, and R11 is preferably a sterically bulky group for a reason similar to the foregoing reason, and is preferably the group expressed by Formula (2). Further, for a reason similar to the foregoing reason, both Y1 and Y2 are preferably an anchor group, and the anchor group is preferably a group expressed by —CH$_2$—CH$_2$—C(=O)—OH or a group expressed by —CH$_2$—CH$_2$—C(=O)—O$^-$. Further, Q is preferably a linkage group in which one or more cyano groups is introduced to a methine chain skeleton for a reason similar to the foregoing reason.

Examples of the cyanine compound shown in Formula (1) containing the compound shown in the foregoing Formula (3)

to Formula (5) include compounds having a structure section expressed by Formula (8) to Formula (283). The structure sections shown in Formula (8) to Formula (283) represent a section not containing $An^{p-}$ in Formula (1) (cation section). In these structures, for example, the foregoing monovalent or bivalent anions are able to be voluntarily mixed, and the same is applied to other anions. In these structure sections, for example, it is possible that an acid group is ionized to form an inner salt.

[Chemical formula 15]

(8)

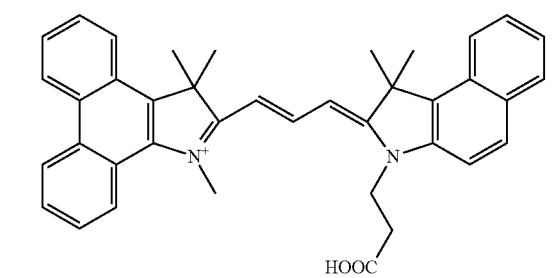

(9)

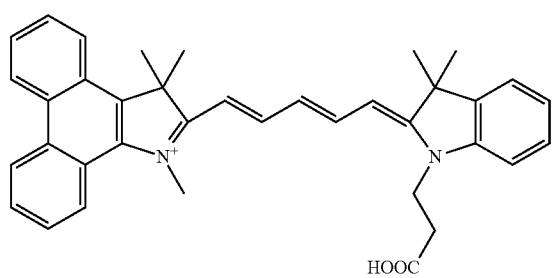

(10)

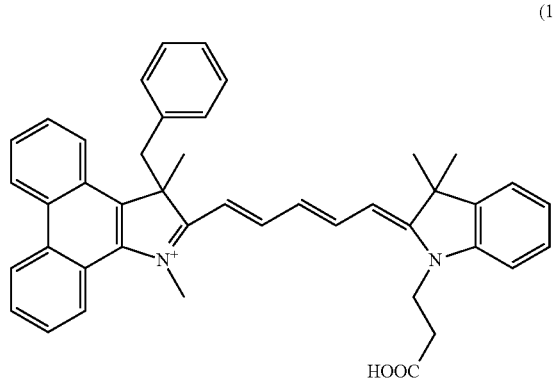

(11)

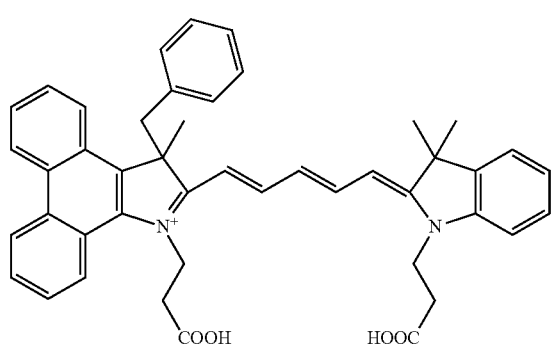

(12)

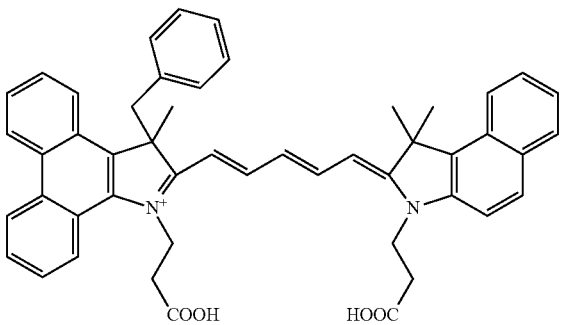

(13)

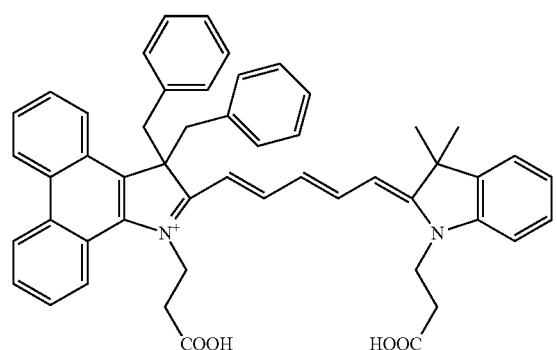

(14)

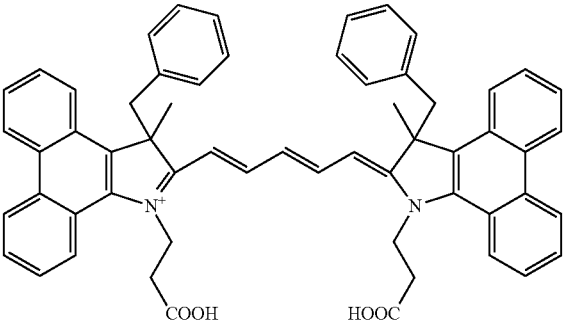

(15)

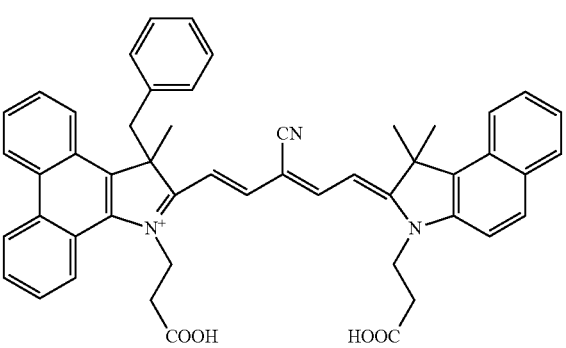

[Chemical formula 16]
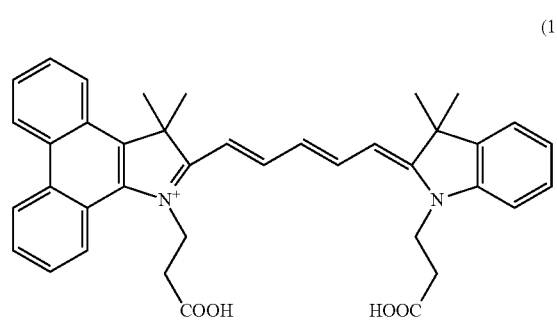
(16)
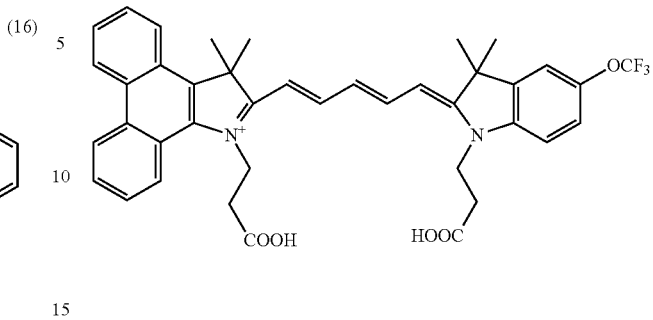
(21)
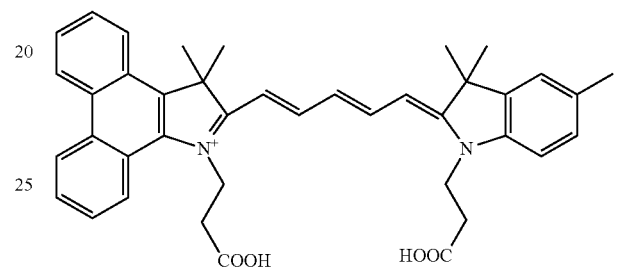
(17)
(22)
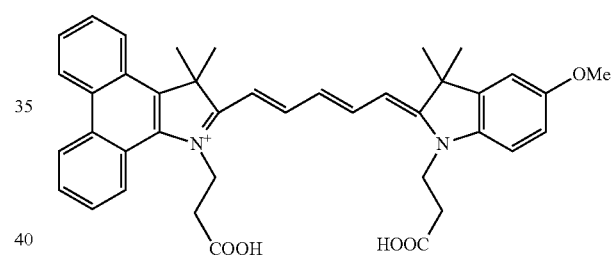
(18)
(23)
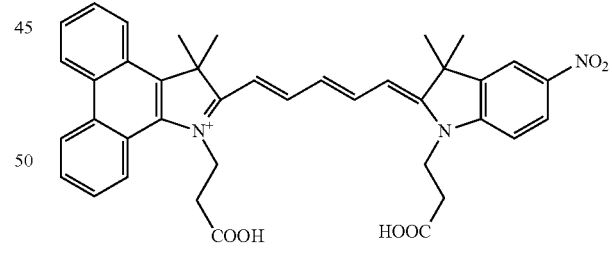
(19)
(24)
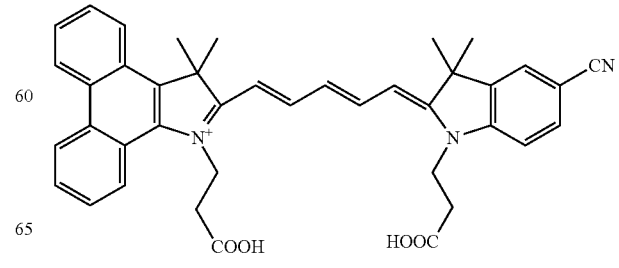
(20)
(25)

(26)
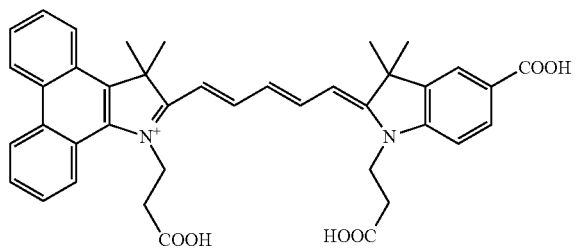
(27)
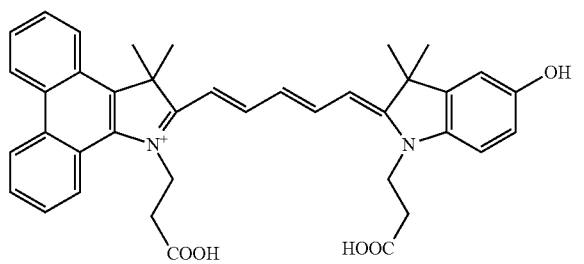
(28)
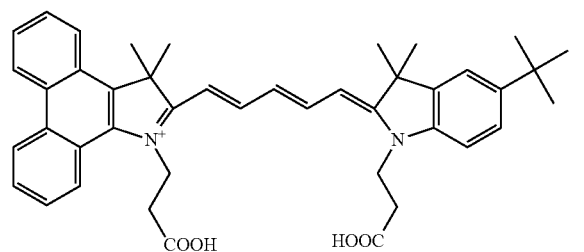
(29)
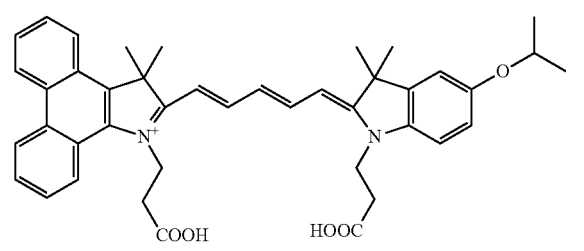
(30)
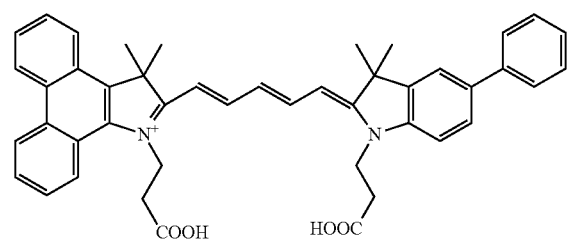
(31)
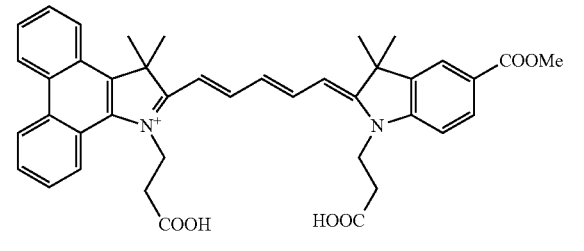
(32)
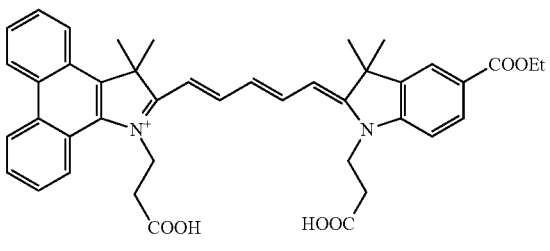
(33)
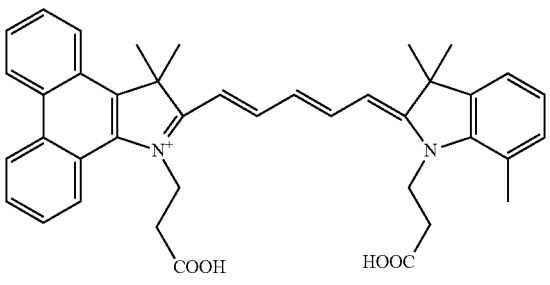
(34)
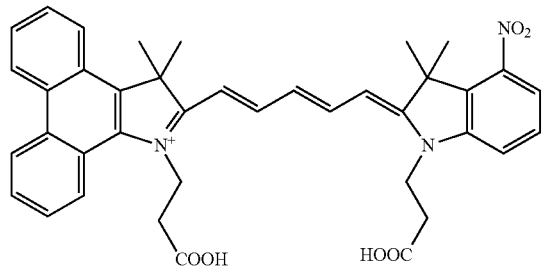
(35)
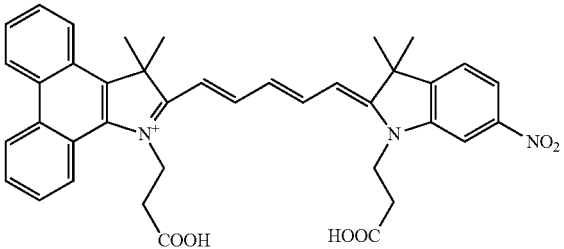
(36)
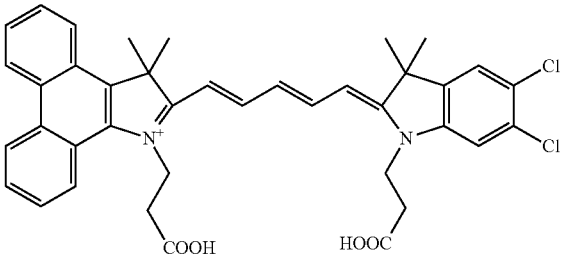

(37)
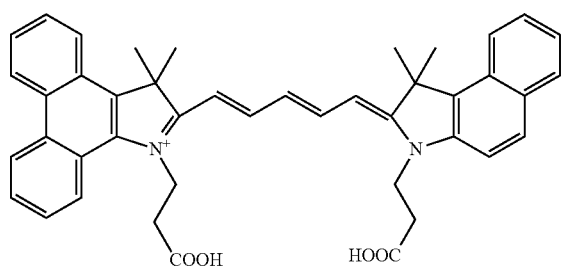
(42)
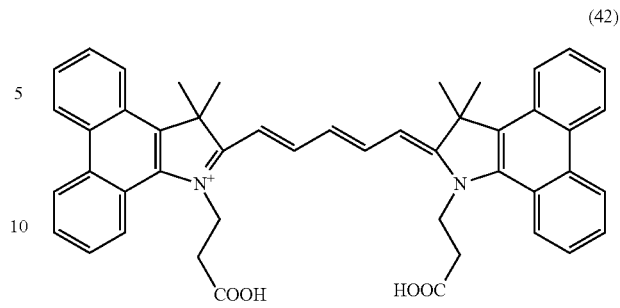
(38)
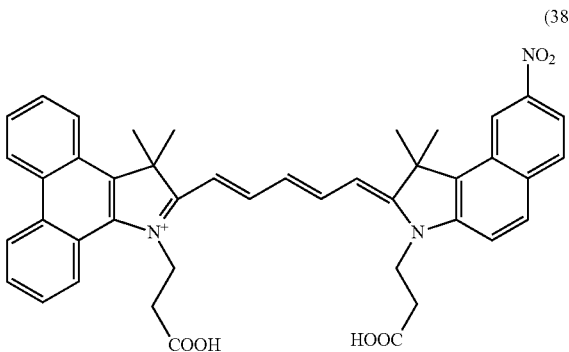
(43)
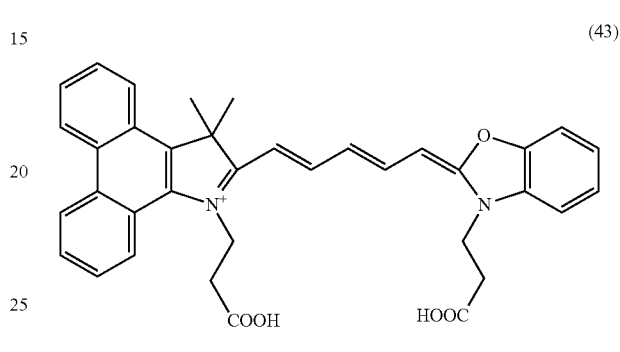
(39)
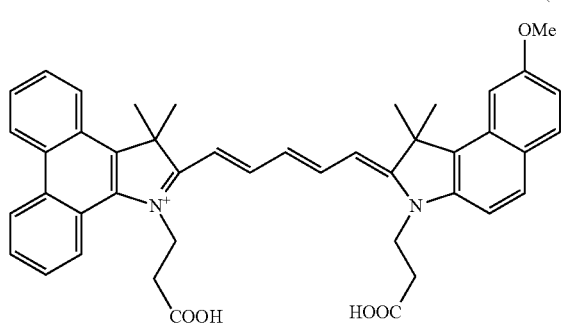
[Chemical formula 17]
(44)
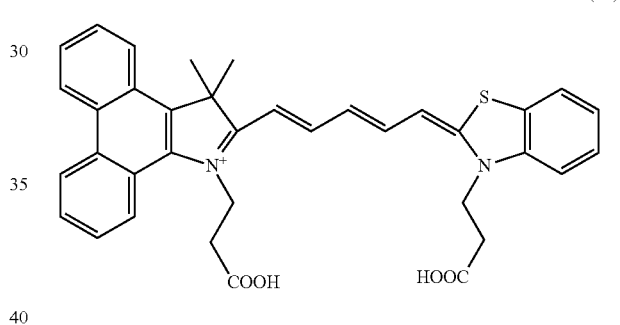
(40)
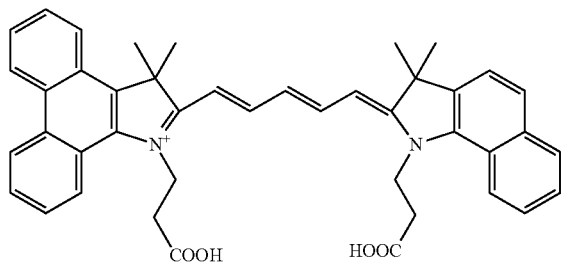
(45)
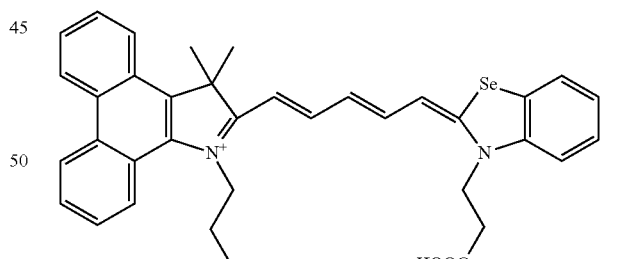
(41)
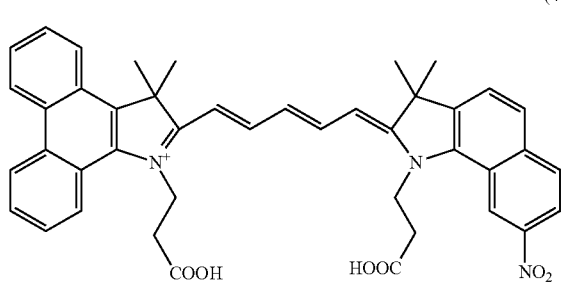
(46)
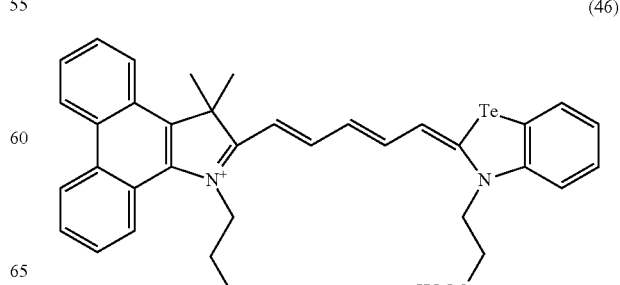

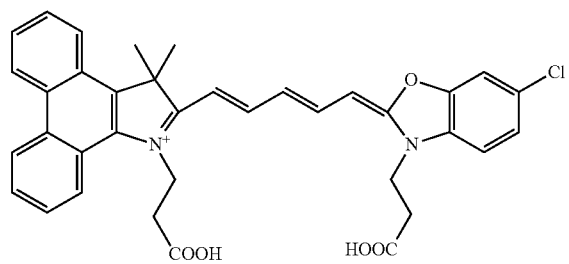
(47)
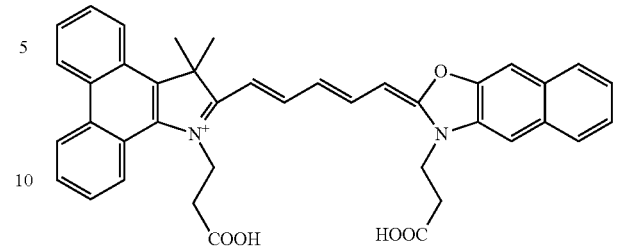
(52)
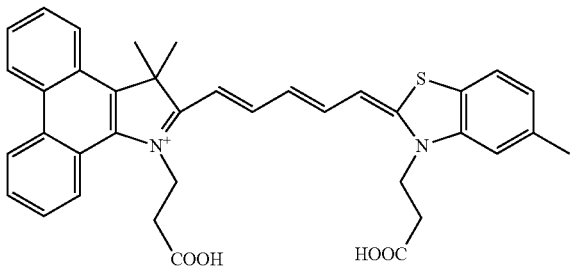
(48)
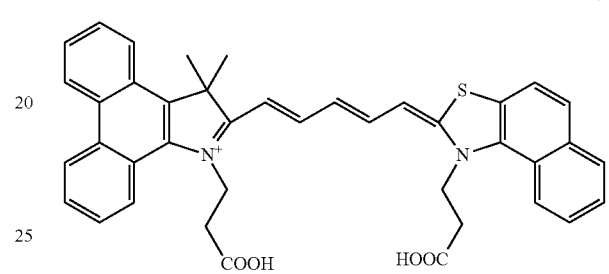
(53)
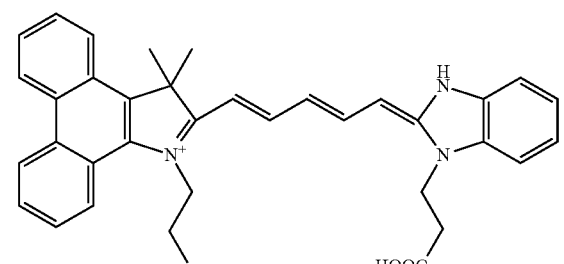
(49)
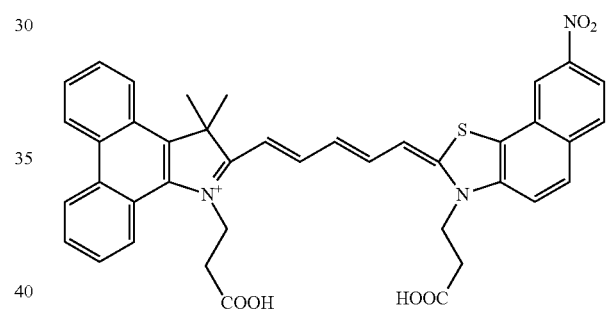
(54)
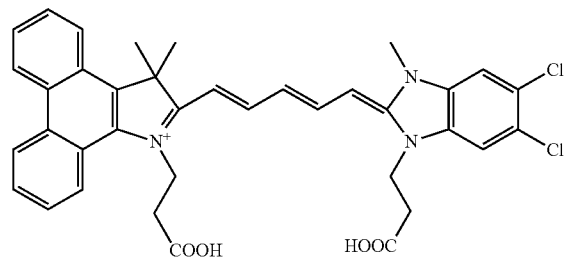
(50)
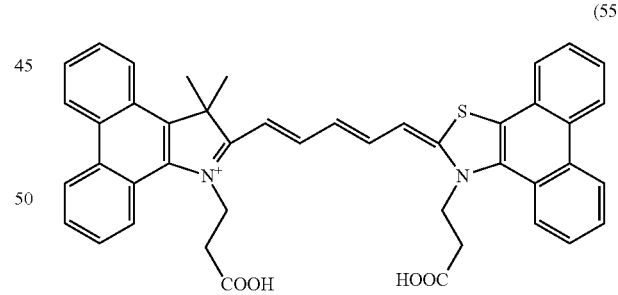
(55)
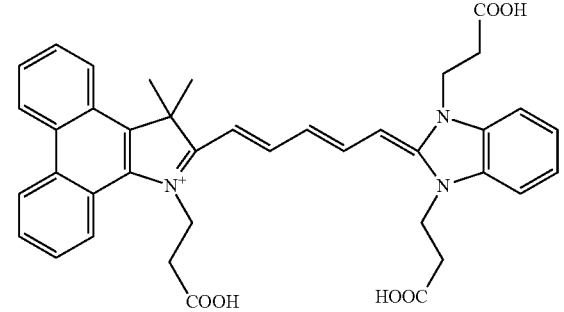
(51)
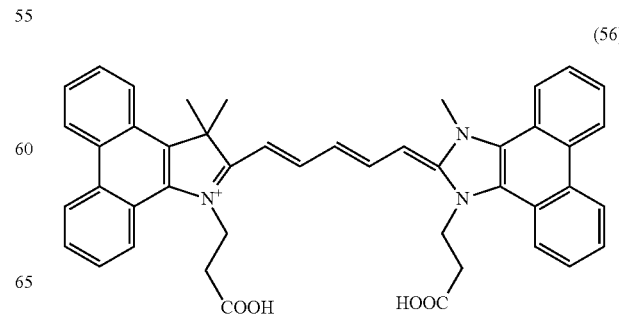
(56)

(57)
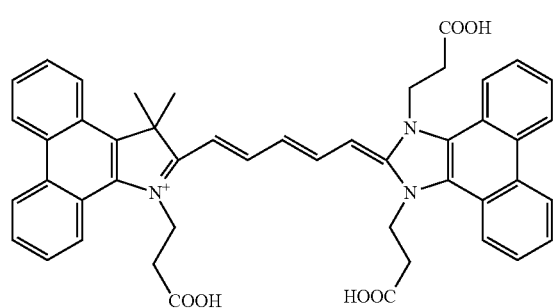
(58)
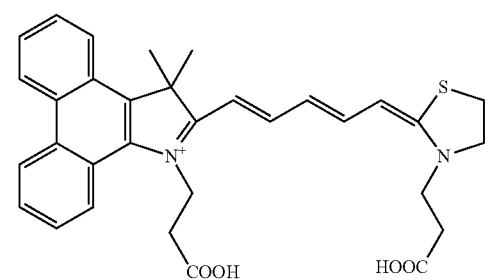
(59)
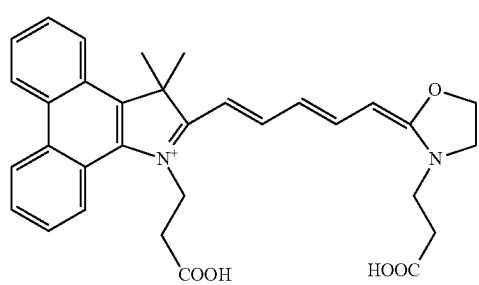
(60)
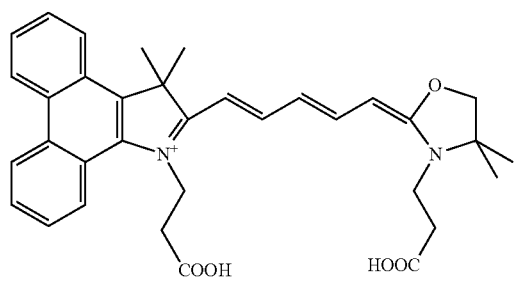
(61)
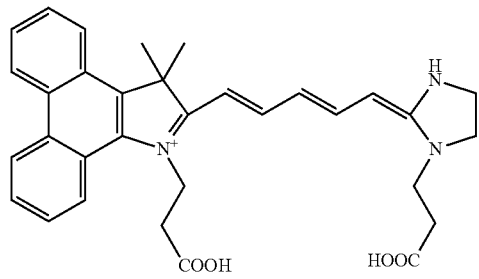
(62)
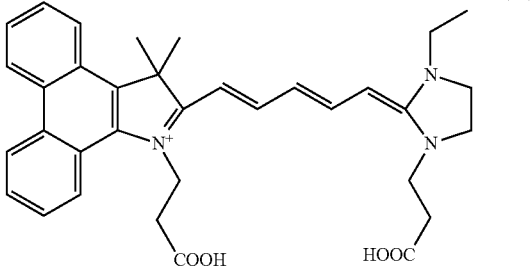
(63)
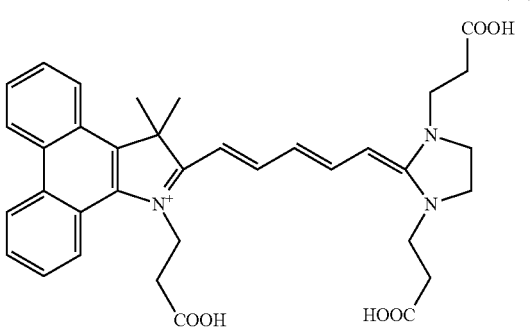
[Chemical formula 18]
(64)
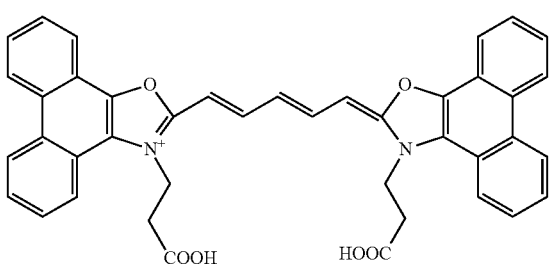
(65)
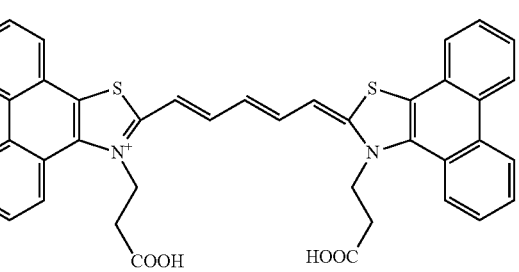
(66)
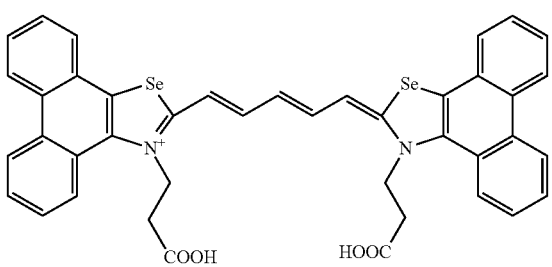

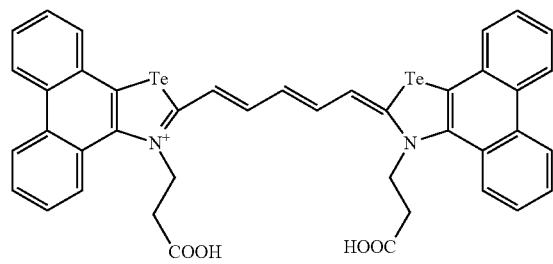
(67)
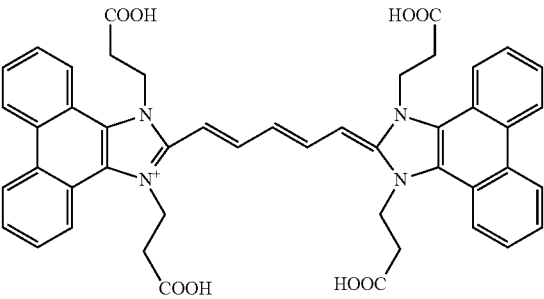
(72)
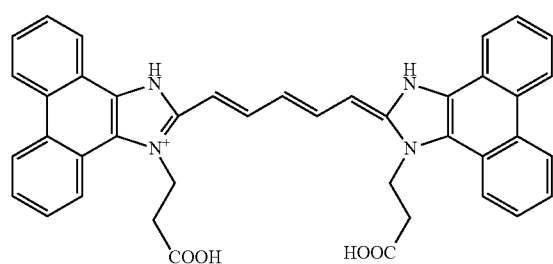
(68)
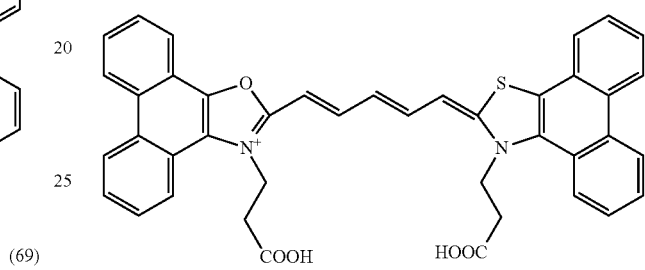
(73)
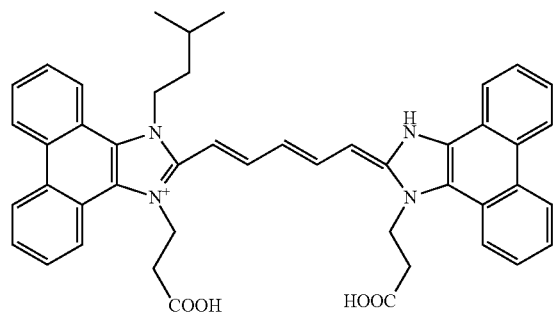
(69)
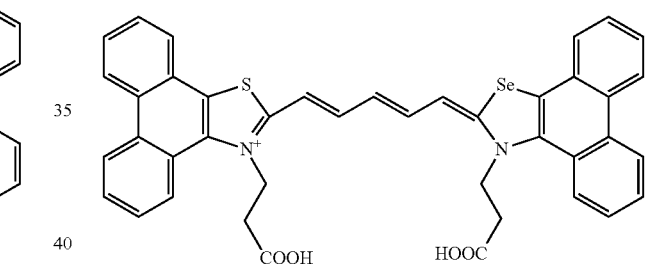
(74)
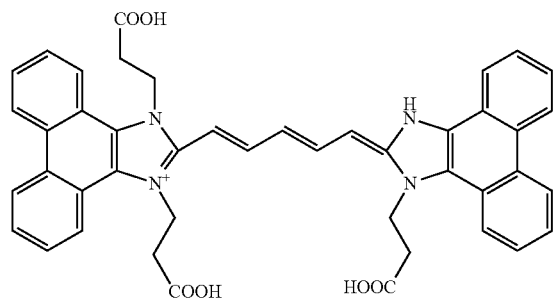
(70)
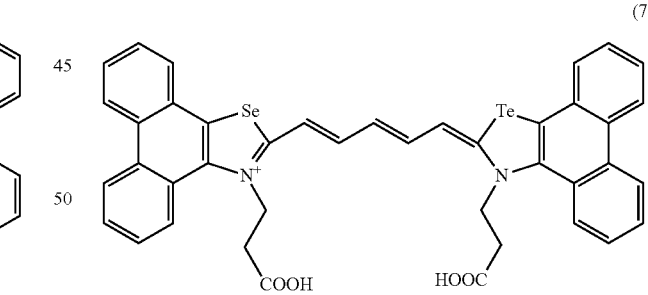
(75)
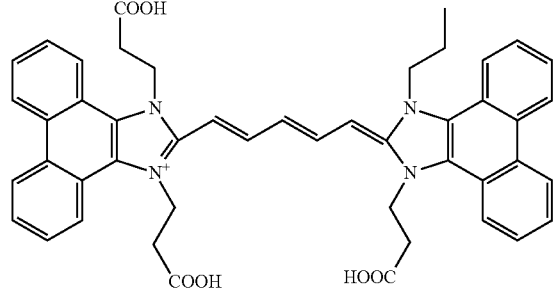
(71)
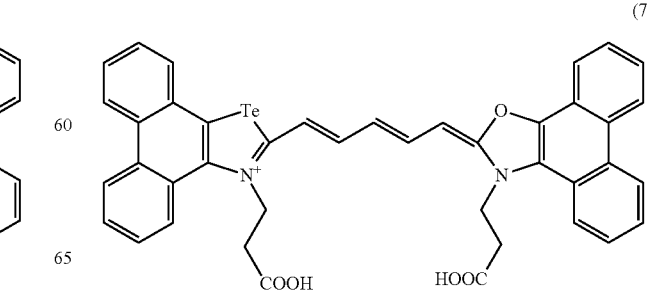
(76)

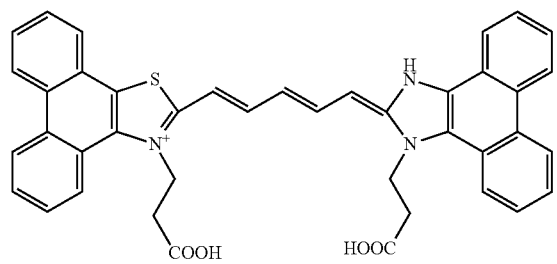
(77)
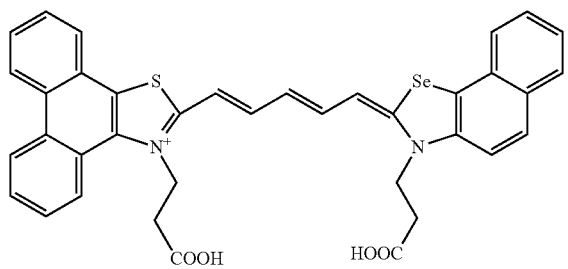
(82)
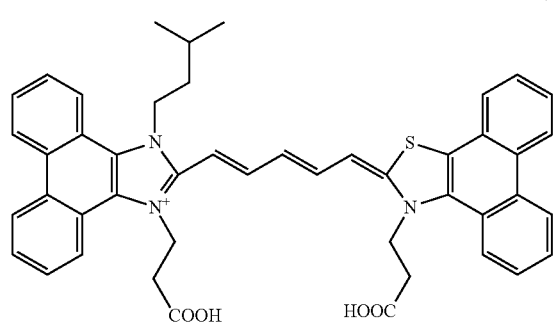
(78)
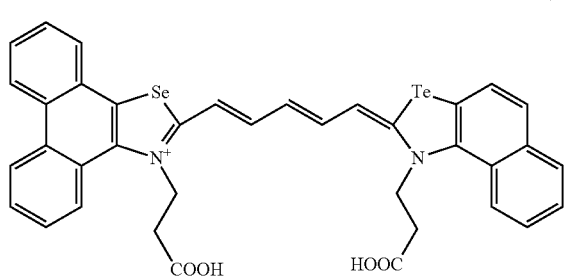
(83)
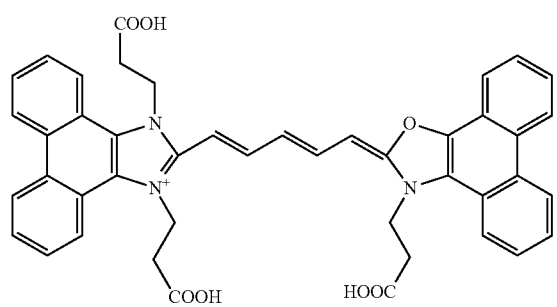
(79)
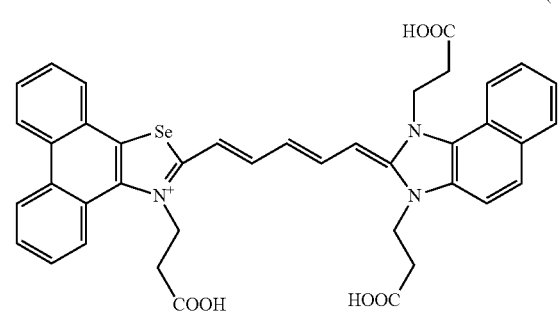
(84)
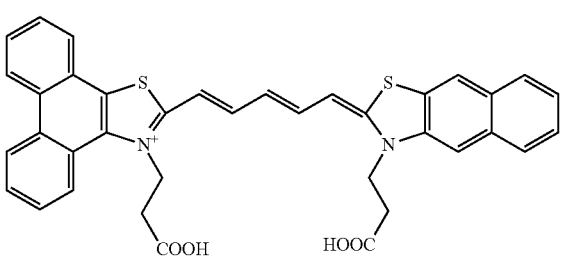
(80)
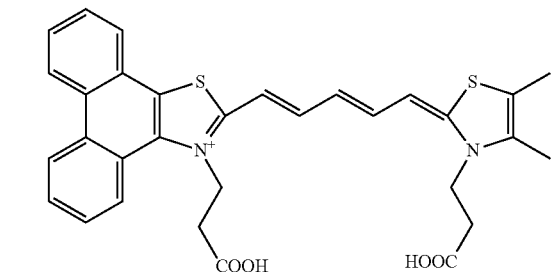
(85)
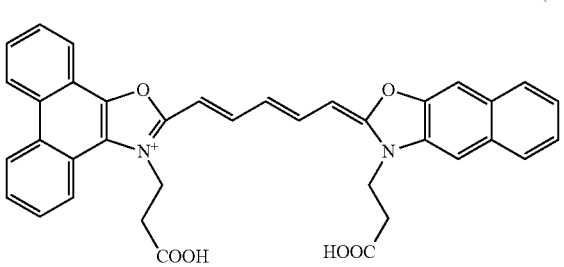
(81)
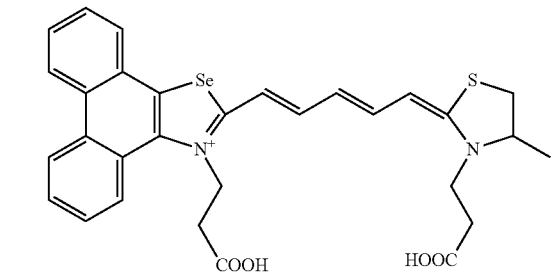
(86)

(87)
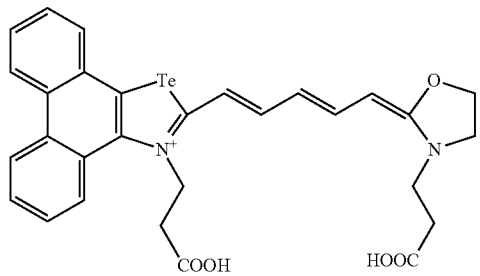
[Chemical formula 19]
(88)
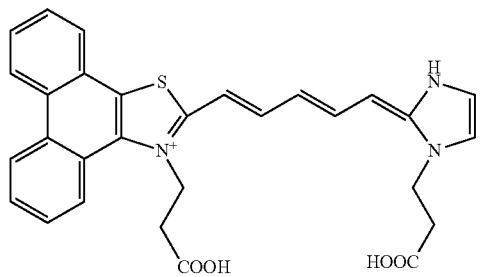
(89)
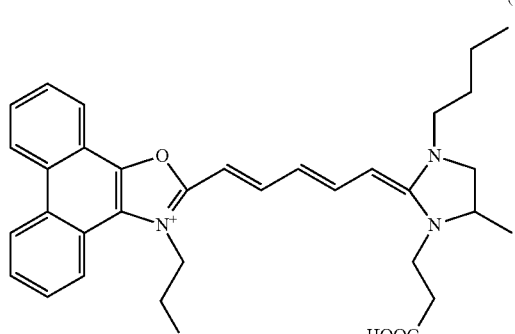
(90)
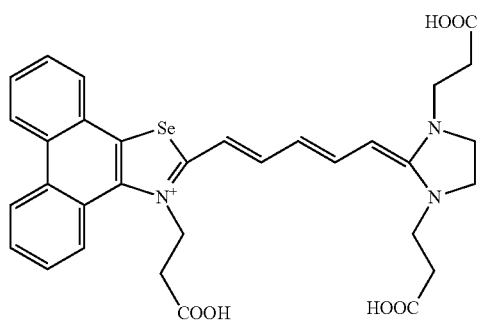
(91)
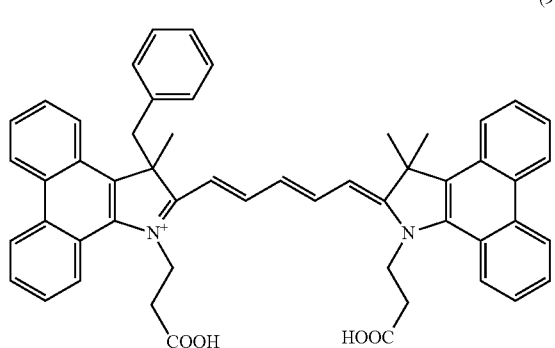
(92)
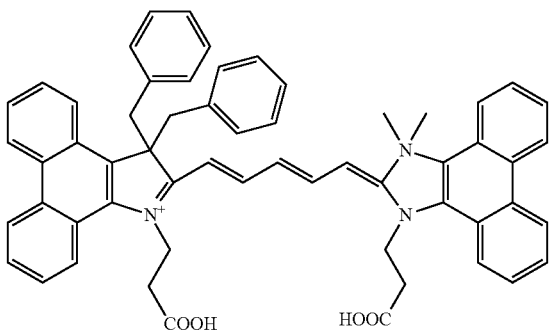
(93)
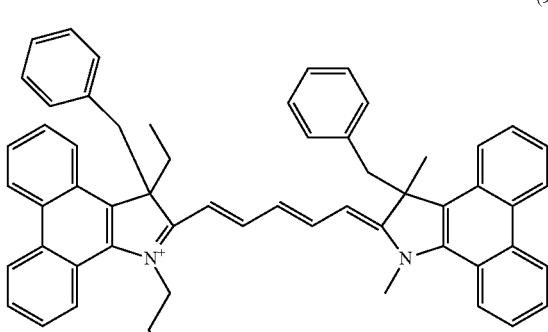
(94)
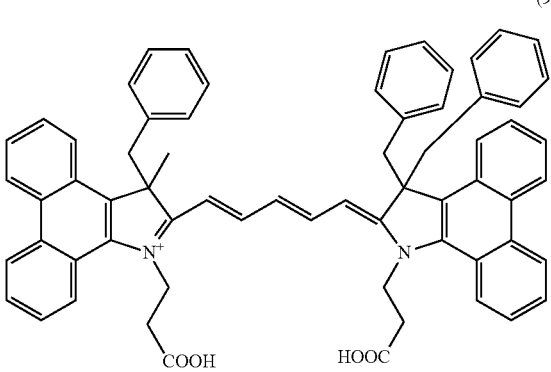
(95)
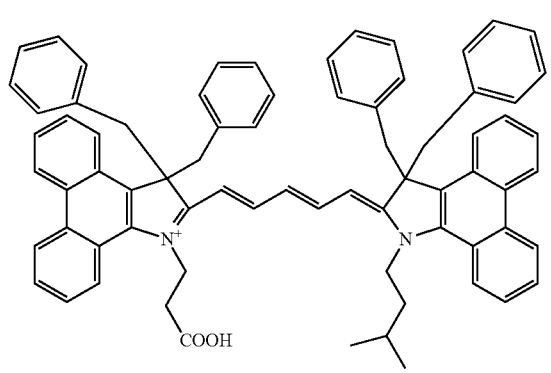

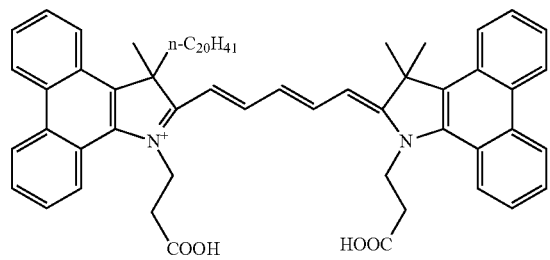
(96)
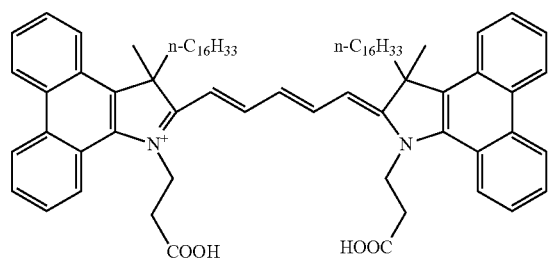
(97)
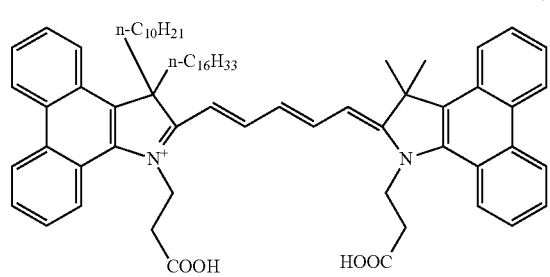
(98)
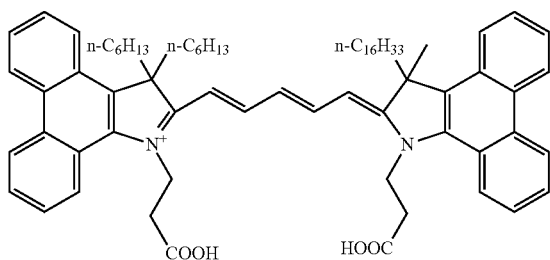
(99)
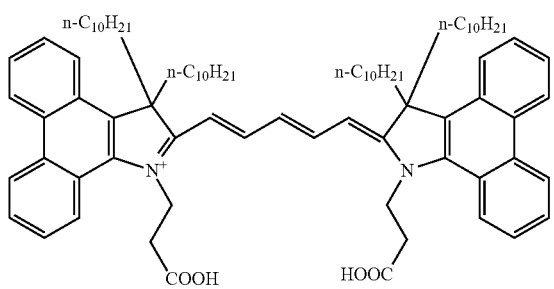
(100)
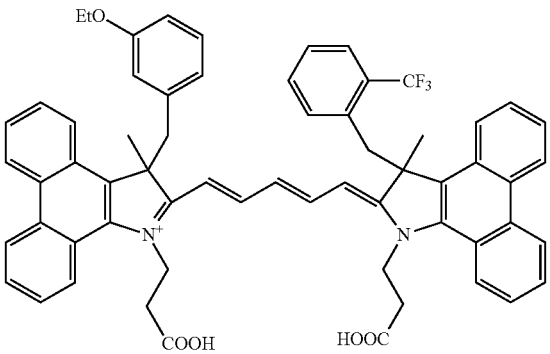
(101)
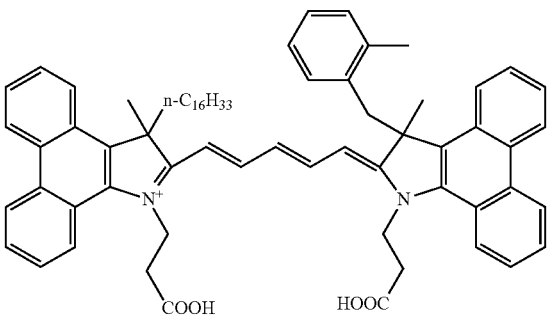
(102)
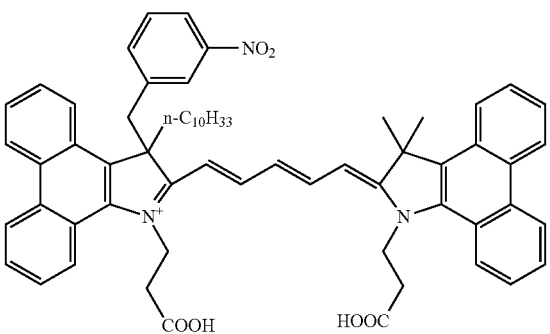
(103)
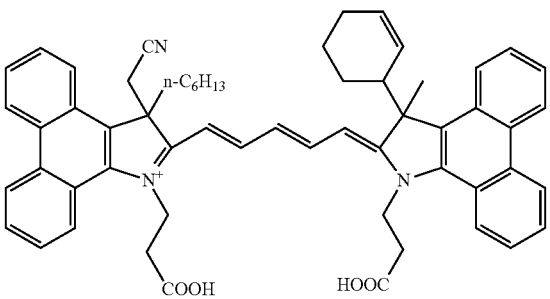
(104)

(105)
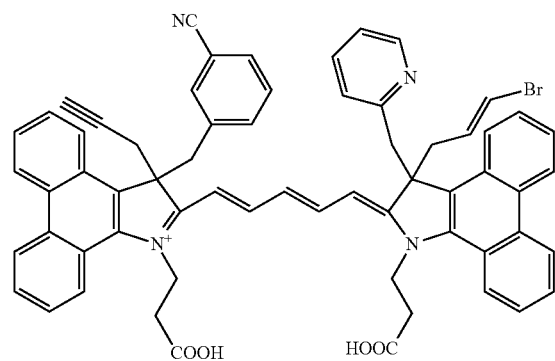
(109)
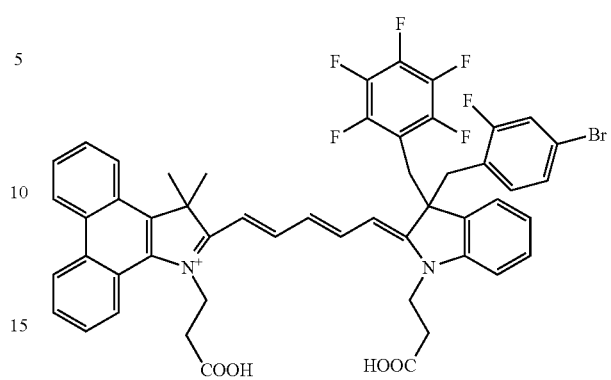
(106)
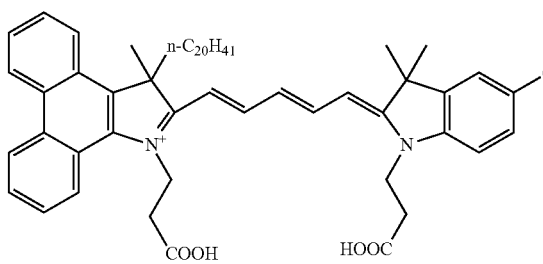
(110)
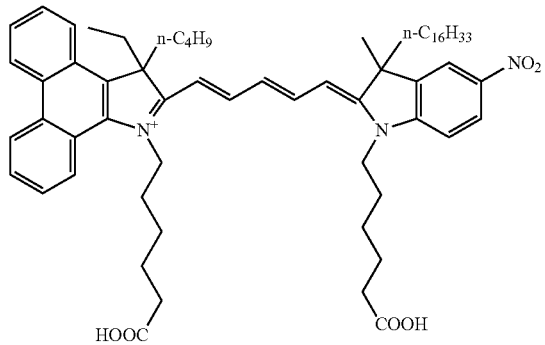
(107)
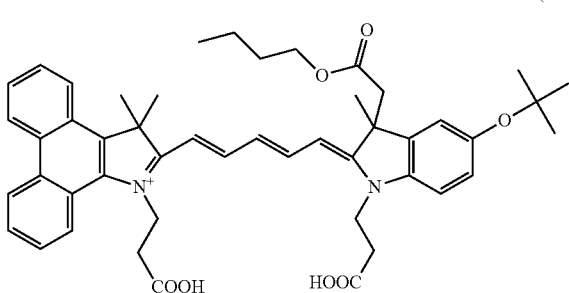
(111)
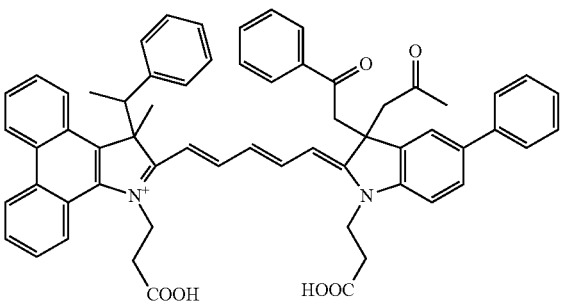
[Chemical formula 20]
(108)
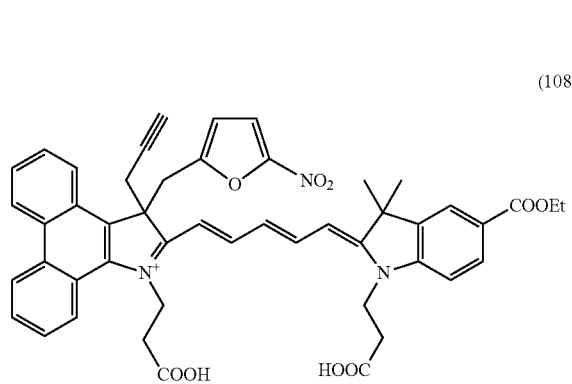
(112)
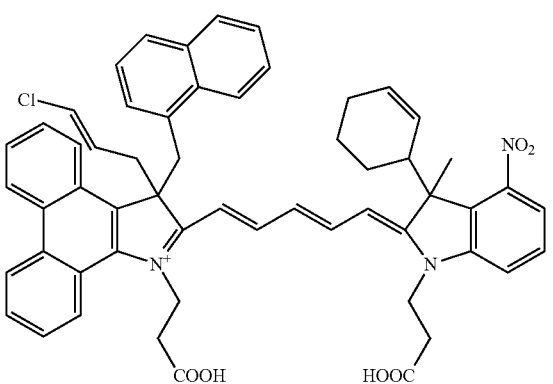

(113)
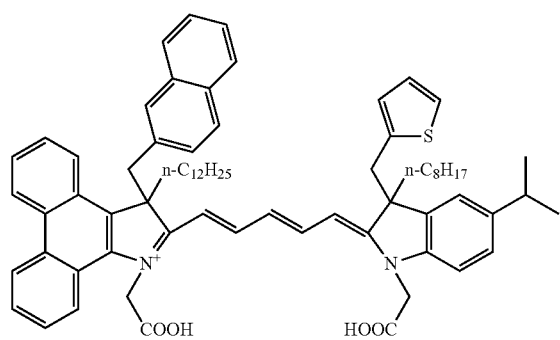
(114)
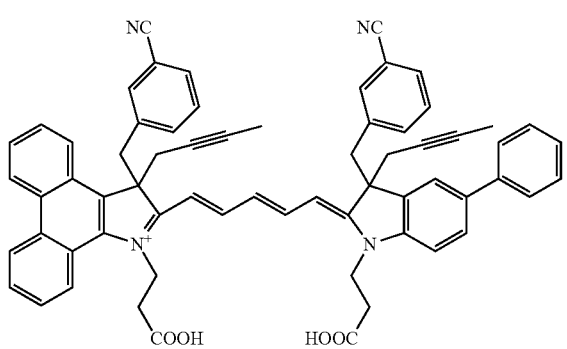
(115)
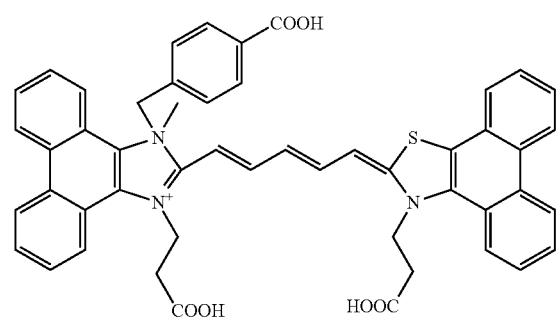
(116)
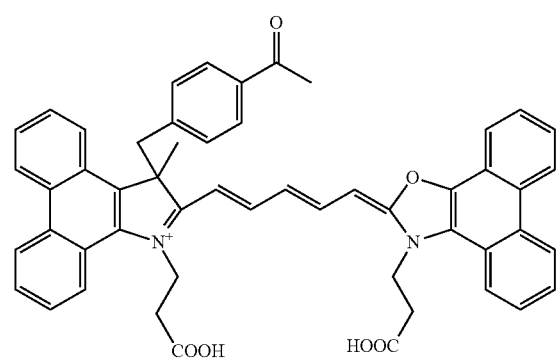
(117)
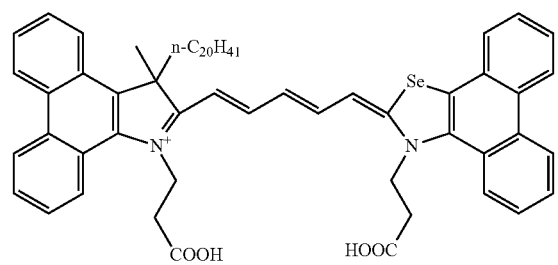
(118)
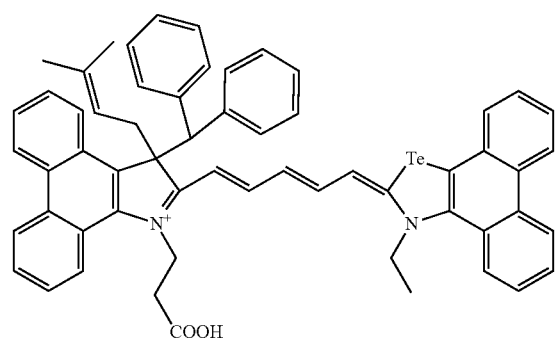
(119)
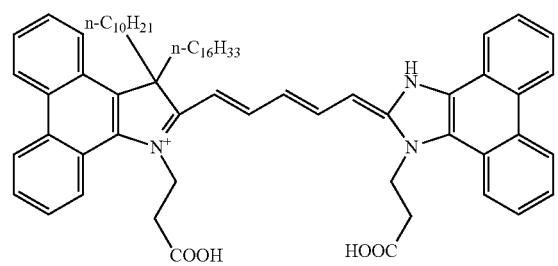
(120)
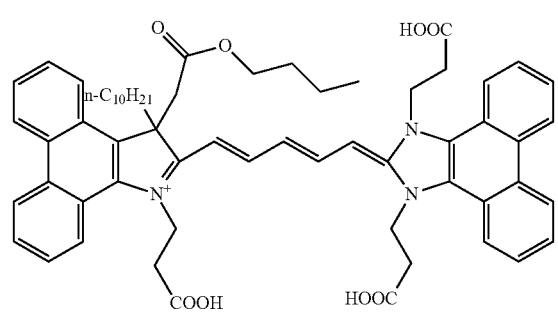
(121)
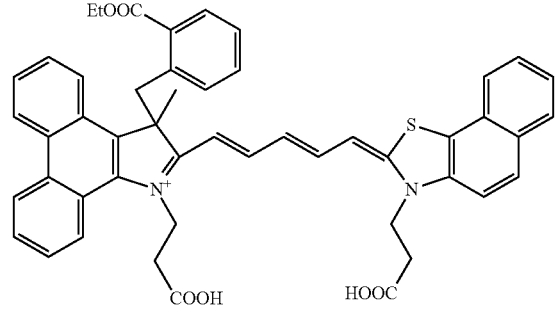

(122)
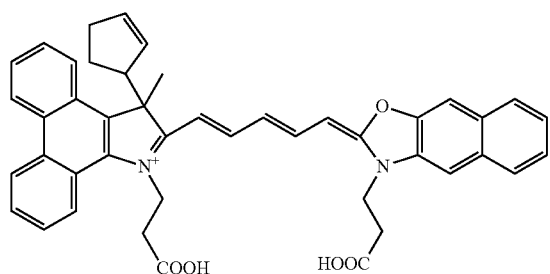
(123)
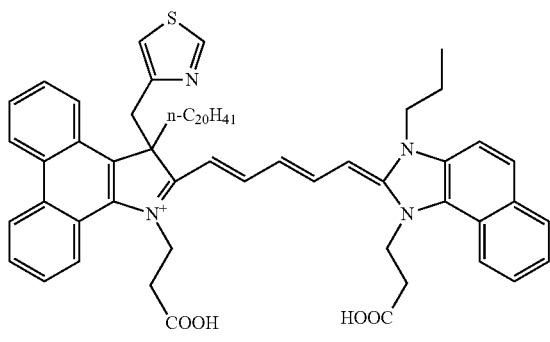
(124)
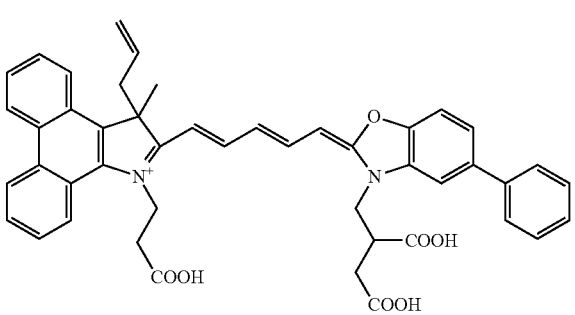
(125)
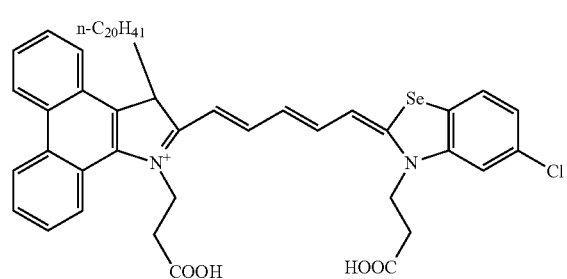
(126)
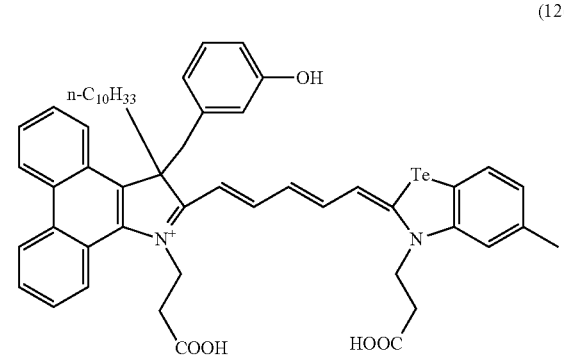
(127)
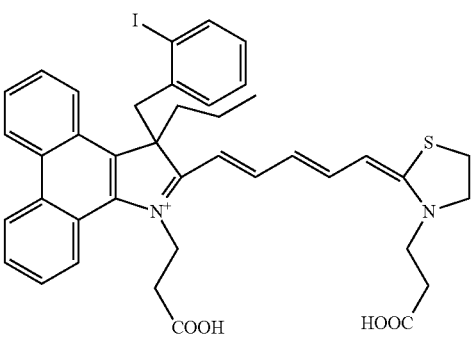
(128)
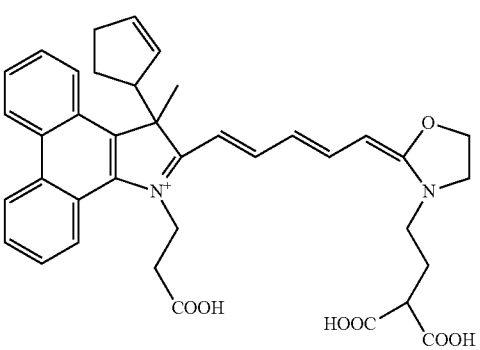
(129)
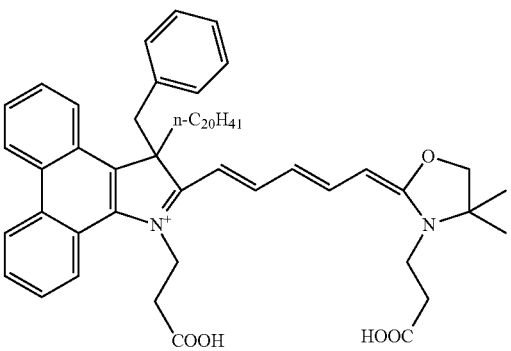
(130)
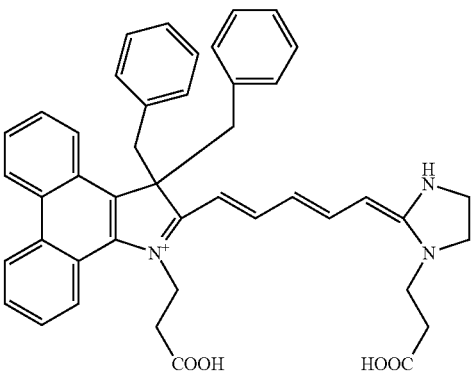

(131)
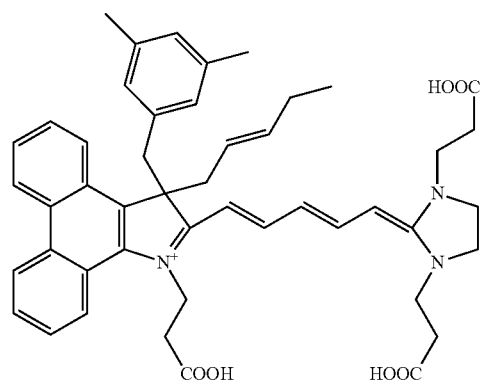
[Chemical formula 21]
(132)
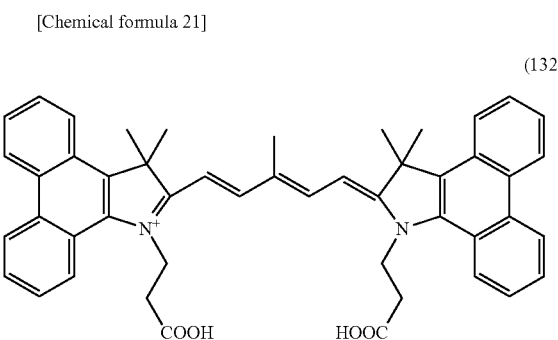
(133)
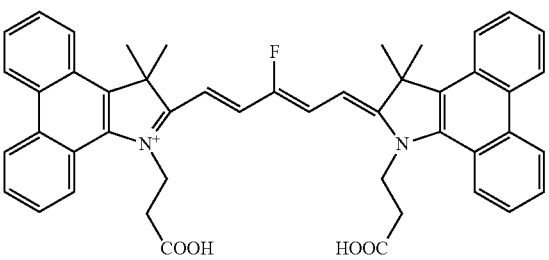
(134)
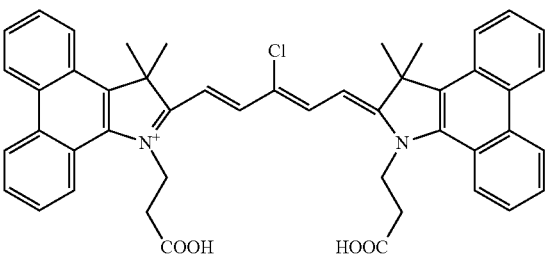
(135)
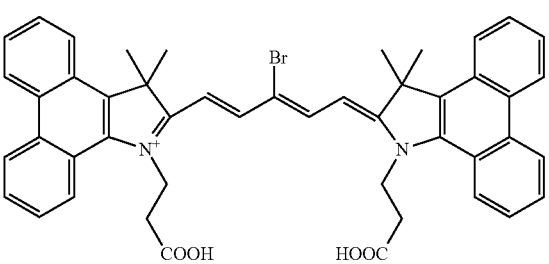
(136)
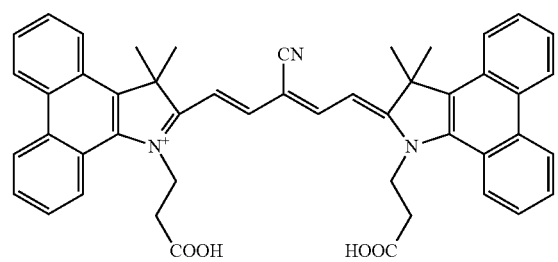
(137)
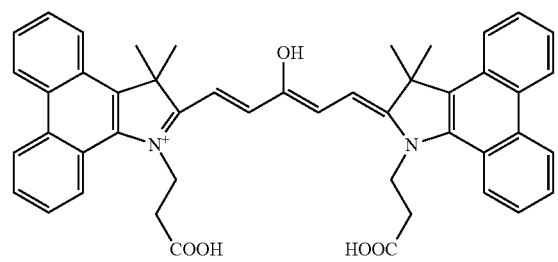
(138)
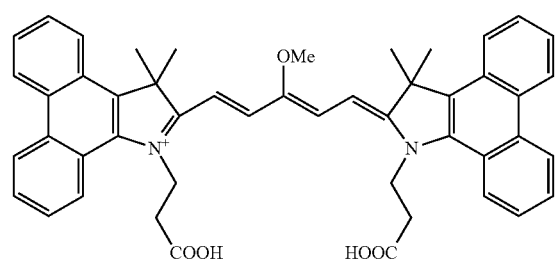
(139)
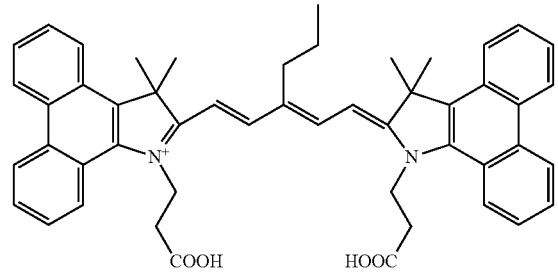
(140)
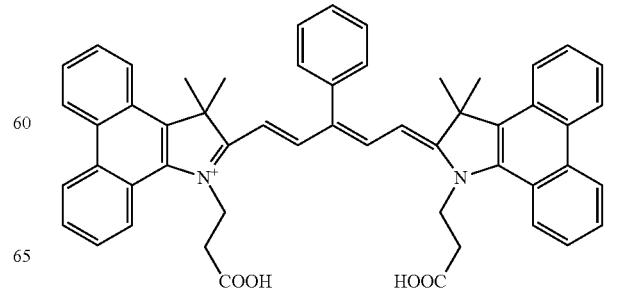

(141)
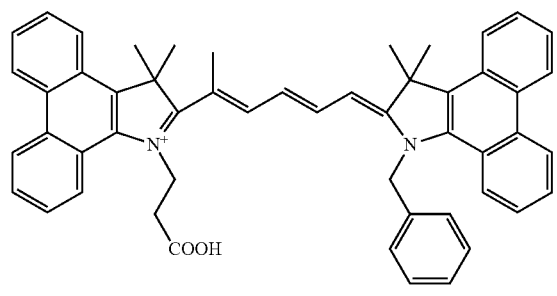
(142)
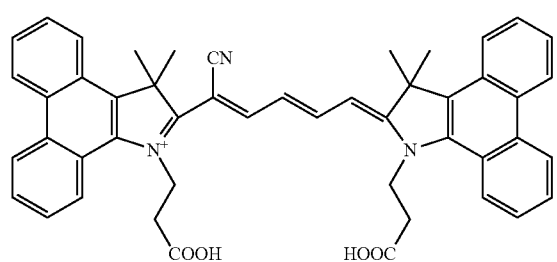
(143)
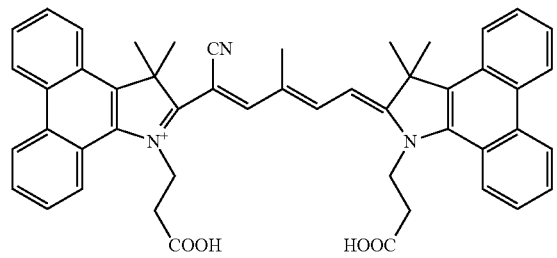
(144)
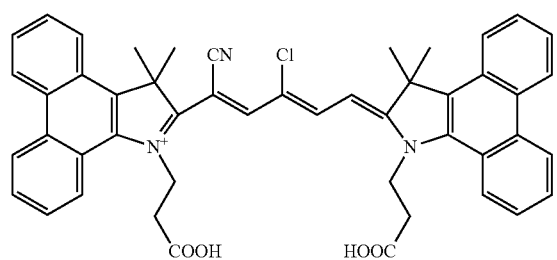
(145)
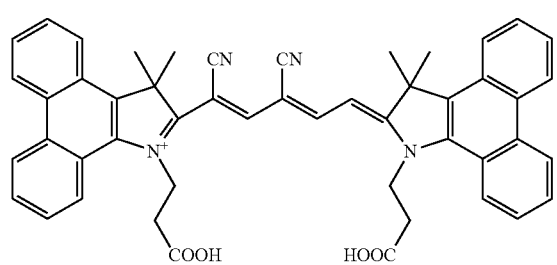
(146)
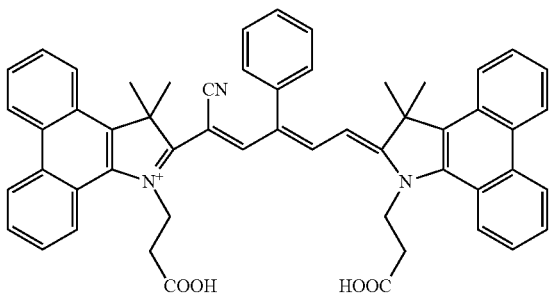
(147)
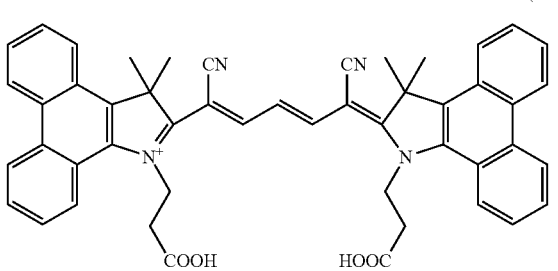
(148)
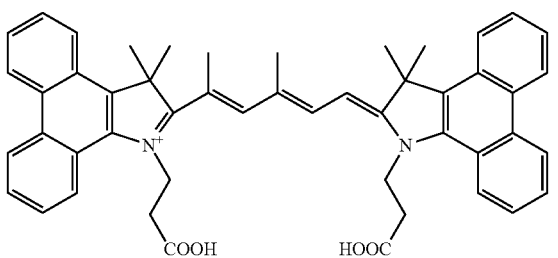
(149)
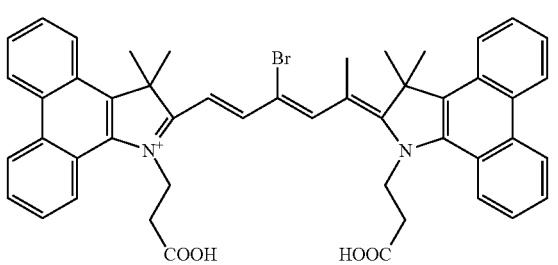
(150)
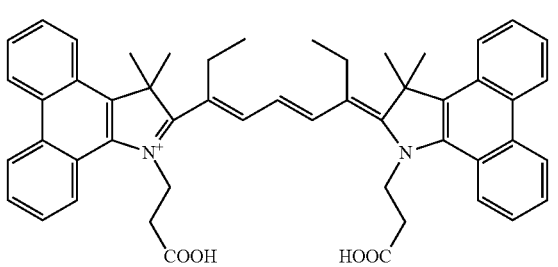

(151) 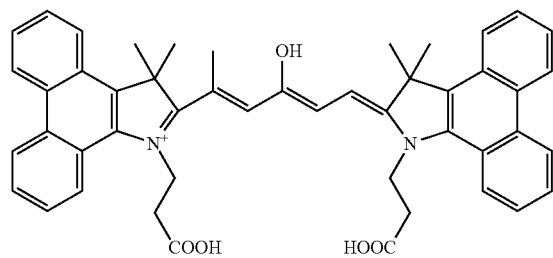
(152) 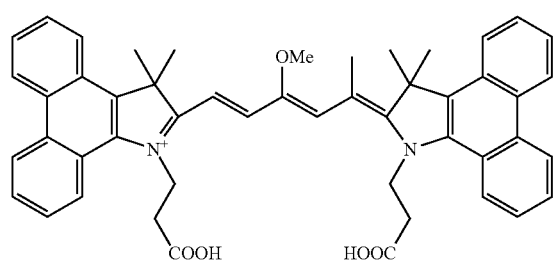
(153) 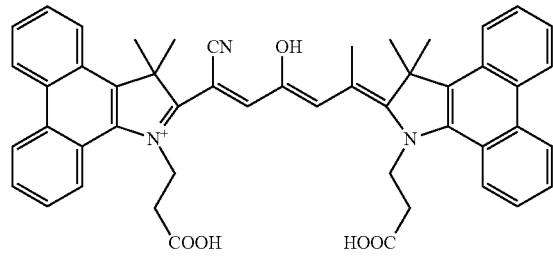
(154) 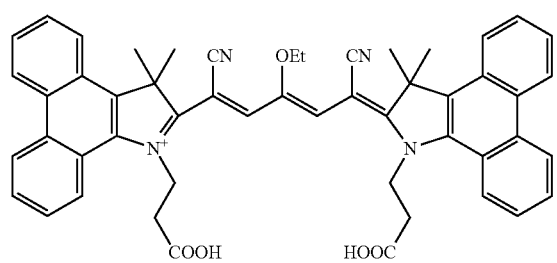
(155) 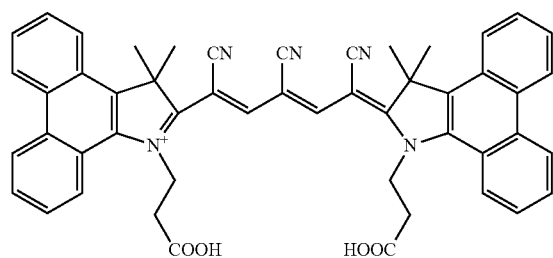
(156) 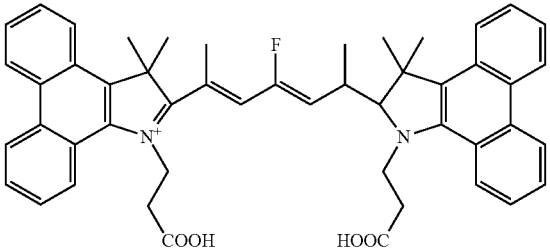
(157) 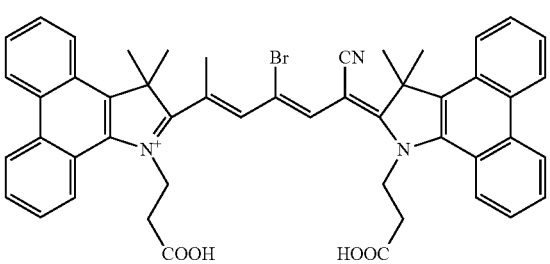
(158) 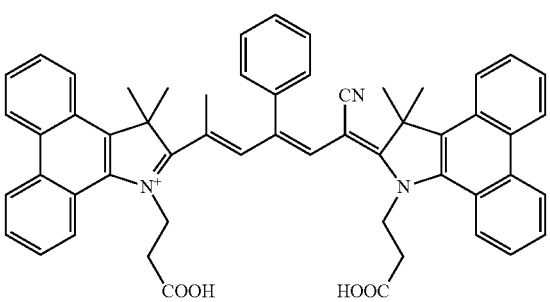
(159) 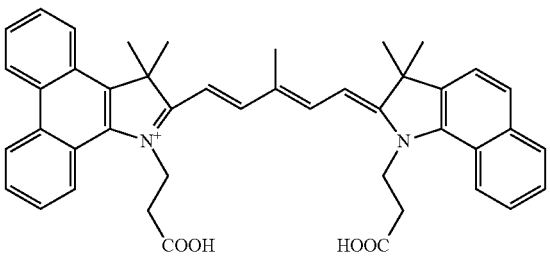
[Chemical formula 22]
(160) 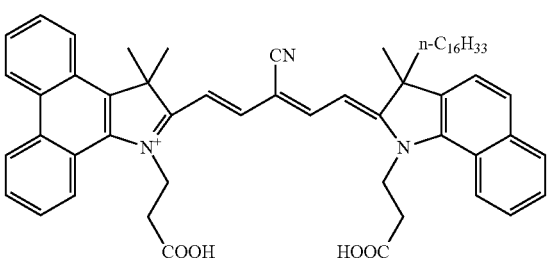

-continued
(161)
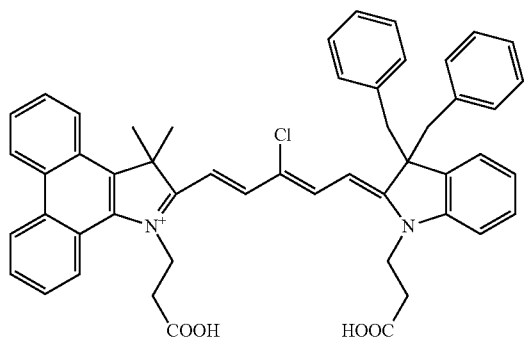
(162)
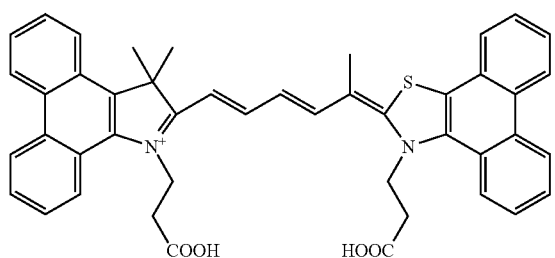
(163)
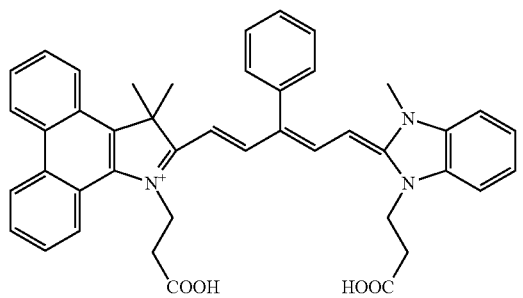
(164)
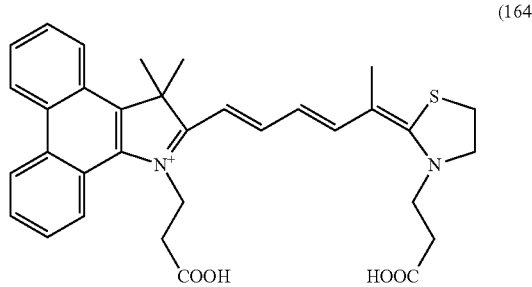
(165)
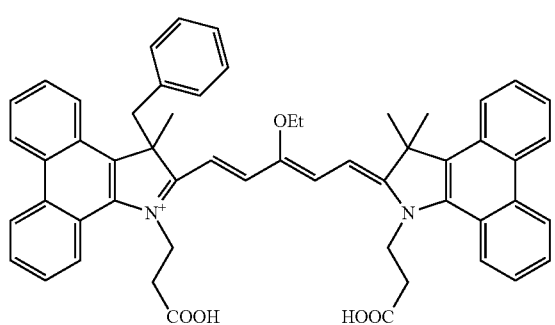
-continued
(166)
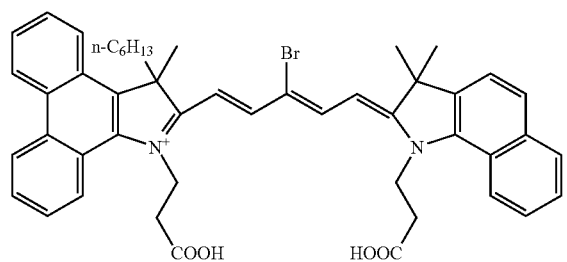
(167)
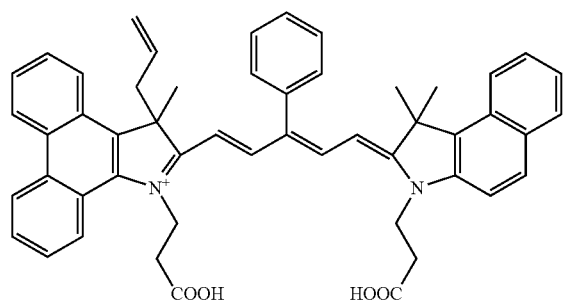
(168)
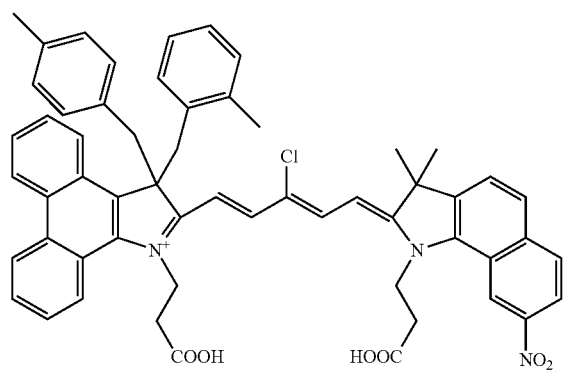
(169)
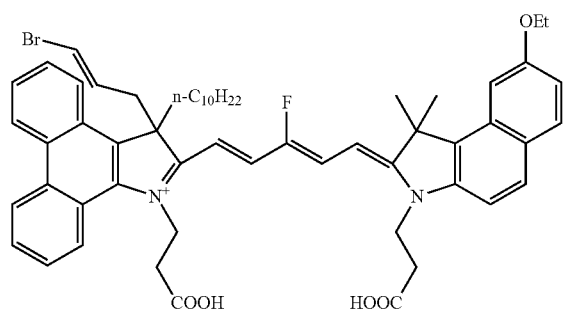

(170)
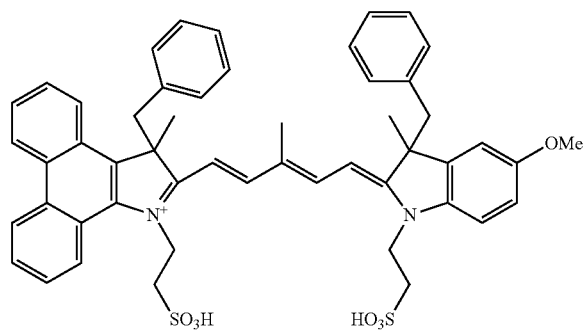
(171)
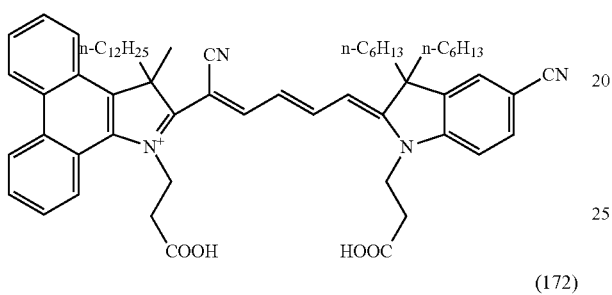
(172)
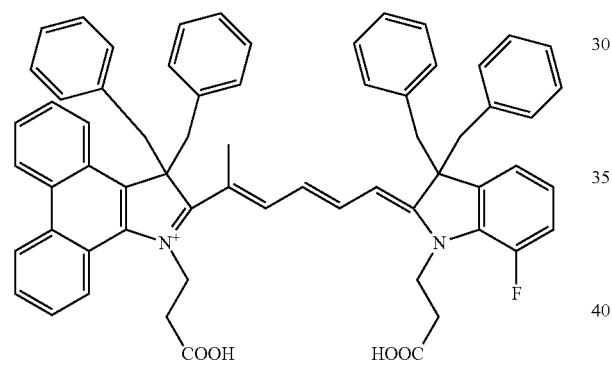
(173)
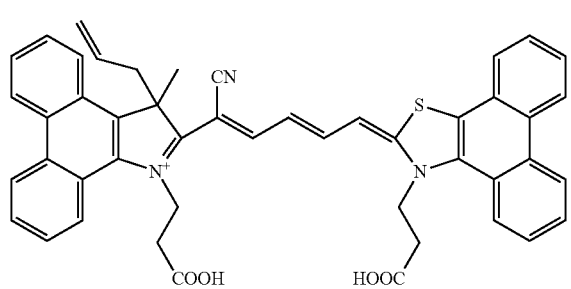
(174)
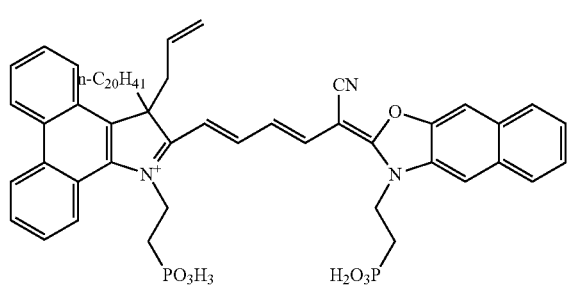
(175)
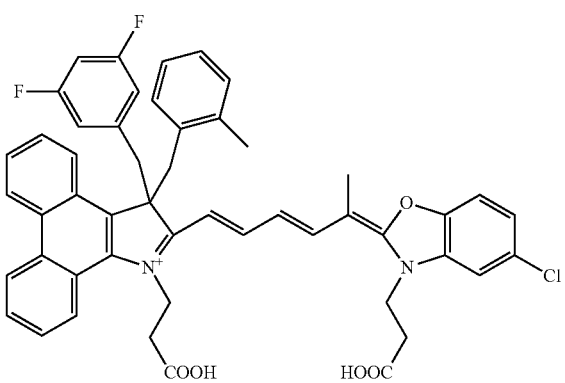
(176)
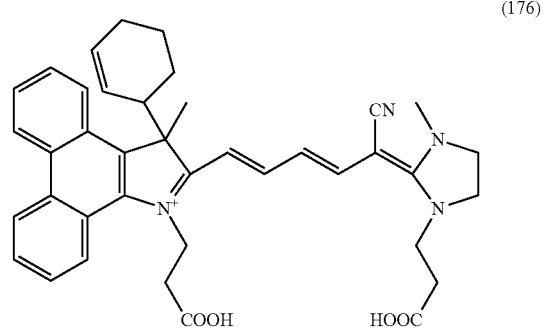
[Chemical formula 23]
(177)
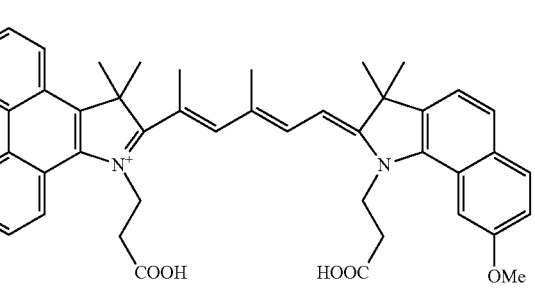
(178)
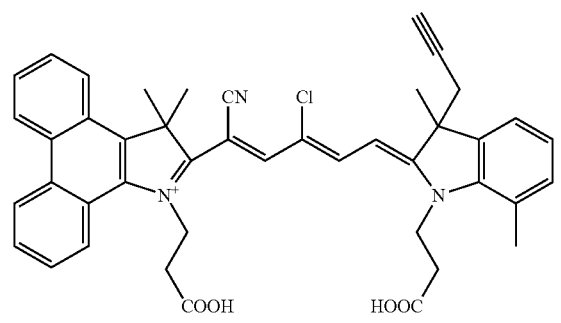

(179)
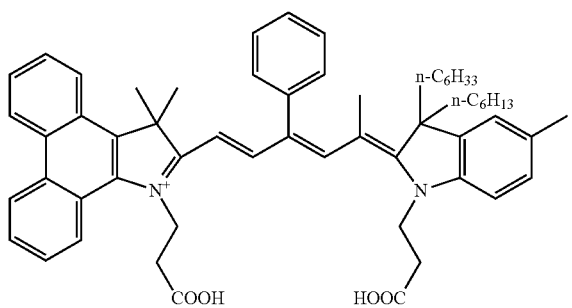
(180)
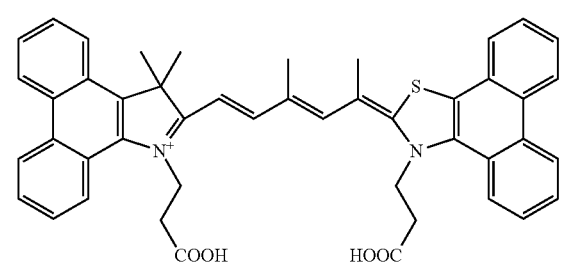
(181)
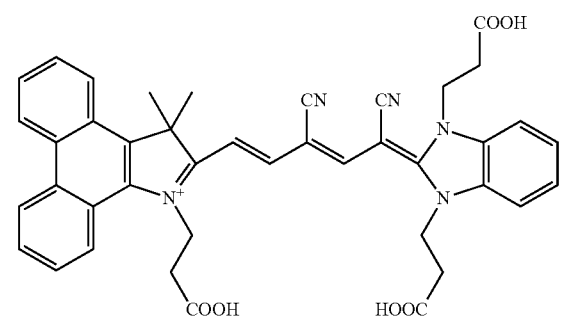
(182)
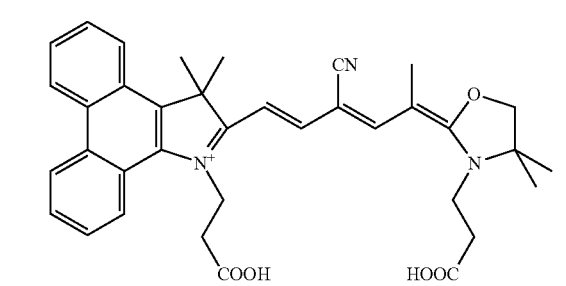
(183)
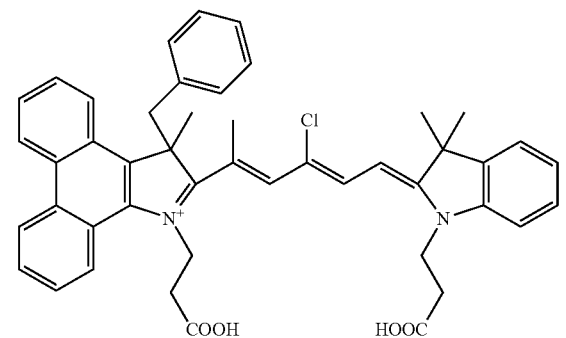
(184)
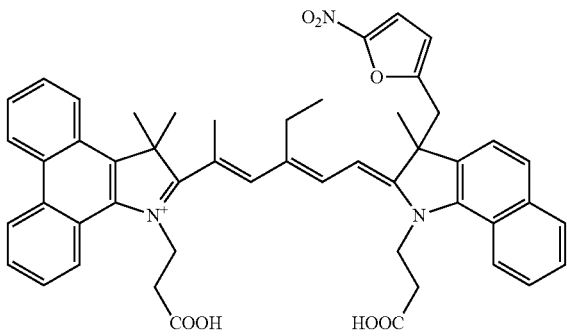
(185)
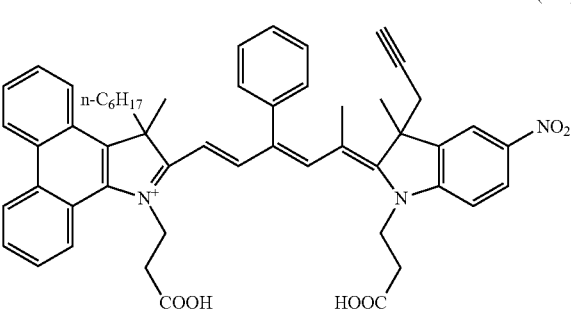
(186)
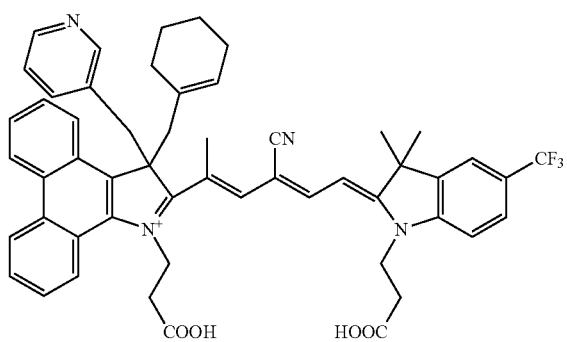
(187)
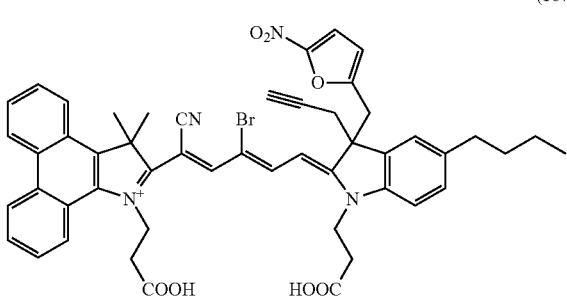

(188)
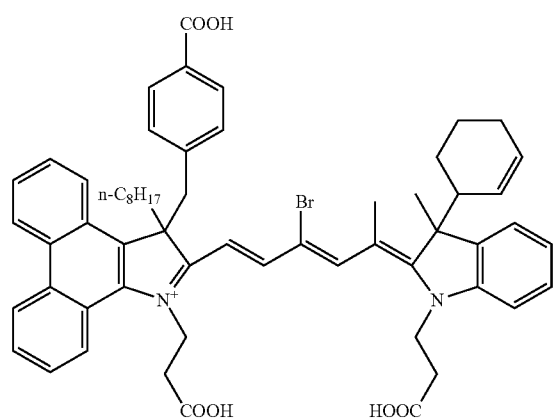
(189)
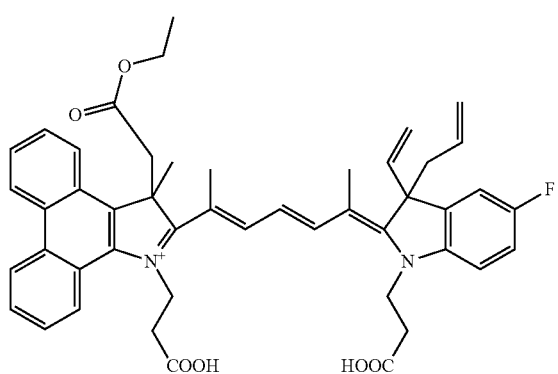
(190)
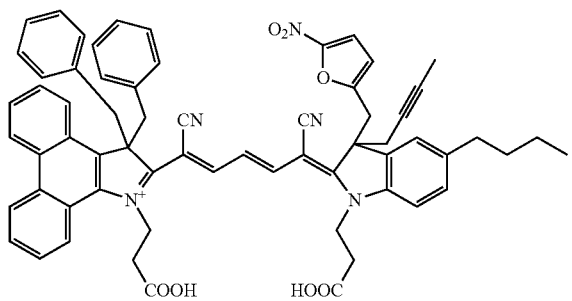
(191)
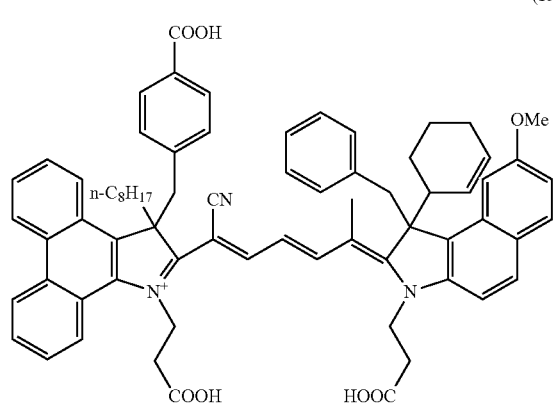
(192)
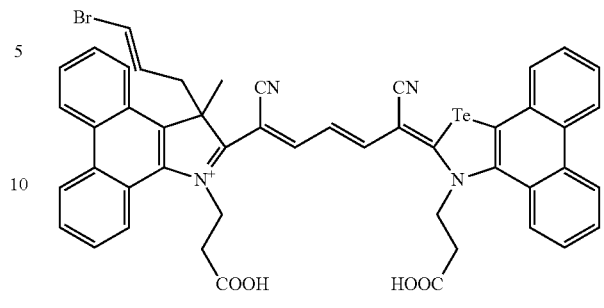
(193)
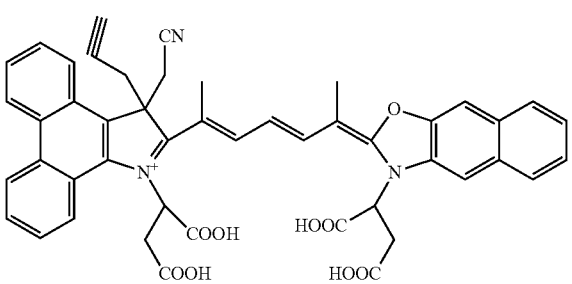
(194)
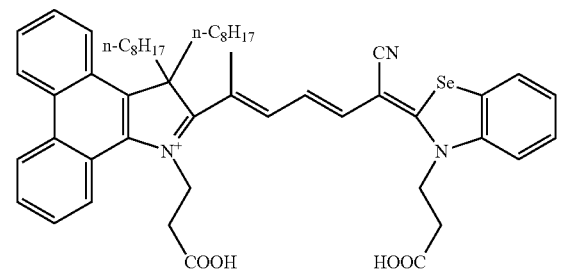
(195)
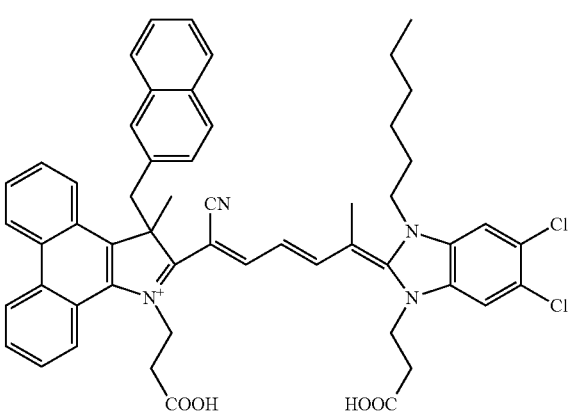

-continued
(196)
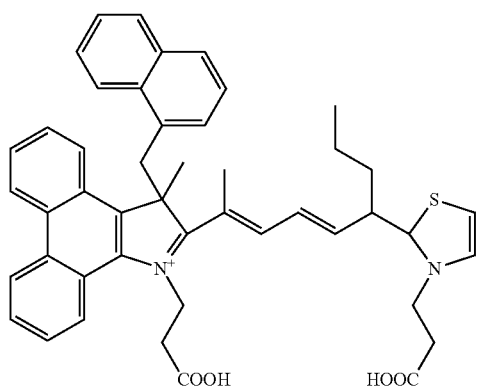
(197)
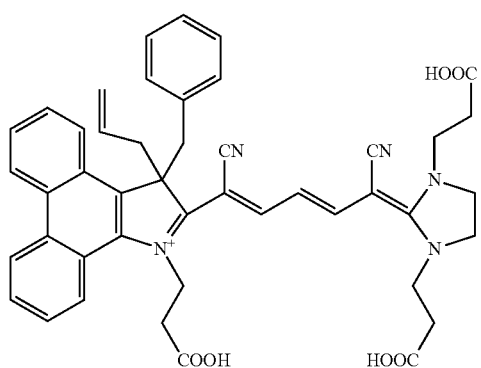
[Chemical formula 24]
(198)
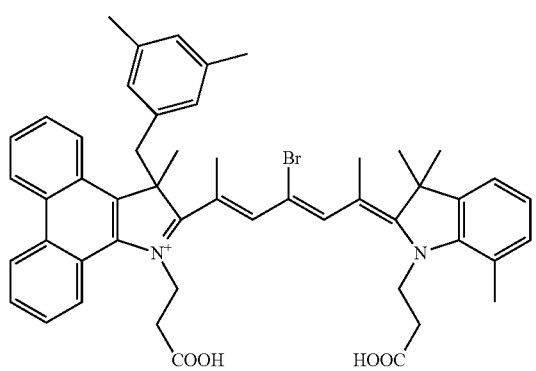
(199)
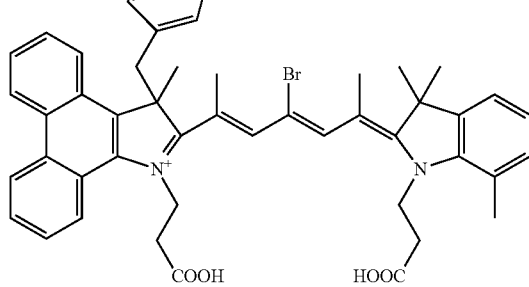
-continued
(200)
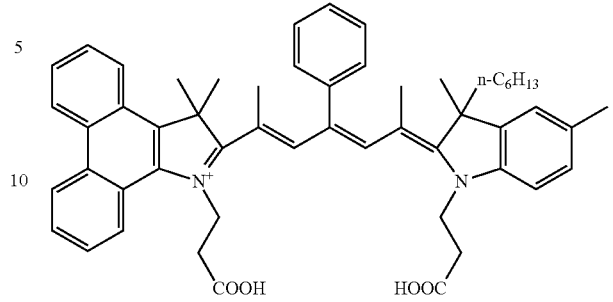
(201)
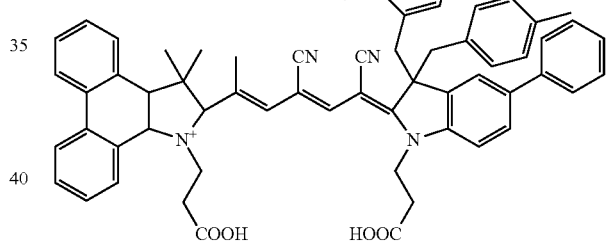
(202)
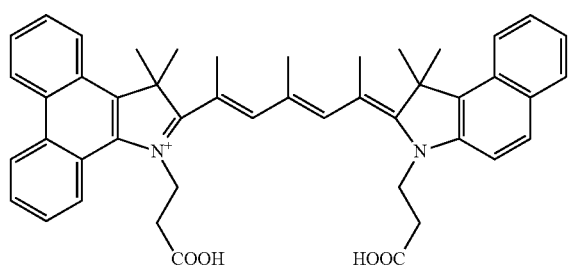
(203)
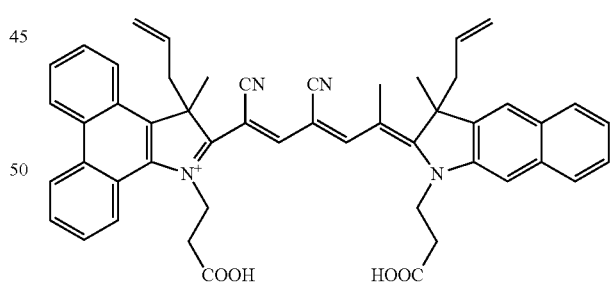
(204)
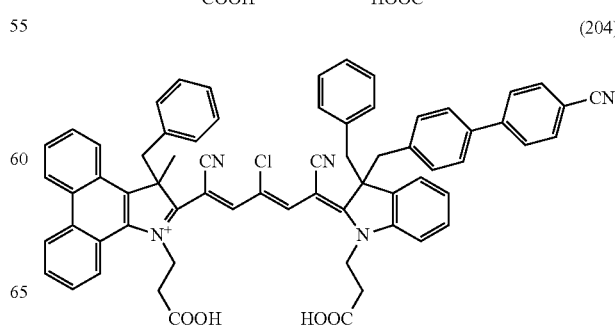

-continued
(205)
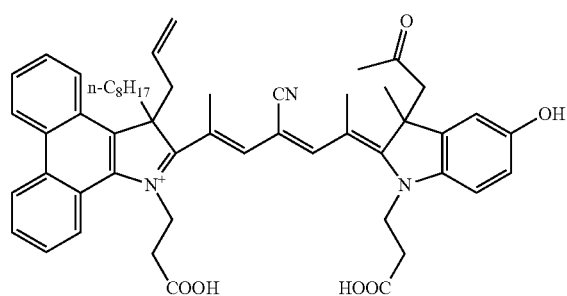
(206)
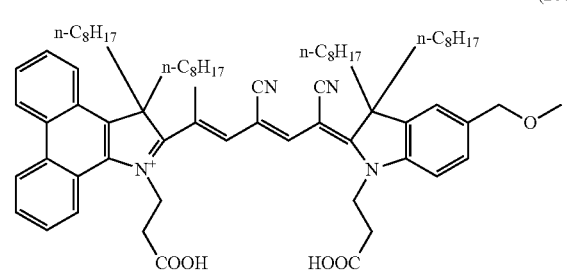
(207)
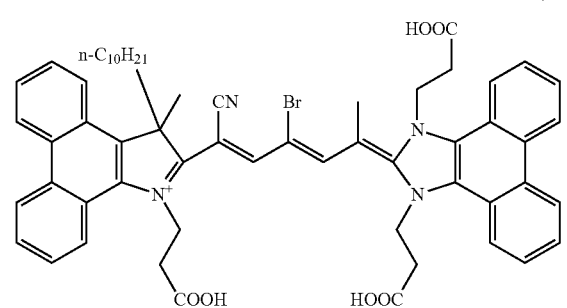
(208)
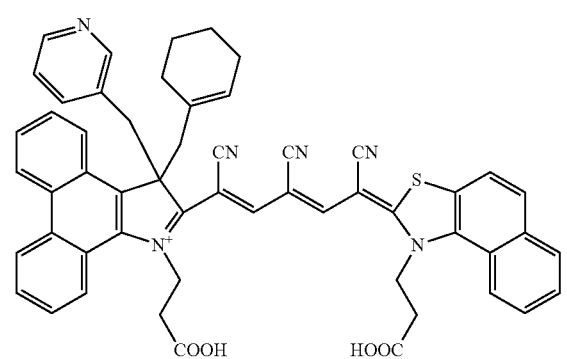
-continued
(209)
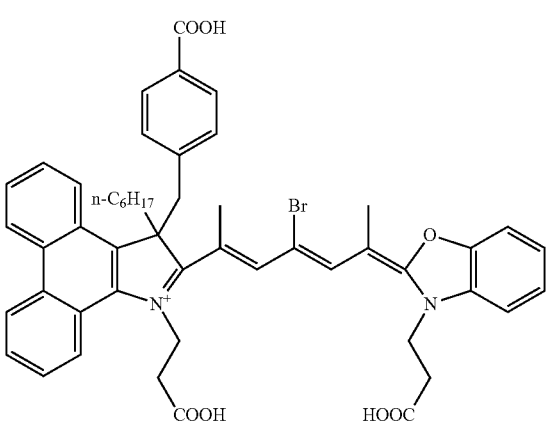
(210)
[Chemical formula 25]
(198)
(199)

-continued
(200)
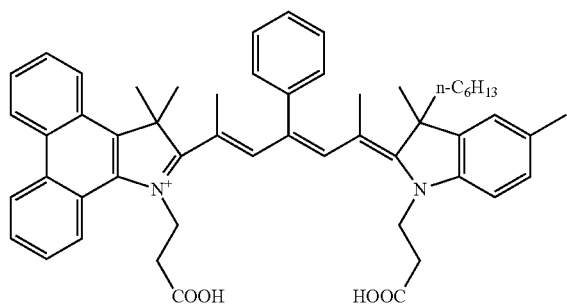
(201)
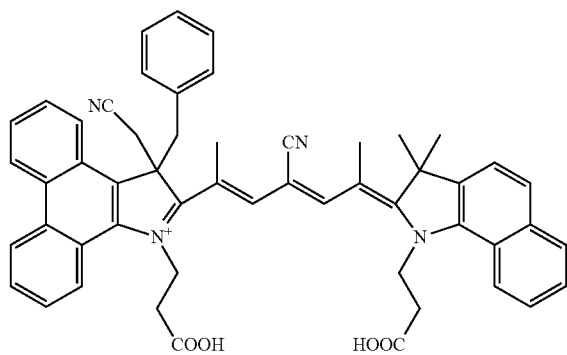
(202)
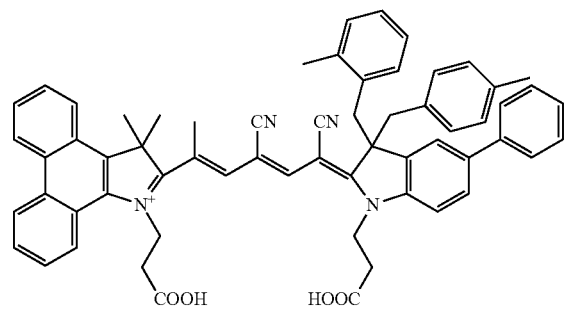
(203)
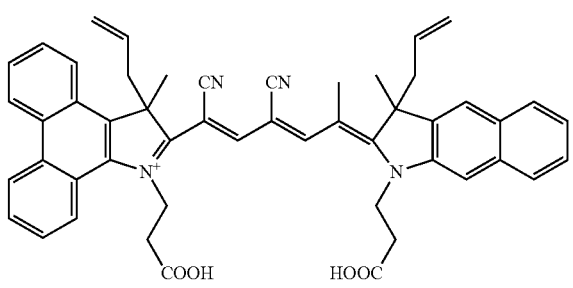
(204)
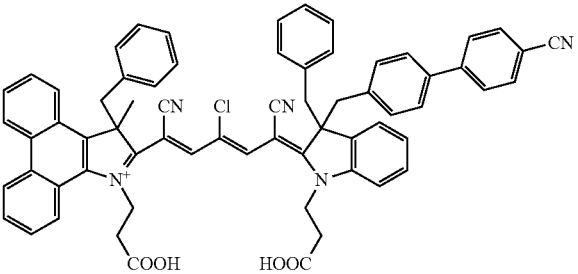
-continued
(205)
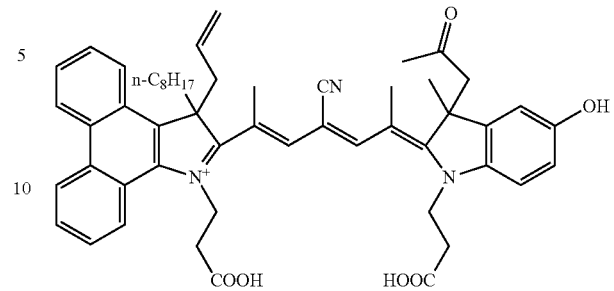
(206)
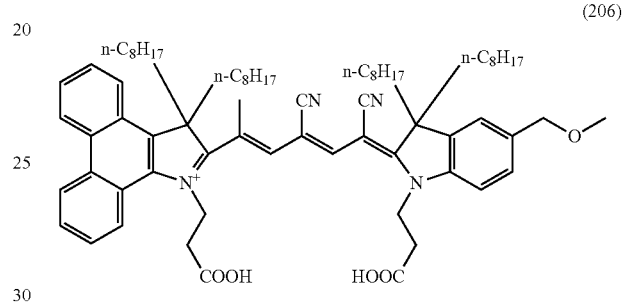
(207)
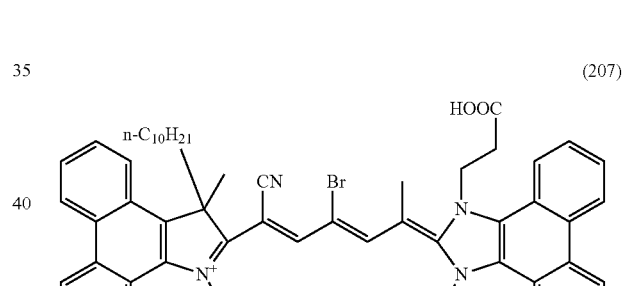
(208)
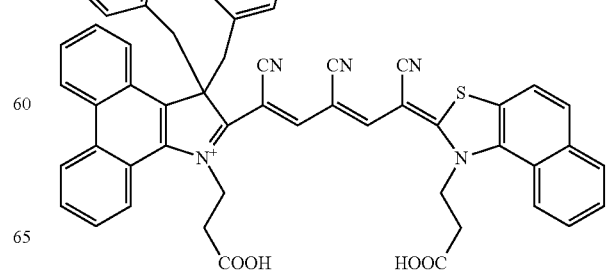

(209)
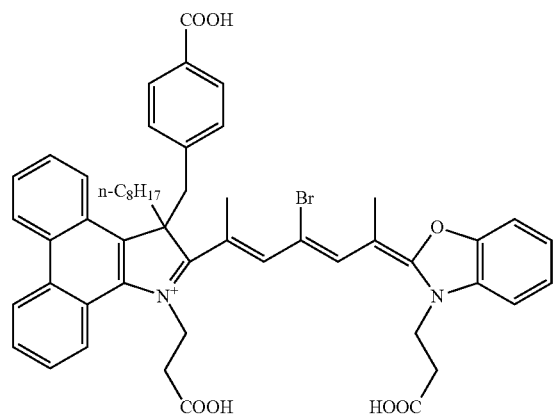
(210)
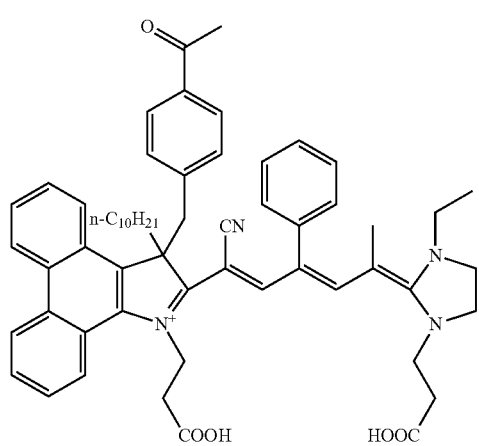
[Chemical formula 26]
(232)
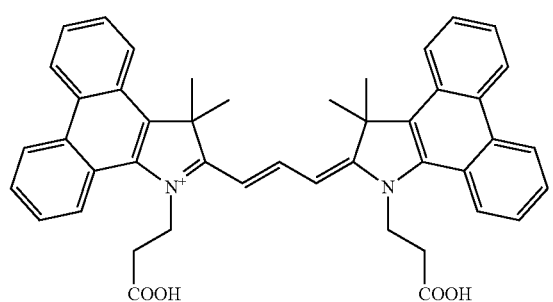
(233)
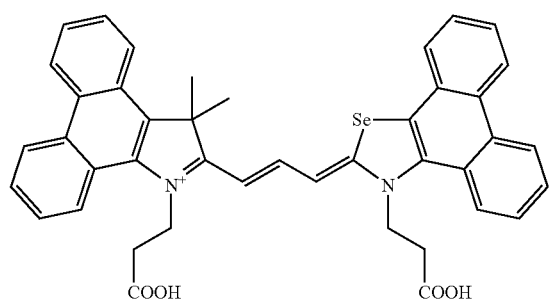
(234)
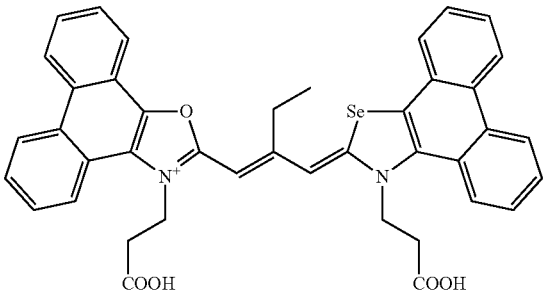
(235)
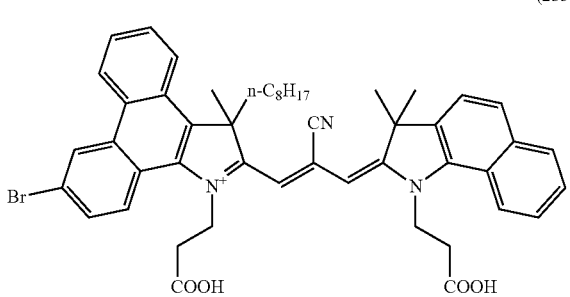
(236)
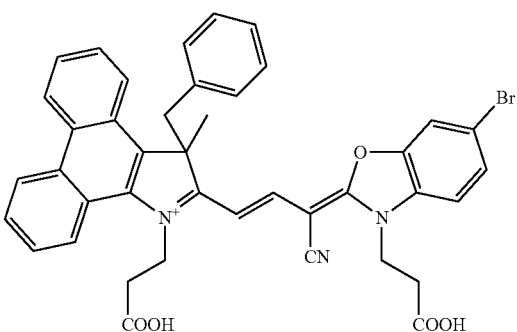
(237)
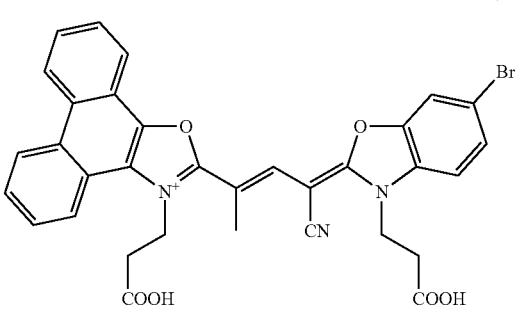

(238)
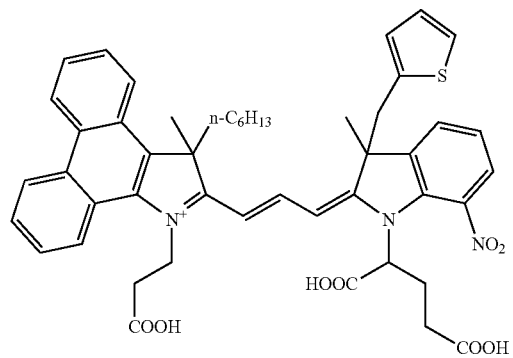
(239)
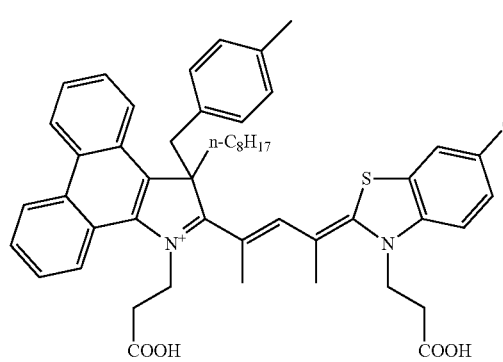
(240)
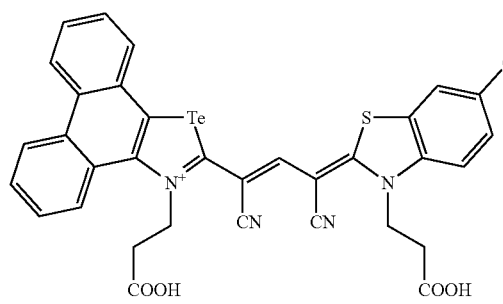
(241)
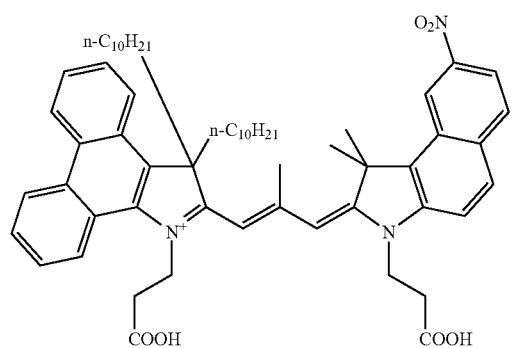
(242)
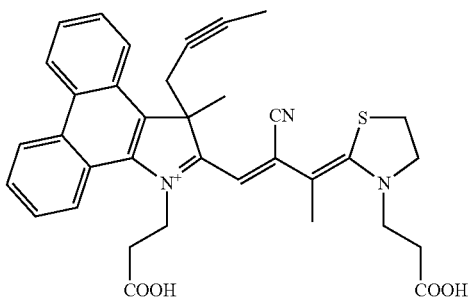
(243)
(244)
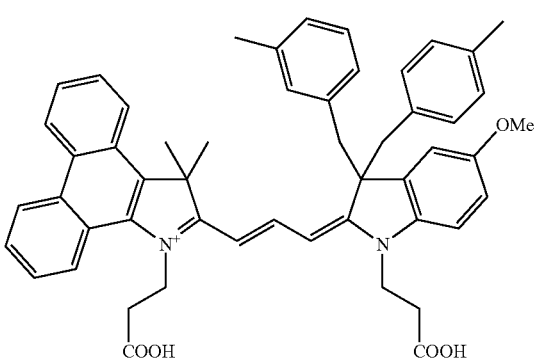
(245)
(246)
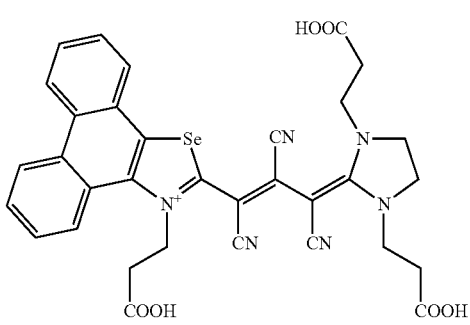

(247)
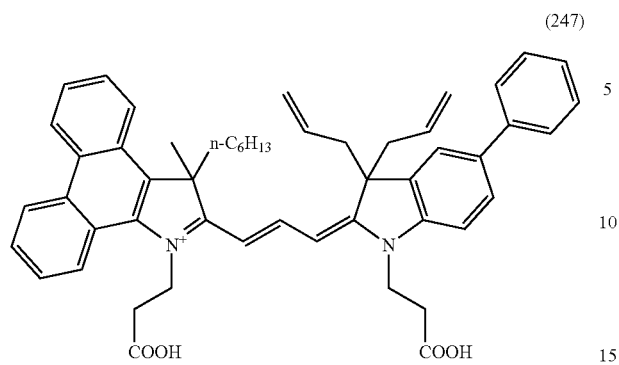
(248)
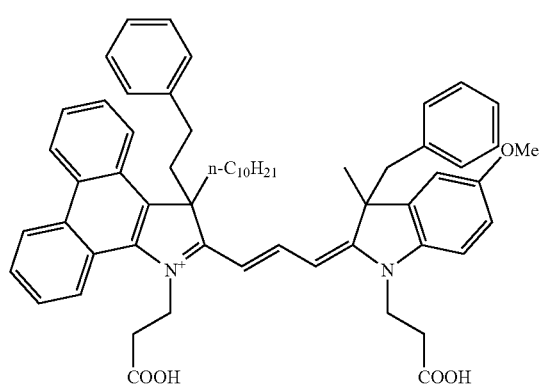
(249)
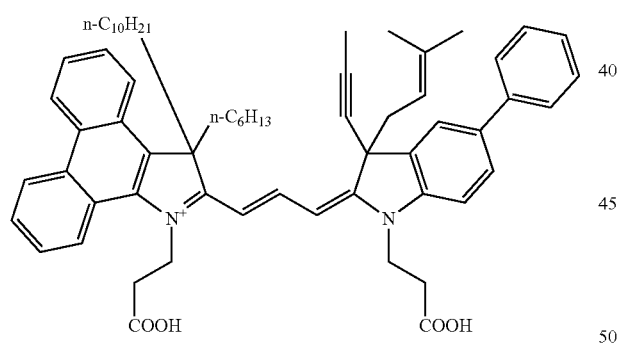
[Chemical Formula 27]
(250)
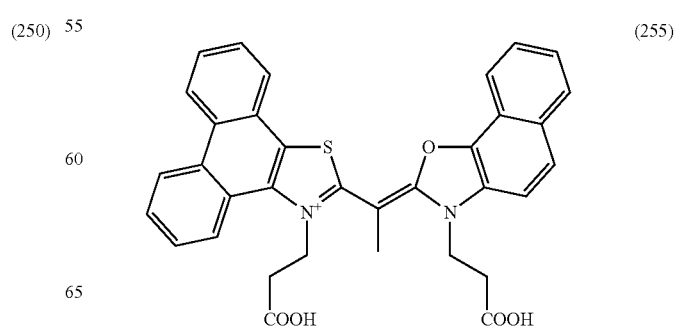
(251)
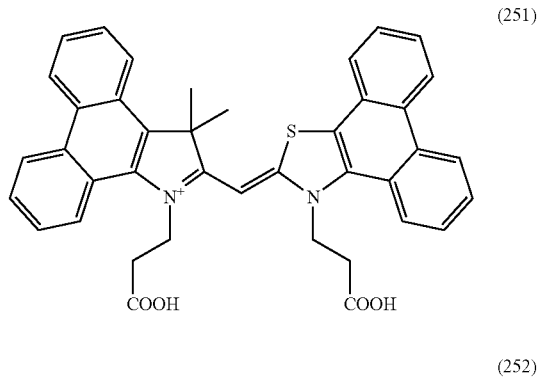
(252)
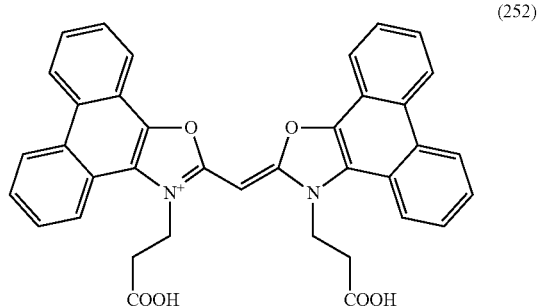
(253)
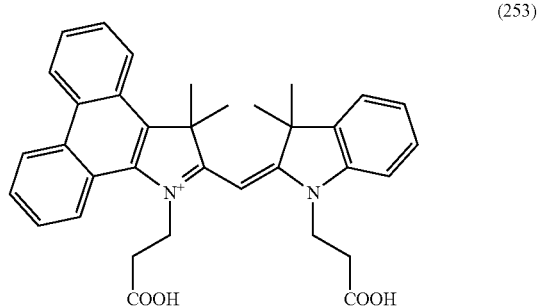
(254)
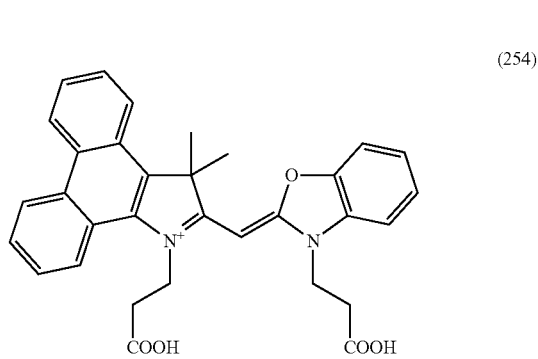
(255)

73
-continued
(256)
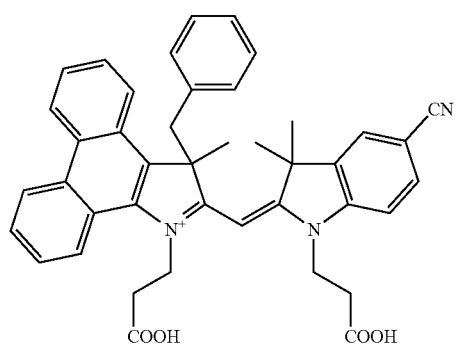
(257)
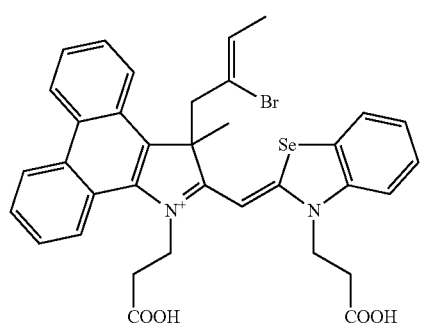
(258)
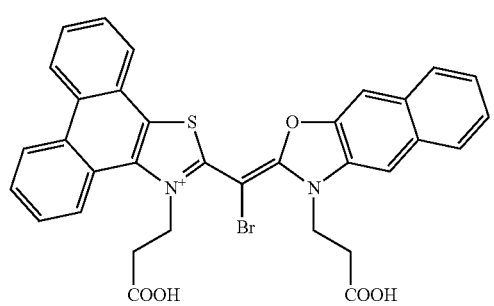
(259)
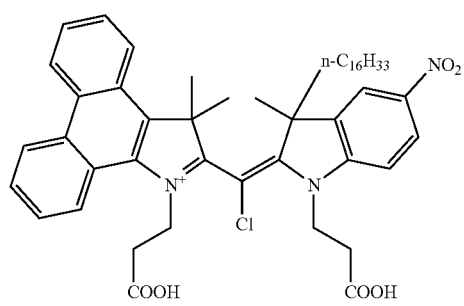
(260)
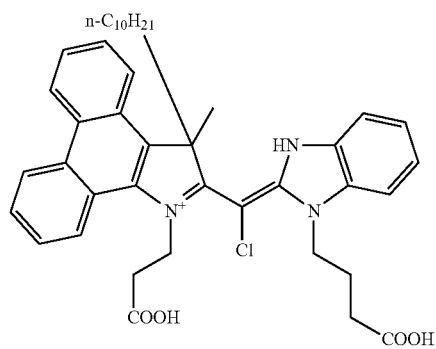
74
-continued
(261)
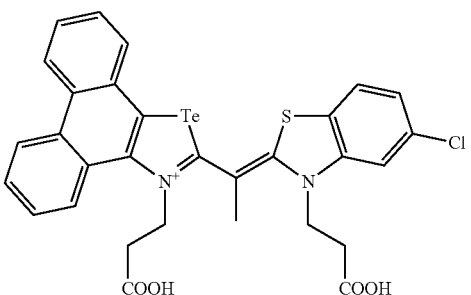
(262)
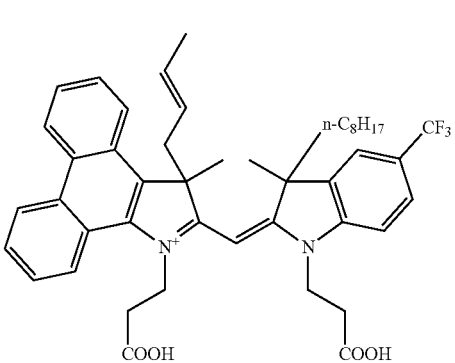
(263)
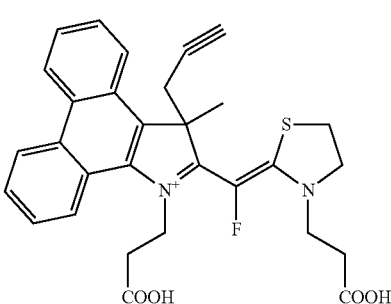
(264)
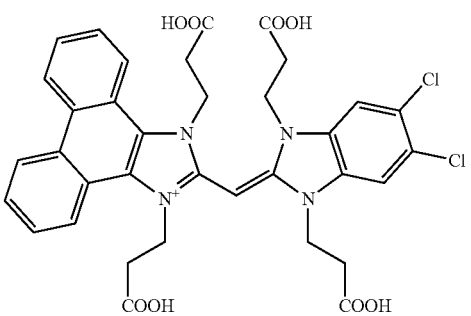
(265)
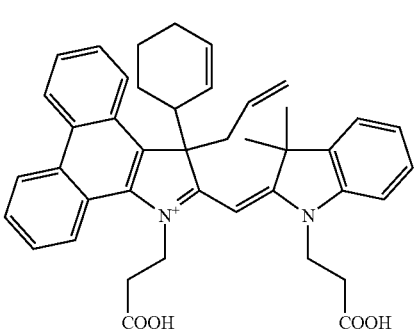

(266)
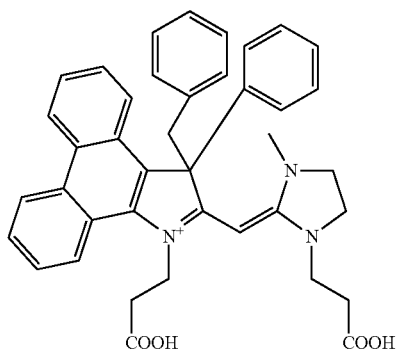
(267)
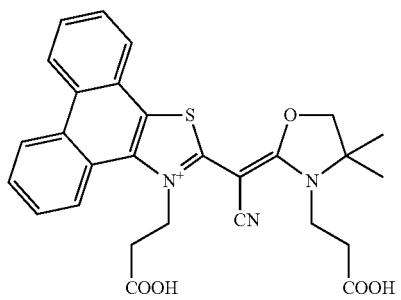
(268)
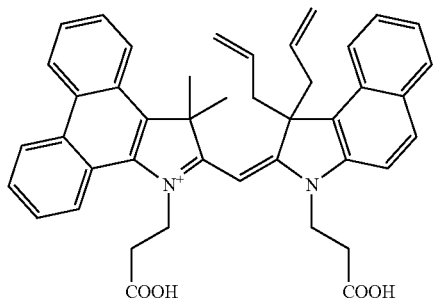
(269)
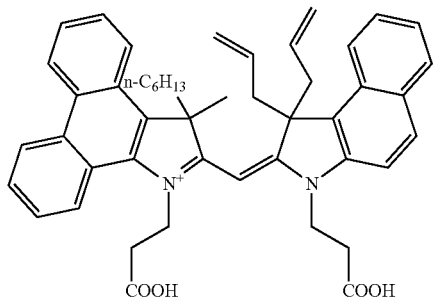
(270)
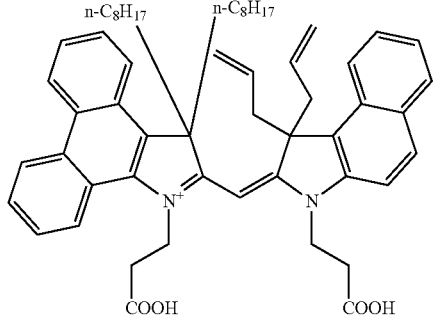
[Chemical formula 28]
(271)
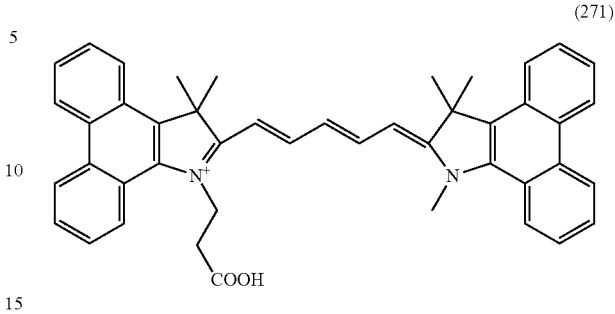
(272)
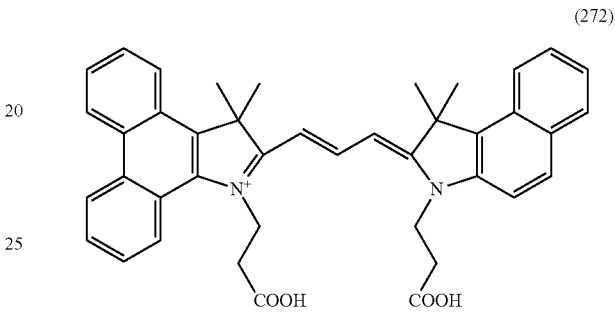
(273)
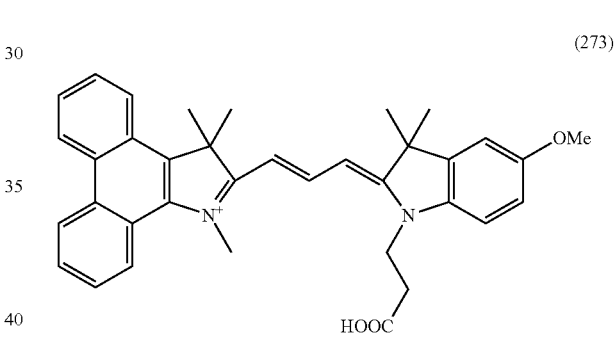
(274)
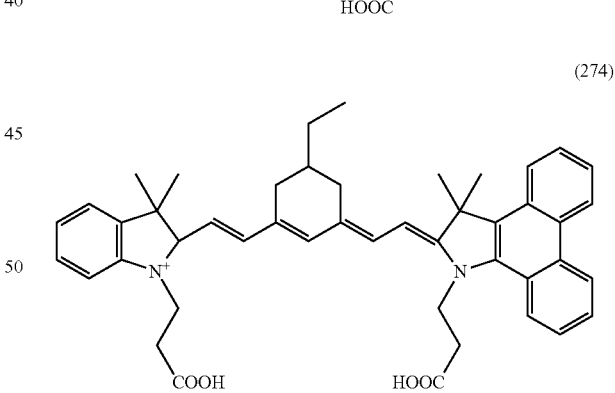
(275)
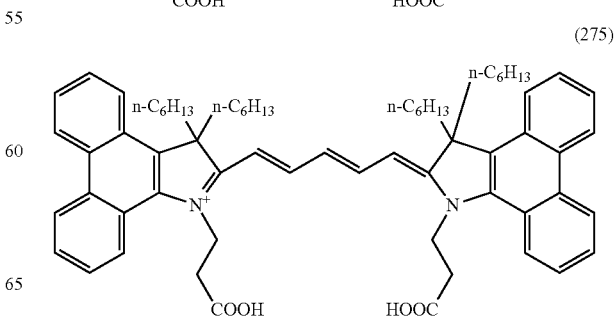

(276)

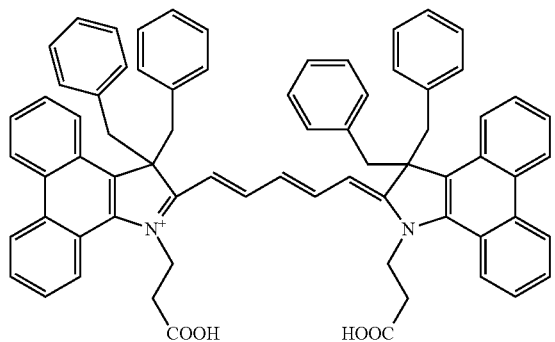

(277)

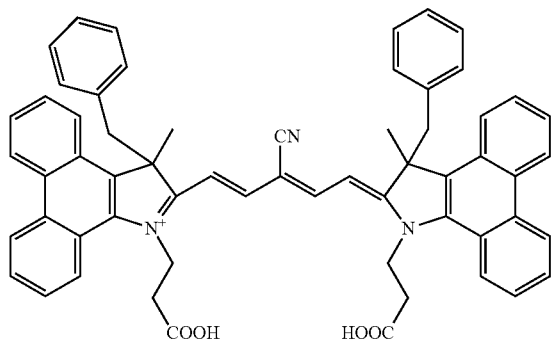

(278)

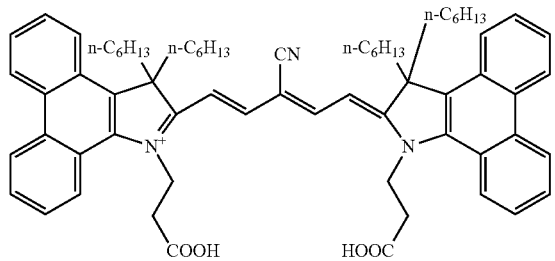

(279)

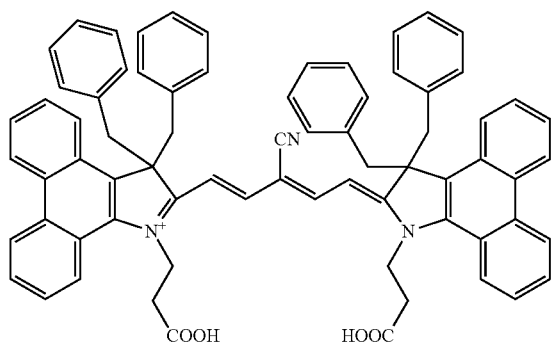

(280)

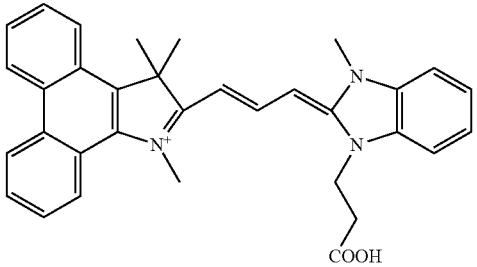

(281)

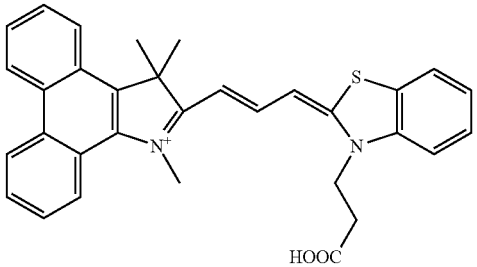

(282)

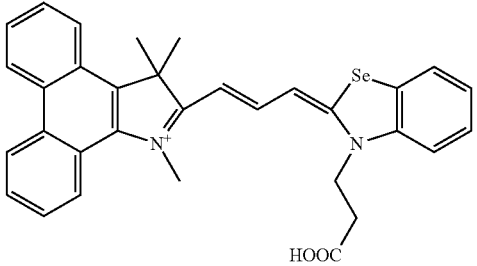

(283)

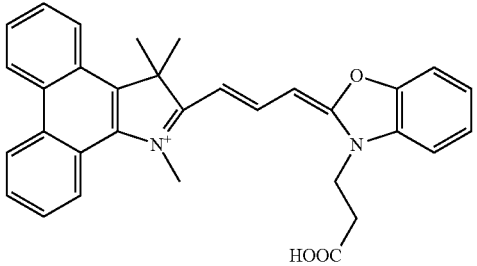

It is needless to say that the compound is not limited to the compound containing a structure section shown in Formula (8) to Formula (283), as long as the compound is the compound having the cyanine structure shown in Formula (1). The same is applied to Formula (3) to Formula (5).

Next, a description will be given of a specific example of a method of synthesizing the cyanine compound shown in Formula (1) with reference to chemical reaction formulas expressed by Formula (1) to Formula (V). The cyanine compound shown in the foregoing formula (1) is able to be synthesized by, for example, the following two methods.

In the first synthesis method, a compound in which the carbon atomicity of the methine chain skeleton contained in Q in Formula (1) is 1 is synthesized. First, a group to become Y1 or Y2 is introduced to the nitrogen atom in the five-membered ring skeleton contained in the heterocyclic skeleton in Formula (1). Specifically, as shown in Chemical reaction formula (1), the compound having a heterocyclic skeleton expressed by Formula (284), the compound expressed by Formula (285), and a given amount of anion to become $An^{p-}$ according to needs are mixed and reacted. Thereby, the quaternary ammonium salt expressed by Formula (286) is synthesized. The compound having a heterocyclic skeleton expressed by Formula (284) contains a skeleton section that is to be subsequently bonded with both ends of the methine chain skeleton (Q) in Formula (1). Further, the compound shown in Formula (285) contains a section that is to be introduced to the nitrogen atom contained in the five-membered ring section in Formula (286) and that is to be Y1 by detaching R51. In Formula (1), synthesis of the section containing the phenanthrene skeleton out of the heterocyclic skeletons bonded with both ends of the methine chain skeleton is shown. However, the other heterocyclic skeleton section is able to be similarly synthesized.

[Chemical formula 29]

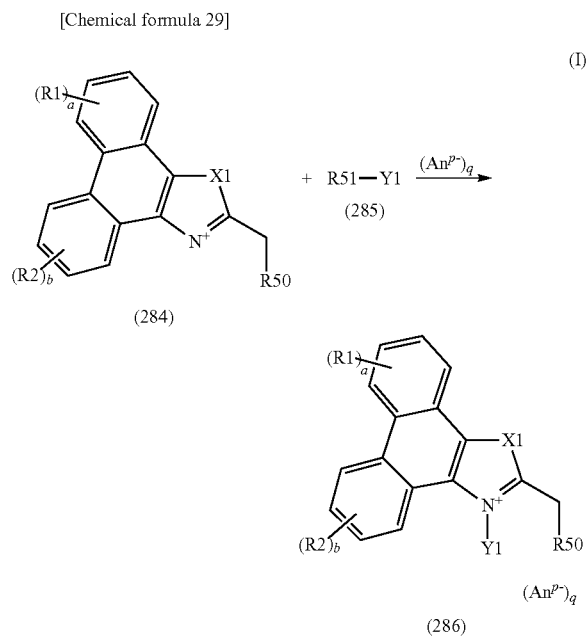

(R1, R2, a, b, X1, and Y1 are respectively similar to R1, R2, a, b, X1, and Y1 explained in Formula (1). R50 is a hydrogen atom or a monovalent substituent group, and a monovalent group to be introduced to the carbon atom structuring the methine chain skeleton of Q in Formula (1). R51 is a detachment group of a halogen atom or the like. $An^{p-}$ is an anion with q valency. p is 1 or 2, and q is a coefficient to maintain neutral electric charge in the compound of Formula (286).

Next, as shown in Chemical reaction formula (II), the quaternary ammonium salt shown in Formula (286) and the quaternary ammonium salt expressed by Formula (287) having a detachment group (R52) are reacted under the presence of a base. Thereby, the cyanine compound (Formula (288)) with a carbon atomicity of 1 of the methine chain skeleton contained in Q in Formula (1) is synthesized as a final product. The quaternary ammonium salt having the detachment group R52 shown in Formula (287) is able to be synthesized in a manner similar to that of the quaternary ammonium salt shown in Formula (286).

[Chemical formula 30]

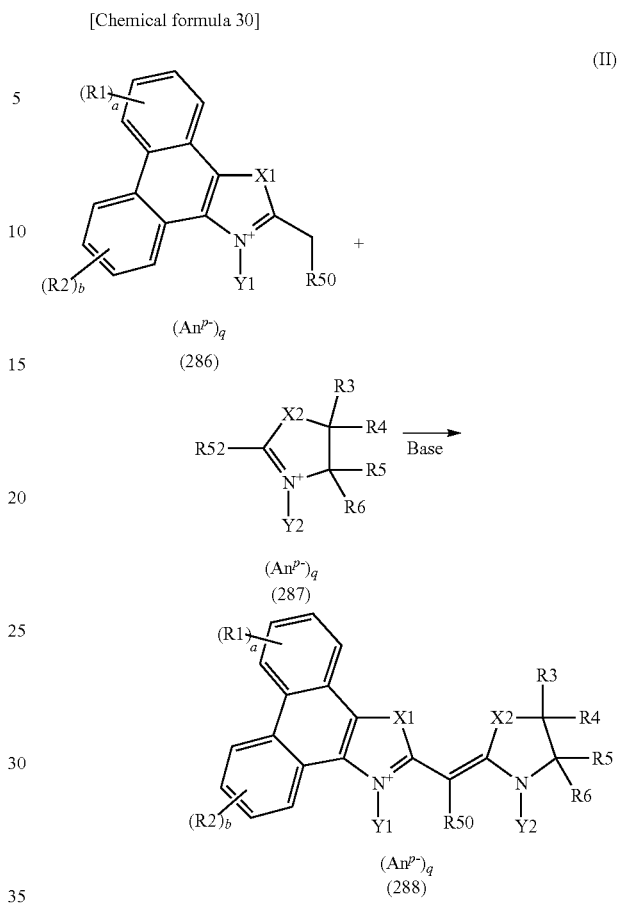

(R1 to R6, a, b, X1, X2, Y1, and Y2 are similar to R1 to R6 a, b, X1, X2, Y1, and Y2 explained in Formula (1). $An^{p-}$ is an anion with p valency. p is 1 or 2, and q is a coefficient to maintain neutral electric charge in the compounds respectively shown in Formula (286) to Formula (288). R50 is a hydrogen atom or a monovalent substituent group. R52 is a group expressed by —S—R100 or a detachment group such as —CH═N—OH. R100 is an alkyl group such as a methyl group.)

In the second synthesis method, a compound with carbon atomicity larger than 1 of the methine chain skeleton contained in Q in Formula (1) is synthesized. First, the quaternary ammonium salt shown in Formula (286) is synthesized in the same manner as the procedure shown in Chemical reaction formula (1). Next, as shown in Chemical reaction formula (III), the quaternary ammonium salt shown in Formula (286) and the compound expressed by Formula (289) as a bridge agent are mixed and reacted, and thereby a cyanine intermediate expressed by Formula (290) is synthesized. Finally, as shown in Chemical reaction formula (IV), the cyanine intermediate expressed by Formula (290) and the quaternary ammonium salt shown in Formula (291) synthesized through a route similar to the synthesis route of the quaternary ammonium salt shown in Formula (286) (Chemical reaction formula (1)) are reacted under the presence of a base and acetic anhydride ($(CH_3CO)_2O$). Thereby, as a final product, the cyanine compound (Formula (292)) with carbon atomicity larger than 1 of the methine chain skeleton of Q in Formula (1) is synthesized. In Chemical reaction formula (III), examples of the compound shown in Formula (289) used as a bridge agent include the compounds expressed by Formula (289-1)

to Formula (289-4). Examples of other bridge agents include the compounds expressed by Formula (293) to Formula (295).

[Chemical formula 31]

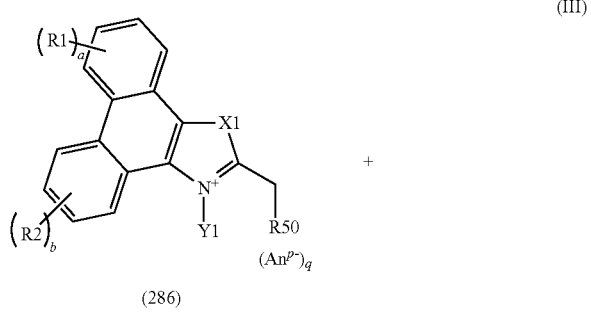
(286)

+

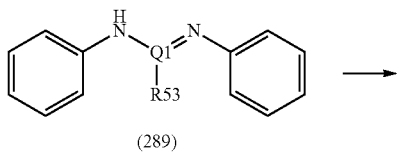
(289)

⟶

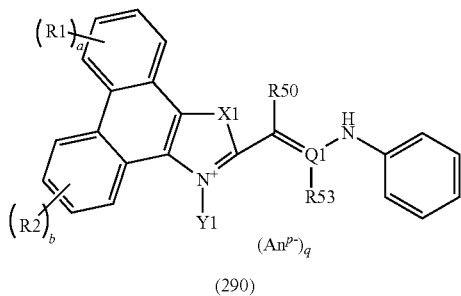
(290)

(R1, R2, a, b, X1, and Y1 are similar to R1, R2, a, b, X1, and Y1 explained in Formula (1). $An^{p-}$ is an anion with p valency. p is 1 or 2, and q is a coefficient to maintain neutral electric charge in the compounds respectively shown in Formula (286) and Formula (290). R50 and R53 are a hydrogen atom or a monovalent substituent group. Q1 is a linkage group that has a methine chain with carbon atomicity from 1 to 5 both inclusive as a skeleton.)

[Chemical Formula 32]

(IV)

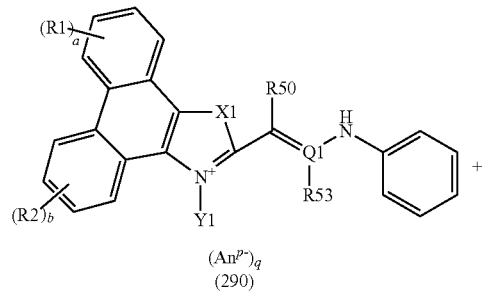
(290)

+

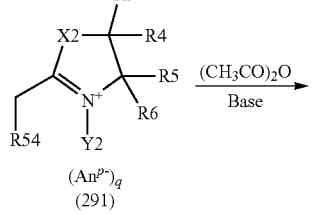
(291)

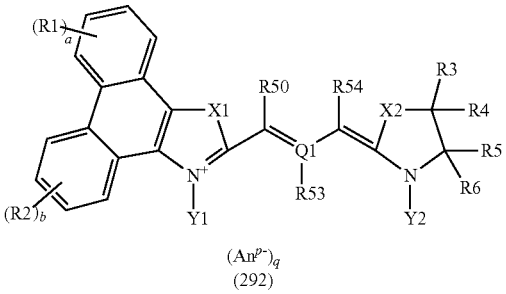
(292)

(R1 to R6, a, b, X1, X2, Y1, and Y2 are similar to R1 to R6, a, b, X1, X2, Y1, and Y2 explained in Formula (1). $An^{p-}$ is an anion with p valency. p is 1 or 2, and q is a coefficient to maintain neutral electric charge in the compounds respectively shown in Formula (290) to Formula (292). R50, R53, and R54 are a hydrogen atom or a monovalent substituent group. Q1 is a linkage group that has a methine chain with carbon atomicity from 1 to 5 both inclusive as a skeleton.)

[Chemical formula 33]

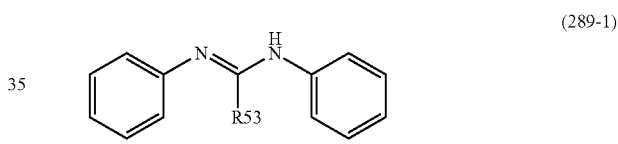
(289-1)

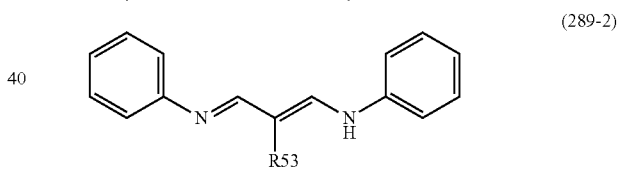
(289-2)

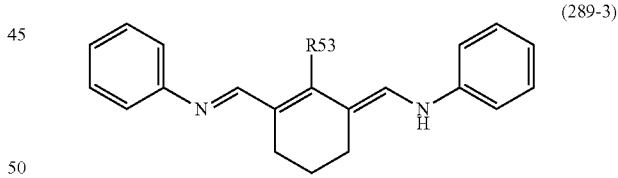
(289-3)

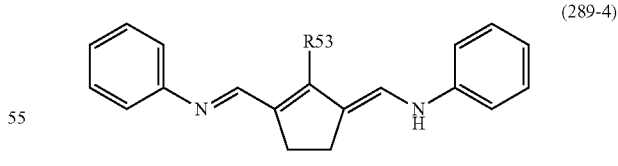
(289-4)

(R53 is a hydrogen atom or a substituent group.)

[Chemical formula 34]

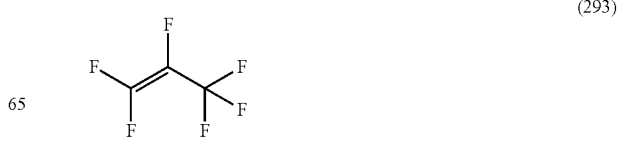
(293)

-continued

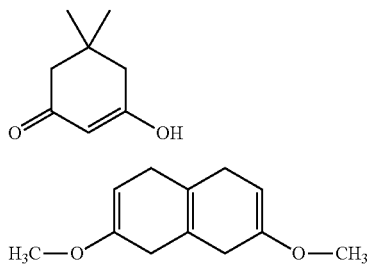

(294)

(295)

In the second synthesis method, as shown in Chemical reaction formulas (III) and (IV), synthesis was made in two stages so that the cyanine intermediate shown in Formula (290) is synthesized by using the quaternary ammonium salt shown in Formula (286) and the like. However, as long as the sections containing the heterocyclic skeletons bonded with both ends of the methine chain have the same structure in the final product, the final product (Formula (296)) may be obtained by one stage reaction as shown in Chemical reaction formula (V), for example. In this case, the quaternary ammonium salt shown in Formula (286) and the bridge agent shown in Formula (289) are reacted under the presence of a base and acetic anhydride ($(CH_3CO)_2O$).

[Chemical formula 35]

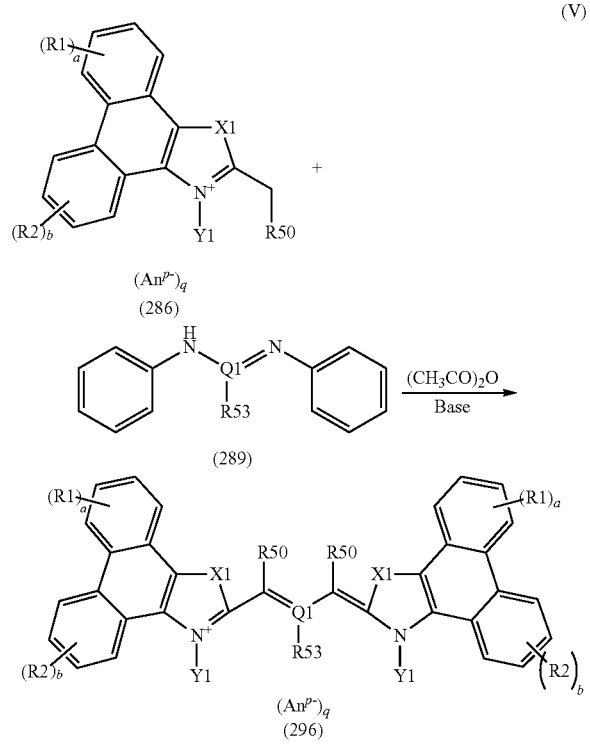

(R1, R2, a, b, X1, and Y1 are similar to R1, R2, a, b, X1, and Y1 explained in Formula (1). $An^{p-}$ is an anion with p valency. p is 1 or 2, and q is a coefficient to maintain neutral electric charge in the compounds respectively shown in Formula (286) and Formula (296). R50 and R53 are a hydrogen atom or a monovalent substituent group. Q1 is a linkage group that has a methine chain with carbon atomicity from 1 to 5 both inclusive as a skeleton.)

The dye for a photoelectric conversion device according to this embodiment has the cyanine structure shown in Formula (1). Thus, compared to a dye not having the structure (for example, a cyanine compound containing a benzene skeleton or a naphthalene skeleton instead of the phenanthrene skeleton), excitation is generated by absorbing wider wavelength region light out of from ultraviolet light region to near-infrared light region. In addition, electrons are able to be effectively injected to a support in a state of being supported by the support. Thus, in the case where the dye is used for a photoelectric conversion device, electron injection amount from the dye to the support in relation to radiated light is increased, IPCE (Incident Photon to Current Conversion Efficiency) is improved, and conversion efficiency is able to be improved. IPCE indicates a ratio of conversion to photocurrent electron number in relation to photon number of radiated light in a photoelectric conversion device. IPCE is obtained by IPCE (%)=Isc*1240/$\lambda$*1/$\Phi$ (In the formula Isc represents a short circuit current, $\lambda$ represents wavelength, and $\Phi$ represents incident light intensity).

In this case, the cyanine structure shown in Formula (1) may be the structure shown in Formula (3), may be the structure shown in Formula (4), or may be the structure shown in Formula (5). Thereby, planarity is lowered as an entire molecule and formation of an aggregate is inhibited. Thus, if used for a photoelectric conversion device, the ratio of the association amount that hardly contributes to photoelectric conversion in the entire dye supported by a support is lowered, and high conversion efficiency is able to be obtained. In particular, in the case where the cyanine structure shown in Formula (1) is the structure shown in Formula (5), both heterocyclic skeletons introduced to both ends of the methine chain skeleton contain a phenanthrene skeleton. Thus, in this case, electrons are more effectively injected to the support, and higher effect is easily obtained.

Further, in particular, in the case where at least one of R7, R8, R10, and R11 shown in Formula (1) or Formula (3) to formula (5) is the group shown in the foregoing Formula (2), planarity as an entire molecule is further lowered, and thus conversion efficiency is able to be more improved if the dye is used for a photoelectric conversion device. Further, in the case where both Y1 and Y2 shown in Formula (1) or Formula (3) to formula (5) are an anchor group, the dye is hardly exfoliated from a support. Thus, in the case where the dye is used for a photoelectric conversion device, electron injection amount to the support in relation to the light amount absorbed as an entire device is increased, and higher conversion efficiency is able to be obtained.

Further, in the case where Q shown in Formula (1) or Formula (3) to Formula (5) is a linkage group in which one or more cyano groups is introduced to a methine chain skeleton, if the dye is used for a photoelectric conversion device, FF (fill factor) of IV characteristics (current and voltage characteristics) is able to be improved, and high conversion efficiency is able to be obtained.

Next, a description will be given of a usage example of the dye for a photoelectric conversion device according to this embodiment.

Figure 2:
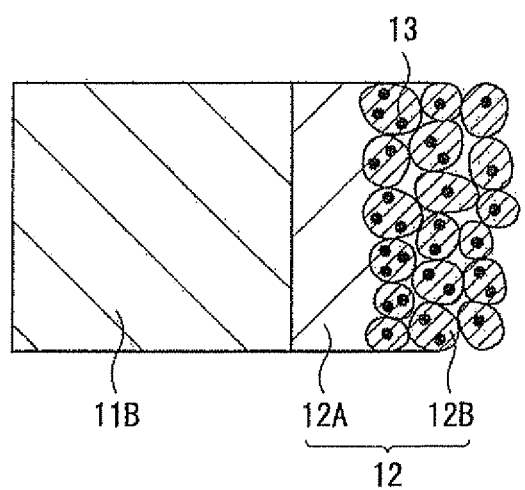
FIG. 2 is a cross sectional view illustrating an enlarged and extracted main section of the photoelectric conversion device illustrated in FIG. 1.

FIG. 1 schematically illustrates a cross sectional structure of a photoelectric conversion device. FIG. 2 illustrates an enlarged and extracted main section of the photoelectric conversion device illustrated in FIG. 1. The photoelectric conversion device illustrated in FIG. 1 and FIG. 2 is a main section of the so-called dye-sensitized solar cell. In the photoelectric conversion device, a work electrode 10 and a counter electrode 20 are oppositely arranged with an electrolyte-containing layer 30 in between. At least one of the work electrode 10 and the counter electrode 20 is an electrode having optical transparency.

The work electrode 10 has, for example, a conductive substrate 11, a metal oxide semiconductor layer 12 provided on one face thereof (face on the counter electrode 20 side), and a dye 13 supported by the metal oxide semiconductor layer 12 as a support. The work electrode 10 functions as an anode for an external circuit. For example, in the conductive substrate 11, a conductive layer 11B is provided on the surface of an insulative substrate 11A.

Examples of a material of the substrate 11A include an insulative material such as glass, plastic, and a transparent polymer film. Examples of the transparent polymer film include tetraacetyl cellulose (TAC), polyethylene terephthalate (PET), polyethylene naphthalate (PEN), syndiotactic polystyrene (SPS), polyphenylene sulfide (PPS), polycarbonate (PC), polyarylate (PAR), polysulfone (PSF), polyestersulfone (PES), polyetherimide (PEI), cyclic polyolefin, and brominated phenoxy.

Examples of the conductive layer 11B include a conductive metal oxide thin film containing indium oxide, tin oxide, indium-tin composite oxide (ITO), a compound obtained by doping tin oxide with fluorine (FTO: F—$SnO_2$) or the like; a metal thin film containing gold (Au), silver (Ag), platinum (Pt) or the like; and a compound composed of a conductive polymer or the like.

The conductive substrate 11 may be formed, for example, as a single layer structure made of a conducive material. In this case, examples of a material of the conductive substrate 11 include a conductive metal oxide such as indium oxide, tin oxide, indium-tin composite oxide, and a compound obtained by doping tin oxide with fluorine; a metal such as gold, silver, and platinum; and a conductive polymer.

The metal oxide semiconductor layer 12 is a support to support the dye 13, and has, for example, a porous structure as illustrated in FIG. 2. The metal oxide semiconductor layer 12 is formed from a dense layer 12A and a porous layer 12B. In the interface with the conductive substrate 11, the dense layer 12A is formed. The dense layer 12A is preferably dense and preferably has a small number of air gaps, and is more preferably in a state of a film. In the surface contacted with the electrolyte-containing layer 30, the porous layer 12B is formed. The porous layer 12B preferably has a structure in which the number of air gaps is large and the surface area is large. In particular, the porous layer 12B more preferably has a structure in which porous minute particles are adhered thereto. The metal oxide semiconductor layer 12 may be formed, for example, as a film-like single layer structure.

Examples of a material contained in the metal oxide semiconductor layer 12 (metal oxide semiconductor material) include titanium oxide, zinc oxide, tin oxide, niobium oxide, indium oxide, zirconium oxide, tantalum oxide, vanadium oxide, yttrium oxide, aluminum oxide, and magnesium oxide. Specially, as the metal oxide semiconductor material, zinc oxide is preferable, since thereby high conversion efficiency is able to be obtained. One of the foregoing metal oxide semiconductor materials may be used singly, or two or more thereof may be used as a composite (mixture, mixed crystal, solid dispersion or the like). For example, a combination of zinc oxide and tin oxide, a combination of titanium oxide and niobium oxide or the like may be used.

Examples of a method of forming the metal oxide semiconductor layer 12 having the porous structure include electrodeposition method and burning method. In the case where the metal oxide semiconductor layer 12 is formed by electrodeposition method, in an electrolytic bath liquid containing minute particles of the metal oxide semiconductor material, the minute particles are adhered onto the conductive layer 11B of the conductive substrate 11, and the metal oxide semiconductor material is precipitated. Further, in the case where the metal oxide semiconductor layer 12 is formed by burning method, the conductive substrate 11 is coated with a dispersion liquid (metal oxide slurry) in which the minute particles of the metal oxide semiconductor material are dispersed, and the resultant is subsequently fired. As a method of forming the metal oxide semiconductor layer 12, electrodeposition method is preferable. With electrodeposition method, high conversion efficiency is able to be obtained, and a plastic material or a polymer film material with low heat resistance is able to be used as the substrate 11A, and thus a highly flexible photoelectric conversion device is able to be fabricated.

The dye 13 is, for example, absorbed to the metal oxide semiconductor layer 12. The dye 13 includes one or more dyes capable of injecting electrons into the metal oxide semiconductor layer 12 by absorbing light and being excited. The dye 13 contains one or more compounds out of the cyanine compound shown in the foregoing Formula (1) as the dye. Since the cyanine compound shown in Formula (1) is contained, as the entire dye 13, the ratio of electron injection amount to the metal oxide semiconductor layer 12 in relation to radiated light amount is increased, and accordingly conversion efficiency is improved.

Further, the dye 13 may contain other dye in addition to the cyanine compound shown in Formula (1). As other dye, a dye having an anchor group capable of being chemically bonded with the metal oxide semiconductor layer 12 is preferable. Examples of other dye include an organic dye such as eosin Y, dibromofluorescein, fluorescein, rhodamine B, pyrogallol, dichlorofluorescein, Erhthrosine B (Erhthrosine: registered trademark), fluorescin, mercurochrome, a cyanine dye, a merocyanine disazo dye, a trisazo dye, an anthraquinone dye, a polycyclic quinone dye, an indigo dye, a diphenylmethane dye, a trimethylmethane dye, a quinoline dye, a benzophenone dye, a naphthoquinone dye, a perylene dye, a fluorenone dye, a squarylium dye, an azulenium dye, a perinone dye, a quinacridone dye, a metal-free phthalocyanine dye, and a metal-free porphyrin dye or the like.

Further, examples of other dye include an organic metal complex compound. Examples thereof include an organic metal complex compound having both ionic coordinate bond formed from a nitrogen anion in an aromatic heterocycle and a metal cation and nonionic coordinate bond formed between a nitrogen atom/a chalcogen atom and a metal cation; and an organic metal complex compound having both ionic coordinate bond formed from an oxygen anion/a sulfur anion and a metal cation and nonionic coordinate bond formed between a nitrogen atom/a chalcogen atom and a metal cation. Specific examples thereof include a metal phthalocyanine dye such as copper phthalocyanine and titanyl phthalocyanine; a metal naphthalocyanine dye; a metal porphyrin dye; and a ruthenium complex such as a bipyridyl ruthenium complex, a terpyridyl ruthenium complex, a phenanthrolyl ruthenium complex, a bicinchoninic acid ruthenium complex, an azo ruthenium complex, and a quinolinol ruthenium complex.

Further, the dye 13 may contain one or more additives in addition to the foregoing dye. Examples of the additive include an aggregation inhibitor for inhibiting aggregation of the dye in the dye 13. Specific examples thereof include a cholate compound expressed by Formula (297). Such an additive may be used singly, or a plurality thereof may be used by mixture.

[Chemical formula 36]

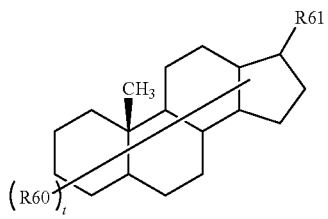

(297)

(R60 represents a group bonded with one of carbon atoms structuring the steroid skeleton in the formula, and is a hydrogen group, a halogen group, an alkyl group, an alkoxy group, an aryl group, a hetero ring group, an acyl group, an acyloxy group, an oxycarbonyl group, an oxo group, an acid group, or a derivative thereof, which may be identical with or different from each other. R61 is an alkyl group having an acid group. t is an integer number out of 1 to 5. Bond between each carbon atom structuring the steroid skeleton in the formula may be single bond or double bond.)

In the counter electrode 20, for example, a conductive layer 22 is provided on a conducive substrate 21. The counter electrode 20 functions as a cathode for an external circuit. Examples of a material of the conducive substrate 21 include a material similar to that of the conductive substrate 11 of the work electrode 10. The conductive layer 22 contains one or more conductive materials and a binder according to needs. Examples of a conductive material used for the conductive layer 22 include a metal such as platinum, gold, silver, copper (Cu), rhodium (Rh), ruthenium (Ru), aluminum (Al), magnesium (Mg), and indium (In); carbon (C); and a conductive polymer. Further, examples of a binder used for the conductive layer 22 include an acryl resin, a polyester resin, a phenol resin, an epoxy resin, a cellulose, a melamine resin, fluoroelastomer, and a polyimide resin. The counter electrode 20 may have, for example, a single layer structure of the conductive layer 22.

The electrolyte-containing layer 30 contains, for example, a redox electrolyte having a redox pair. Examples of the redox electrolyte include an $I^-/I_3^-$ electrolyte, a $Br^-/Br_3^-$ electrolyte, and a quinone/hydroquinone electrolyte. Specific examples thereof include a combination of a halide salt and a halogen molecule such as a combination of an iodide salt and an iodine molecule and a combination of a bromide salt and bromine. Examples of the halide salt include cesium halide, halide quaternary alkyl ammonium, imidazolium halide, thiazolium halide, oxazolium halide, quinolinium halide, and pyridinium halide. Specific examples of iodide salt include cesium iodide; tetraethyl ammonium iodide, tetrapropyl ammonium iodide, tetrabutyl ammonium iodide, tetrapentyl ammonium iodide, tetrahexyl ammonium iodide, tetraheptyl ammonium iodide, and trimethyl phenyl ammonium iodide as quaternary alkyl ammonium iodide; 3-methylimidazolium iodide or 1-propyl-2,3-dimethylimidazolium iodide as imidazolium iodide; 3-ethyl-2-methyl-2-thiazolium iodide, 3-ethyl-5-(2-hydroxyethyl)-4-methylthiazolium iodide, or 3-ethyl-2-methylbenzothiazolium iodide as thiazolium iodide; 3-ethyl-2-methylbenzooxazolium iodide as oxazolium iodide; 1-ethyl-2-methylquinolinium iodide as quinolinium iodide; and pyridinium iodide. Further, examples of a bromide salt include quaternary alkyl ammonium bromide. Of the combinations of a halide salt and a halogen molecule, a combination of at least one of the foregoing iodide salts and iodine molecule is preferable.

Further, as the redox electrolyte, for example, a combination of an ionic liquid and a halogen molecule may be used. In this case, the foregoing halide salt or the like may be contained. Examples of the ionic liquid include a substance usable for a battery, a solar cell or the like. Examples thereof include substances disclosed in "Inorg. Chem.," 1996, 35, pp. 1168-1178; "Electrochemistry," 2002, 2, pp. 130-136; Japanese Unexamined Patent Application Publication No. 9-507334; Japanese Unexamined Patent Application Publication No. 8-259543 and the like. Specially, as the ionic liquid, a salt having a lower melting point than room temperature (25 deg C.), or a salt that has a higher melting point than room temperature but goes into a liquid state at room temperature by being dissolved with other molten salt is preferable. Specific examples of the ionic liquid include an anion, a cation or the like described below.

Examples of ionic liquid cation include ammonium, imidazolium, oxazolium, thiazolium, oxadiazolium, triazolium, pyrrolidinium, pyridinium, piperidinium, pyrazolium, pyrimidinium, pyrazinium, triazinium, phosphonium, sulfonium, carbazolium, indolium, and a derivative thereof. Such an ionic liquid cation may be used singly, or a plurality thereof may be used by mixture. Specific examples thereof include 1-methyl-3-propylimidazolium, 1-butyl-3-methylimidazolium, 1,2-dimethyl-3-propylimidazolium, and 1-ethyl-3-methylimidazolium.

Examples of ionic liquid anion include a metal chloride such as $AlCl_4^-$ and $Al_2Cl_7^-$; a fluorine-containing ion such as $PF_6^-$, $BF_4^-$, $CF_3SO_3^-$, $N(CF_3SO_2)_2^-$, $F(HF)_n^-$, and $CF_3COO^-$; a non-fluorine compound ion such as $NO_3^-$, $CH_3COO^-$, $C_6H_{11}COO^-$, $CH_3OSO_3^-$, $CH_3OSO_2^-$, $CH_3SO_3^-$, $CH_3SO_2^-$, $(CH_3O)_2PO_2^-$, $N(CN)_2^-$, and $SCN^-$; and a halide ion such as iodide ion and bromide ion. Such an ionic liquid anion may be used singly, or a plurality thereof may be used by mixture. Specially, as the ionic liquid anion, an iodide ion is preferable.

For the electrolyte-containing layer 30, a liquid electrolyte (electrolytic solution) in which the foregoing redox electrolyte is dissolved in a solvent may be used, or a solid polymer electrolyte in which an electrolytic solution is held in a polymer material may be used. Further, a solidified (paste-like) electrolyte obtained by mixing an electrolytic solution and a particulate carbon material such as carbon black may be used. In the solidified electrolyte containing a carbon material, the carbon material has a function to catalyze redox reaction, and thus a halogen molecule is not necessarily contained in the electrolyte. Such a redox electrolyte may contain one or more organic solvents that dissolve the foregoing halide salt, the ionic liquid and the like. Examples of the organic solvent include an electrochemically inactive organic solvent. Examples thereof include acetonitrile, propionitrile, butyronitrile, methoxyacetonitrile, 3-methoxypropionitrile, veleronitrile, dimethylcarbonate, ethylmethylcarbonate, ethylenecarbonate, propylenecarbonate, N-methylpyrrolidone, pentanol, quinoline, N,N-dimethylformamide, γ-butyrolactone, dimethylsulfoxide, and 1,4-dioxane.

In the photoelectric conversion device, in the case where light (sun light, or ultraviolet light, visible light, or near-infrared light equal to sun light) illuminates the dye 13 supported by the work electrode 10, the dye 13 that absorbs the light and is excited injects electrons into the metal oxide semiconductor layer 12. The electrons are moved to the adjacent conductive layer 11B, subsequently pass through an external circuit, and reach the counter electrode 20. Meanwhile, in the electrolyte-containing layer 30, the electrolyte is oxidized so that the dye 13 oxidized associated with movement of the electrons is returned to the ground state (reduced).

The oxidized electrolyte receives the foregoing electrons, and thereby reduction is made. As described above, movement of the electrons between the work electrode 10 and the counter electrode 20 and redox reaction in the electrolyte-containing layer 30 associated therewith are repeated. Thereby, continuous movement of electrons is generated, and continual photoelectric conversion is made.

The photoelectric conversion device is able to be manufactured, for example, as follows.

First, the work electrode 10 is formed. First, the metal oxide semiconductor layer 12 having a porous structure is formed on the face where the conductive layer 11B is formed out of the conducive substrate 11 by electrodeposition method or burning method. In the case where the metal oxide semiconductor layer 12 is formed by electrodeposition method, for example, temperature of an electrolytic bath liquid containing a metal salt to become the metal oxide semiconductor material is set to given temperature while bubbling with oxygen and air is made, the conductive substrate 11 is soaked in the electrolytic bath liquid, and a constant voltage is applied between the conductive substrate 11 and the counter electrode. Thereby, the metal oxide semiconductor material is precipitated to have the porous structure on the conductive layer 11B. At this time, the counter electrode may be moved as appropriate in the electrolytic bath liquid. Further, in the case where the metal oxide semiconductor layer 12 is formed by burning method, for example, the conductive substrate 11 is coated with a metal oxide slurry prepared by dispersing powder of the metal oxide semiconductor material in a dispersion medium, and the resultant is subsequently dried and fired to have a porous structure. Subsequently, a dye solution in which the dye 13 containing the cyanine compound shown in the foregoing Formula (1) is dissolved in an organic solvent is prepared. The conductive substrate 11 on which the metal oxide semiconductor layer 12 is formed is soaked into the dye solution, and thereby the dye 13 is supported by the metal oxide semiconductor layer 12.

Next, the conductive layer 22 is formed on a single face of the conductive substrate 21, and thereby the counter electrode 20 is formed. The conductive layer 22 is formed by, for example, sputtering the conductive material.

Finally, the face where the dye 13 is supported out of the work electrode 10 and the face where the conductive layer 22 is formed out of the counter electrode 20 are bonded with a spacer (not illustrated) such as a sealing agent in between so that the foregoing faces are spaced with a given distance in between and are opposed to each other, and the entire body is sealed except for, for example, an injection inlet of the electrolyte. Subsequently, after the electrolyte is injected between the work electrode 10 and the counter electrode 20, the injection inlet is sealed, and thereby the electrolyte-containing layer 30 is formed. Thereby, the photoelectric conversion device illustrated in FIG. 1 and FIG. 2 is completed.

In the photoelectric conversion device, since the dye 13 contains the cyanine compound shown in Formula (1), the ratio of electron injection amount from the dye 13 to the metal oxide semiconductor layer 12 in relation to the radiated light amount is higher than that in a case of using a cyanine compound not having the structure shown in Formula (1), and accordingly conversion efficiency is able to be improved. In this case, specifically, in the case where the metal oxide semiconductor layer 12 contains zinc oxide, conversion efficiency is able to be more improved compared to a case that the metal oxide semiconductor layer 12 does not contain zinc oxide (contains titanium oxide or tin oxide instead of zinc oxide).

Other action and effect of the photoelectric conversion device are similar to action and effect of the foregoing dye for a photoelectric conversion device.

In the foregoing photoelectric conversion device, the description has been given of the case that the redox electrolyte is contained as the electrolyte-containing layer 30. However, as the electrolyte-containing layer 30, a solid electric charge transfer layer may be provided as a solid electrolyte instead of the redox electrolyte. In this case, the solid electric charge transfer layer has a material in which, for example, carrier transfer in the solid is related to electric conduction. As the material, an electron transport material, a hole transport material and the like are preferable.

As the hole transport material, aromatic amine, a triphenylene derivative and the like are preferable. Examples thereof include an organic conductive polymer such as an oligothiophene compound, polypyrrole, polyacetylene or a derivative thereof; poly(p-phenylene) or a derivative thereof; poly(p-phenylenevinylene) or a derivative thereof; polythenylene vinylene or a derivative thereof; polythiophene or a derivative thereof; polyaniline or a derivative thereof; and polytoluidine or a derivative thereof.

Further, as the hole transport material, for example, a p-type inorganic compound semiconductor may be used. In the p-type inorganic compound semiconductor, the bandgap is preferably 2 eV or more, and is more preferably 2.5 eV or more. Further, since the ionization potential of the p-type inorganic compound semiconductor is able to reduce electron holes of a dye, the ionization potential of the p-type inorganic compound semiconductor should be smaller than ionization potential of the work electrode 10. A preferable range of the ionization potential of the p-type inorganic compound semiconductor varies according to the dye to be used, but in general, the ionization potential of the p-type inorganic compound semiconductor is preferably from 4.5 eV to 5.5 eV both inclusive, and more preferably from 4.7 eV to 5.3 eV both inclusive.

Examples of the p-type inorganic compound semiconductor include a compound semiconductor containing monovalent copper. Examples of the compound semiconductor containing monovalent copper include CuI, CuSCN, CuInSe$_2$, Cu(In, Ga)Se$_2$, CuGaS$_2$, Cu$_2$O, CuS, CuGaS$_2$, CuInS$_2$, and CuAlSe$_2$. In addition, other examples of the p-type inorganic compound semiconductor include GaP, NiO, CoO, FeO, Bi$_2$O$_3$, MoO$_2$, and Cr$_2$O$_3$.

Examples of a method of forming the solid electric charge transfer layer include a method of forming the solid electric charge transfer layer directly on the work electrode 10. After that, the counter electrode 20 may be formed.

The hole transport material containing an organic conductive polymer is able to be introduced into the electrode by a method such as vacuum evaporation method, cast method, coating method, spin coating method, dipping method, electrolytic polymerization method, and photoelectrolytic polymerization method. An inorganic solid compound is also able to be introduced into the electrode by a method such as cast method, coating method, spin coating method, dipping method, and electrolytic plating method. It is preferable that part of the solid electric charge transfer layer formed as above (in particular, the solid electric charge transfer layer having the hole transport material) partly penetrates into a gap of the porous structure of the metal oxide semiconductor layer 12 and is directly contacted therewith.

In the photoelectric conversion device in which the solid electric charge transfer layer is provided as the electrolyte-containing layer 30, conversion efficiency is able to be improved as in the case of using the redox electrolyte.

EXAMPLES

A description will be given in detail of specific examples of the present invention.

Example 1-1

As a specific example of the dye explained in the foregoing embodiment, according to the procedures shown in the foregoing Chemical reaction formula (1), the foregoing Chemical reaction formula (III), and the foregoing Chemical reaction formula (IV), a compound composed of the structure section shown in Formula (8) and an iodide ion that is the compound shown in Formula (4) was synthesized as the cyanine compound shown in Formula (1).

First, as shown in Chemical reaction formula (I-1), the compound expressed by Formula (284-1) as the compound shown in Formula (284) and the compound expressed by Formula (285-1) as the compound shown in Formula (285) were mixed and reacted. Thereby, the quaternary ammonium salt expressed by Formula (286-1) as the quaternary ammonium salt shown in Formula (286) was obtained. Further, as shown in Chemical reaction formula (I-2), the compound expressed by Formula (298-1) and the compound expressed by Formula (285-2) as the compound shown in Formula (285) were mixed and reacted. Thereby, the quaternary ammonium salt expressed by Formula (291-1) as the quaternary ammonium salt shown in Formula (291) was obtained.

[Chemical formula 37]

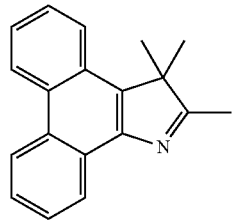
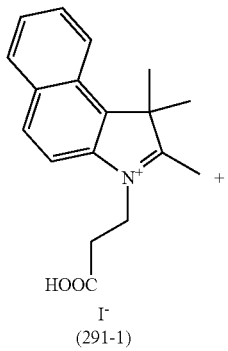

Next, as shown in Chemical reaction formula (III-1), 5 mmol of the quaternary ammonium salt shown in Formula (291-1), 5 mmol of the bridge agent expressed by Formula (289-5), and 10 g of dimethyl formamide (DMF) were mixed. After that, the mixed solution was stirred for 2 hours at 110 deg C. Subsequently, 10 g of chloroform and 10 g of water were added to the mixed solution after being stirred. Thereby, solid was precipitated and filtrated. After that, the solid was dried under reduced pressure, and thereby the cyanine intermediate expressed by Formula (290-1) was obtained.

[Chemical formula 39]

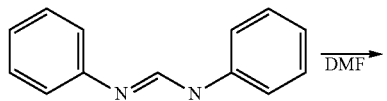
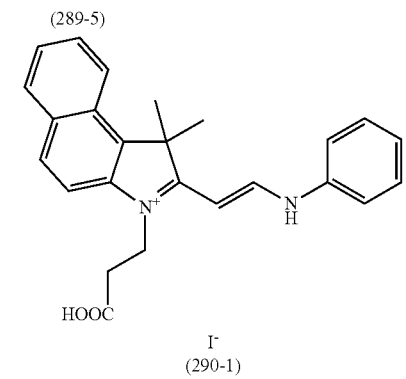

[Chemical formula 38]

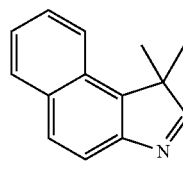
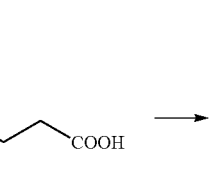

Next, as shown in Chemical reaction formula (IV-1), 5 mmol of the cyanine intermediate expressed by Formula (290-1), 5 mmol of the quaternary ammonium salt shown in Formula (286-1), 20 mmol of acetic anhydride ($CH_3CO)_2O$), 10 mmol of trimethylamine as a base, and 10 g of acetonitrile (CH₃CN) were mixed. After that, the mixture was heated to reflux for 4 hours to be reacted. Finally, 10 g of chloroform and 10 g of water were added to the reactant. After that, the precipitated solid was filtrated. After that, the solid was dried under reduced pressure, and thereby a final product (the compound expressed by Formula (8-1)) was obtained at yield of 5.1%.

[Chemical formula 40]

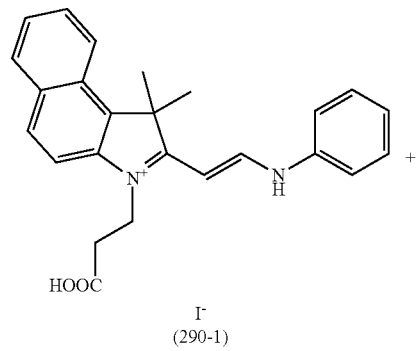

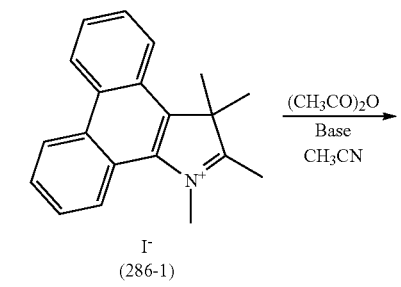

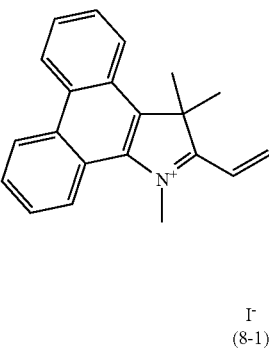

Example 1-2

A compound composed of the structure section shown in Formula (9) and iodide ion was synthesized. At this time, first, in the same procedure as that shown in Chemical reaction formula (I-1) of Example 1-1, the quaternary ammonium salt shown in Formula (286-1) was prepared. Meanwhile, the quaternary ammonium salt expressed by Formula (291-2) was obtained in the same procedure as that shown in Chemical reaction formula (I-2) of Example 1-1, except that the compound shown in Formula (298-2) was used instead of the compound shown in Formula (298-1) as shown in Chemical reaction formula (I-3).

[Chemical formula 41]

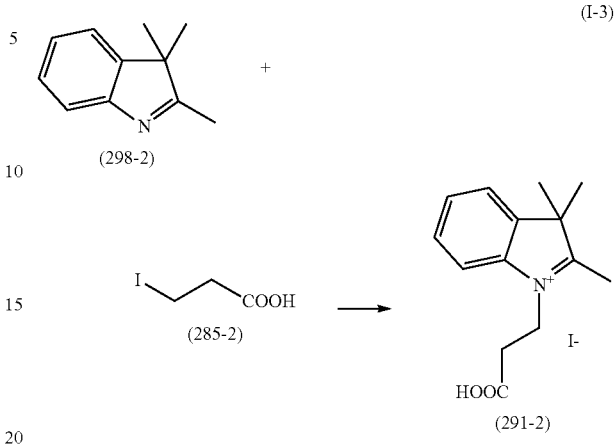

Next, the cyanine intermediate expressed by Formula (290-2) was obtained in the same procedure as that shown in Chemical reaction formula (III-1) of Example 1-1, except that the quaternary ammonium salt expressed by Formula (291-2) was used instead of the quaternary ammonium salt shown in Formula (291-1), and the bridge agent expressed by Formula (289-6) was used instead of the bridge agent shown in Formula (289-5) as shown in Chemical reaction formula (III-2).

[Chemical formula 42]

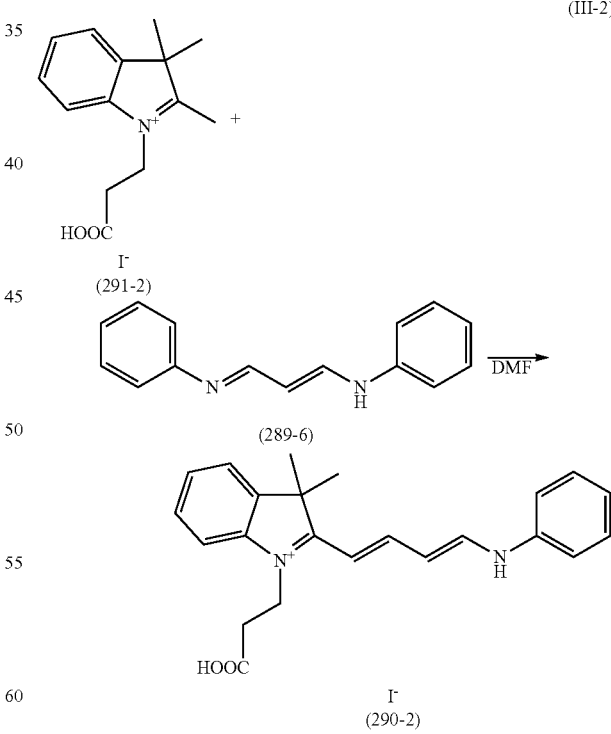

Finally, a final product (compound expressed by Formula (9-1)) was obtained in the same procedure as that shown in Chemical reaction formula (IV-1) of Example 1-1, except that the cyanine intermediate shown in Formula (290-2) was used instead of the cyanine intermediate shown in Formula (290-1) as shown in Chemical reaction formula (IV-2). The yield of the final product was 8.6%.

[Chemical formula 43]

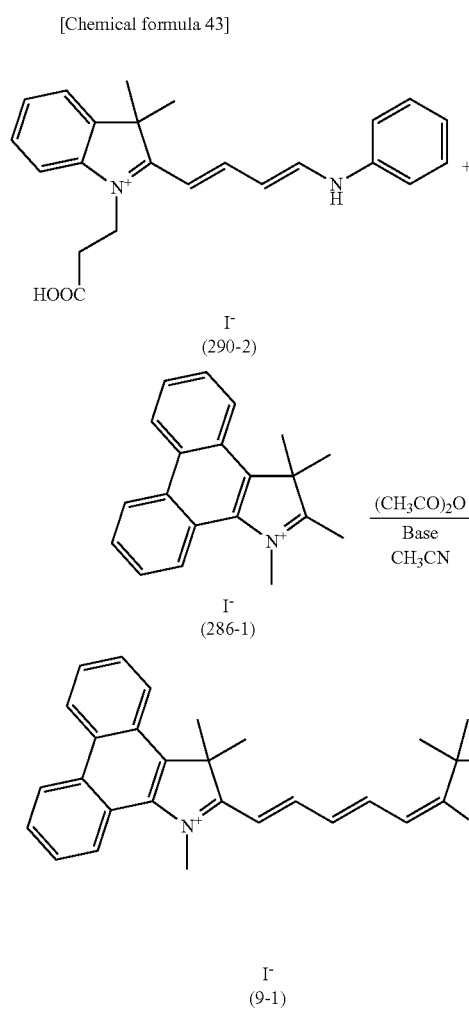

[Chemical formula 44]

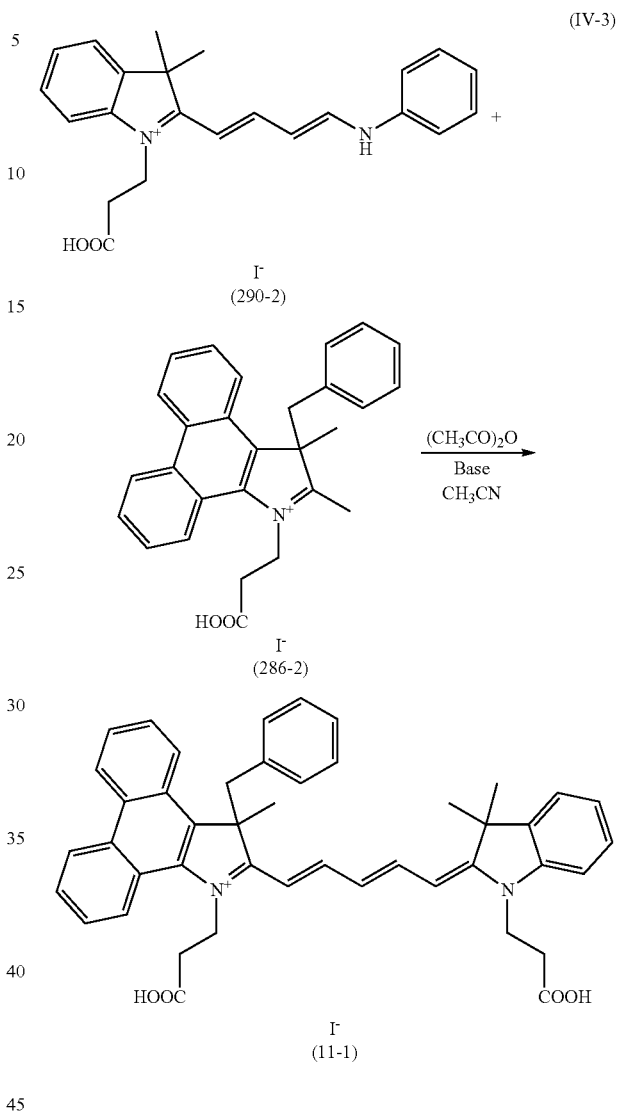

Example 1-3

A compound composed of the structure section shown in Formula (11) and iodide ion was synthesized. At this time, first, the quaternary ammonium salt shown in Formula (286-2) was prepared, and the cyanine intermediate shown in Formula (290-2) was prepared in the same procedure as that shown in Chemical reaction formula (I-3) and Chemical reaction formula (III-2) of Example 1-2, as shown in Chemical reaction formula (IV-3). Subsequently, a final product (compound expressed by Formula (11-1)) was obtained in the same procedure as that shown in Chemical reaction formula (IV-2) of Example 1-2, except that the quaternary ammonium salt expressed by Formula (286-2) was used instead of the quaternary ammonium salt shown in Formula (286-1). The yield of the final product was 16%.

Example 1-4

A compound composed of the structure section shown in Formula (13) and iodide ion was synthesized. At this time, first, the quaternary ammonium salt expressed by Formula (286-3) was prepared, and the cyanine intermediate shown in Formula (290-2) was prepared in the same procedure as that shown in Chemical reaction formula (I-3) and Chemical reaction formula (III-2) of Example 1-2, as shown in Chemical reaction formula (IV-4). Subsequently, a final product (compound expressed by Formula (13-1)) was obtained in the same procedure as that shown in Chemical reaction formula (IV-2) of Example 1-2, except that the quaternary ammonium salt shown in Formula (286-3) was used instead of the quaternary ammonium salt shown in Formula (286-1). The yield of the final product was 4.5%.

[Chemical formula 45]

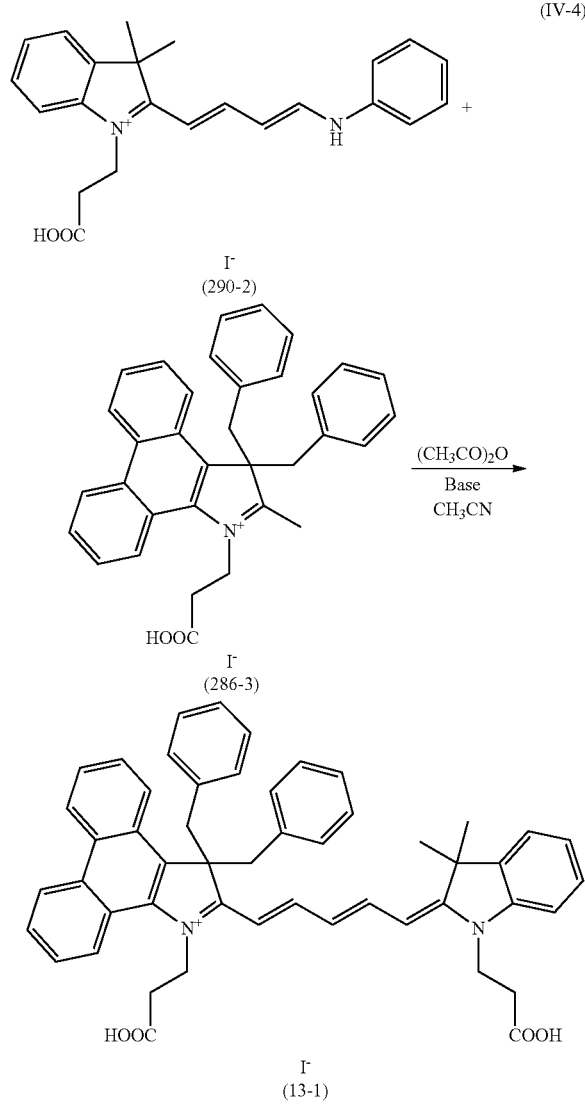

Example 1-5

A compound composed of the structure section shown in Formula (14) and iodide ion was synthesized according to the procedure shown in Chemical reaction formula (1) and Chemical reaction formula (V) described above. At this time, first, the quaternary ammonium salt shown in Formula (286-2) was prepared. After that, as shown in Chemical reaction formula (V-1), 10 mmol of the quaternary ammonium salt shown in Formula (286-2), 5 mmol of the bridge agent shown in Formula (289-6), 20 mmol of acetic anhydride, 10 mmol of trimethylamine as a base, and 10 g of acetonitrile ($CH_3CN$) were mixed. The mixture was heated to reflux for 4 hours to be reacted. Finally, 10 g of chloroform and 10 g of water were added to the reactant. After that, the precipitated solid was filtered. After that, the solid was dried under reduced pressure, and thereby a final product (the compound expressed by Formula (14-1)) was obtained at yield of 4.2%.

[Chemical formula 46]

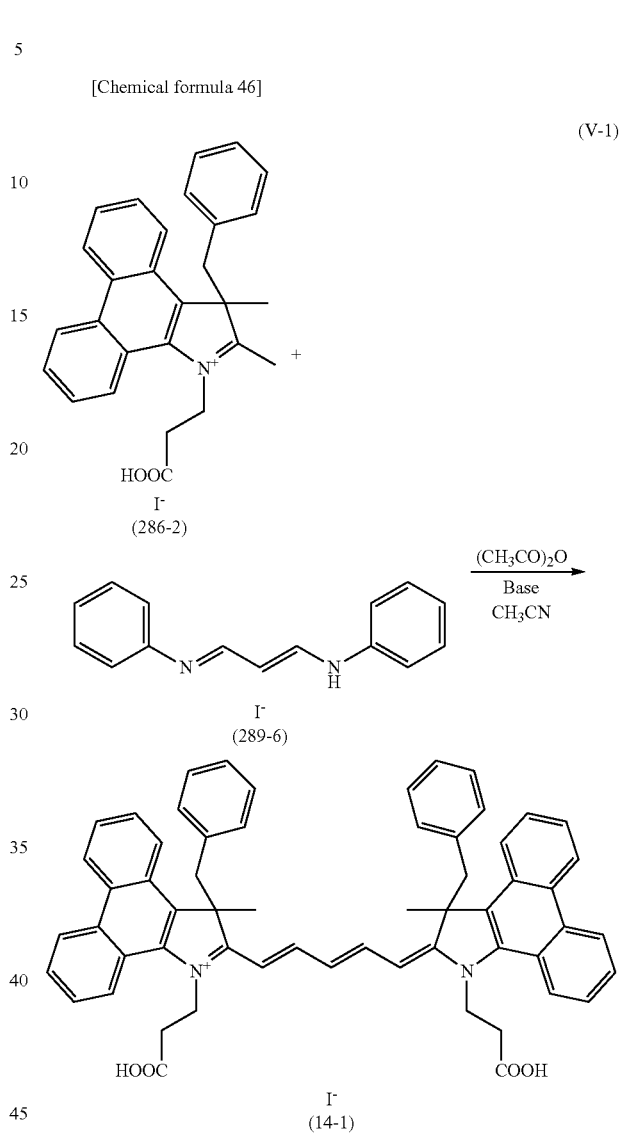

Example 1-6

A compound composed of the structure section shown in Formula (15) and iodide ion was synthesized. At this time, first, the quaternary ammonium salt shown in Formula (286-2) was prepared, and the quaternary ammonium salt shown in Formula (291-1) was prepared in the same procedure as that shown in Chemical reaction formula (I-2) of Example 1-1, as shown in Chemical reaction formula (III-3). Subsequently, the cyanine intermediate expressed by Formula (290-3) was obtained in the same procedure as that shown in Chemical reaction formula (III-1) of Example 1-1, except that the bridge agent shown in Formula (289-7) was used instead of the bridge agent shown in Formula (289-5).

[Chemical formula 47]

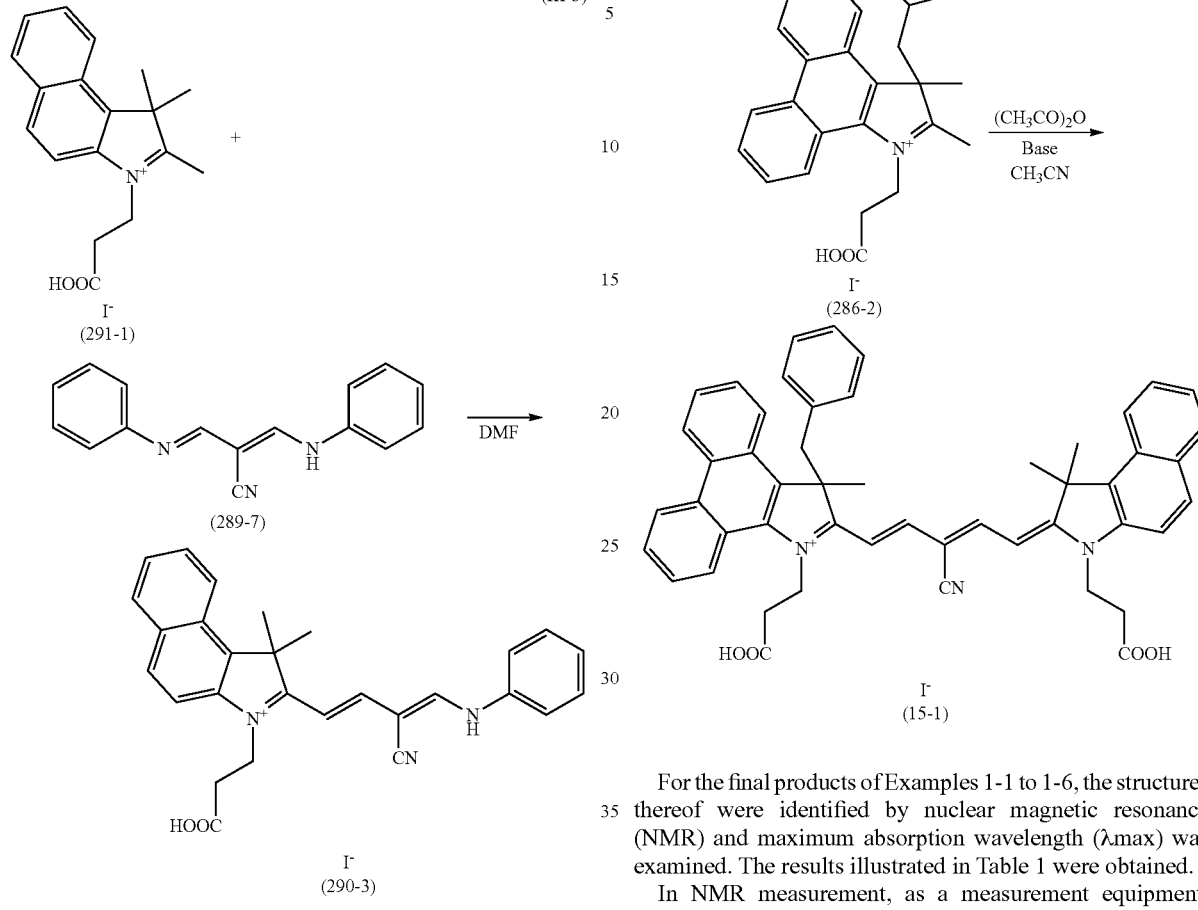

Finally, a final product (compound expressed by Formula (15-1)) was obtained in the same procedure as that shown in Chemical reaction formula (IV-3) of Example 1-3, except that the cyanine intermediate shown in Formula (290-3) was used instead of the cyanine intermediate shown in Formula (290-2) as shown in Chemical reaction formula (IV-5). The yield of the final product was 7.4%.

[Chemical formula 48]

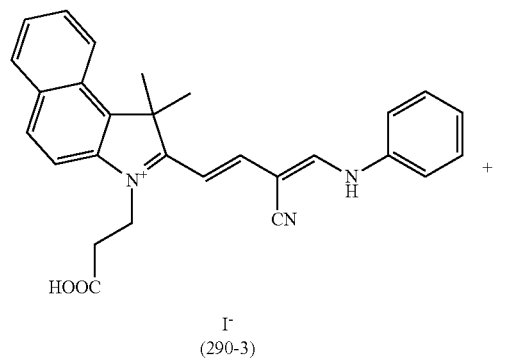

For the final products of Examples 1-1 to 1-6, the structures thereof were identified by nuclear magnetic resonance (NMR) and maximum absorption wavelength (λmax) was examined. The results illustrated in Table 1 were obtained.

In NMR measurement, as a measurement equipment, Lambda-400 made by JEOL Co. was used. In this case, in Examples 1-1 to 1-4 and Example 1-6, a solution in which 3 to 10 mg of the final product was dissolved per 1 cm³ of deuterated dimethyl sulfoxide (DMSO-d6) as a heavy solvent was used as a measurement sample, and ¹H-NMR spectrum was measured at room temperature. Further, in Example 1-5, measurement was made in the same manner as that of Example 1-1 and the like, except that deuterated chloroform (CDCl₃) was used instead of DMSO-d6 as a heavy solvent.

In examining the maximum absorption wavelength (λmax), UV spectrum measurement device (U-3010) made by Hitachi, Ltd. was used. In this case, the final product was prepared so that the absorbance became from 0.5 to 1.0 both inclusive in methanol (CH₃OH: solvent), and was used for measurement.

TABLE 1

| | ¹H-NMR spectrum | λmax (nm) | Dye (yield) |
|---|---|---|---|
| Example 1-1 | 9.05 (d, 1H), 8.99 (d, 1H), 8.74 (d, 1H), 8.61 (t, 1H), 8.38 (d, 1H), 8.26 (d, 1H), 8.08 (t, 2H), 7.85-7.66 (m, 6H), 7.52 (t, 1H), 6.69 (d, 1H), 6.62 (d, 1H), 4.47 (t, 2H), 4.26 (s, 3H), 2.82 (t, 2H), 2.03 (s, 6H), 2.01 (s, 6H) | 601 | Formula (8-1) (5.1%) |
| Example 1-2 | 9.02 (d, 1H), 8.96 (d, 1H), 8.69 (d, 1H), 8.46 (t, 1H), 8.35-8.29 (m, 2H), 7.82-7.76 (m, 3H), 7.69 (t, 1H), 7.59 (d, 1H), 7.37 | 673 | Formula (9-1) (8.6%) |

TABLE 1-continued

| | ¹H-NMR spectrum | λmax (nm) | Dye (yield) |
|---|---|---|---|
| | (d, 2H), 7.23-7.19 (m, 1H), 6.62 (t, 1H), 6.47 (d, 1H), 6.33 (d, 1H), 4.29 (t, 2H), 4.17 (s, 3H), 2.62 (t, 2H), 1.98 (s, 6H), 1.68 (s, 6H) | | |
| Example 1-3 | 8.97 (t, 2H), 8.65-8.36 (m, 4H), 7.85 (t, 1H), 7.73-7.57 (m, 5H), 7.42-7.37 (m, 2H), 7.22 (t, 1H), 6.87-6.73 (m, 3H), 6.53-6.37 (m, 4H), 4.42-4.27 (m, 4H), 4.05 (d, 1H), 3.79 (d, 1H), 2.44-2.35 (m, 4H), 2.13 (s, 3H), 1.70 (s, 6H) | 683 | Formula (11-1) (16%) |
| Example 1-4 | 8.95 (d, 2H), 8.86 (d, 2H), 8.49 (t, 1H), 8.21 (d, 1H), 7.94 (t, 1H), 7.75 (t, 1H), 7.69(t, 1H), 7.61 (d, 1H), 7.55 (d, 1H), 7.46-7.38 (m, 2H), 7.25 (t, 1H), 6.88-6.75 (m, 7H), 7.61 (d, 6H), 4.82 (t, 4H), 4.04-3.97 (m, 4H), 2.27 (t, 2H), 1.97 (t, 2H), 1.78 (s, 6H) | 689 | Formula (13-1) (4.5%) |
| Example 1-5 | 8.67-8.52 (m, 4H), 8.29-8.13 (m, 5H), 7.69-7.08 (m, 8H), 6.84 (d, 2H), 6.59-6.33 (m, 12H), 4.45 (d, 4H), 4.07-3.89 (m, 4H), 2.20 (d, 4H), 1.27 (s, 6H) | 722 | Formula (14-1) (4.2%) |
| Example 1-6 | 9.01 (t, 2H), 8.91 (d, 1H), 8.75 (d, 1H), 8.62 (d, 1H), 8.42 (d, 1H), 8.28 (d, 1H), 8.08 (t, 2H), 7.89 (t, 2H), 7.80-7.67 (m, 4H), 7.55 (t, 1H), 6.87-6.77 (m, 3H), 6.51-6.36 (m, 4H), 4.53-4.37 (m, 4H), 4.11 (d, 1H), 3.89 (d, 1H), 2.66-2.54 (m, 2H), 2.34-2.24 (m, 2H), 2.18 (s, 3H), 1.97 (s, 6H) | 672 | Formula (15-1) (7.4%) |

As illustrated in Table 1, it was confirmed that in Examples 1-1 to 1-6, the compounds respectively shown in Formula (8-1), Formula (9-1), Formula (11-1), and Formula (13-1) to Formula (15-1) were synthesized.

Example 2-1

As a specific example of the photoelectric conversion device explained in the foregoing embodiment, a dye-sensitized solar cell was fabricated in the following procedure by using the compound shown in Formula (8-1) synthesized in Example 1-1.

First, the work electrode 10 was formed. First, the conductive substrate 11 composed of a conductive glass substrate (F—$SnO_2$) being 2.0 cm long, 1.5 cm wide, and 1.1 mm thick was prepared. Subsequently, a masking tape having a thickness of 70 μm was adhered to the conductive substrate 11 so that a rectangle being 0.5 cm long and 0.5 cm wide was surrounded by the masking tape. The rectangle section was coated with 3 $cm^3$ of a metal oxide slurry with a uniform thickness, and the resultant was dried. In this case, as the metal oxide slurry, a substance prepared by suspending zinc oxide powder (surface area: 60 $m^2$/g, average primary particle diameter: 50 nm or less, FINEX-30 made by Sakai Chemical Industry Co., Ltd.) to become 10 wt % in water added with 1 drop of Triton X-100 (Triton: registered trademark) as a non-ionic interfacial active agent was used. Subsequently, the masking tape on the conductive substrate 11 was exfoliated, the substrate was fired at 450 deg C. in an electric furnace, and thereby the metal oxide semiconductor layer 12 having a thickness of about 5 μm was formed. Subsequently, the compound shown in Formula (8-1) as the cyanine compound shown in Formula (1) and deoxycholic acid were dissolved in dehydrated ethanol so that respective concentrations became $3*10^{-4}$ mol/$dm^3$ and $1*10^{-2}$ mol/$dm^3$ to prepare a dye solution. Subsequently, the conductive substrate 11 on which the metal oxide semiconductor layer 12 was formed was soaked in the foregoing dye solution, and the dye 13 was supported.

Next, the conductive layer 22 having a thickness of 100 nm made of platinum was formed on a single face of the conductive substrate 21 composed of a conductive glass substrate (F—$SnO_2$) being 2.0 cm long, 1.5 cm wide, and 1.1 mm thick by sputtering, and thereby the counter electrode 20 was formed. In this case, two holes (Φ1 mm) for injecting an electrolytic solution were previously bored in the conductive substrate 21.

Next, the electrolytic solution was prepared. The electrolytic solution was prepared so that respective concentrations of dimethylhexylimidazolium iodide, lithium iodide, and iodine were 0.6 mol/$dm^3$, 0.1 mol/$dm^3$, and 0.05 mol/$dm^3$ in acetonitrile.

Next, a spacer having a thickness of 50 μm was arranged so that the metal oxide semiconductor layer 12 was surrounded by the spacer. After that, the face where the dye 13 was supported out of the work electrode 10 and the face where the conductive layer 22 was formed out of the counter electrode 20 were opposed to each other and was bonded with each other with the spacer in between. After that, the prepared electrolytic solution was injected through the injection inlet previously bored in the counter electrode 20, and thereby the electrolyte-containing layer 30 was formed. Finally, the entire body was sealed, and thereby the dye-sensitized solar cell was obtained.

Examples 2-2 to 2-8

A procedure similar to that of Example 2-1 was taken, except that the compound shown in Formula (9-1) synthesized in Example 1-2 was used (Example 2-2), the compound expressed by Formula (10-1) was used (Example 2-3), the compound shown in Formula (11-1) synthesized in Example 1-3 was used (Example 2-4), the compound expressed by Formula (12-1) was used (Example 2-5), the compound shown in Formula (13-1) synthesized in Example 1-4 was used (Example 2-6), the compound shown in Formula (14-1) synthesized in Example 1-5 was used (Example 2-7), or the compound shown in Formula (15-1) synthesized in Example 1-6 was used (Example 2-8) as a dye instead of the compound shown in Formula (8-1). Though specific synthesis procedures, physicality data of the final composite and the like are not shown as the examples, the compound shown in Formula (10-1) and the compound shown in Formula (12-1) are able to be synthesized in the same manner as that of the foregoing Example 1-1 and the like.

[Chemical formula 49]

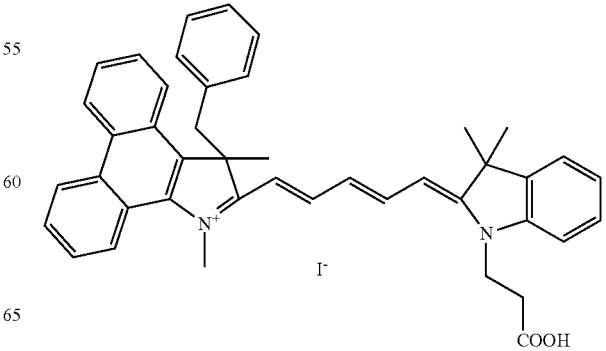

(10-1)

(12-1)

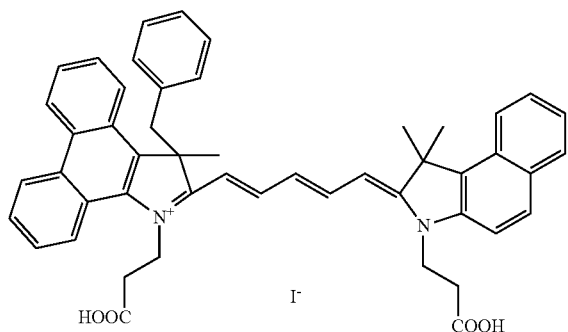

(302)

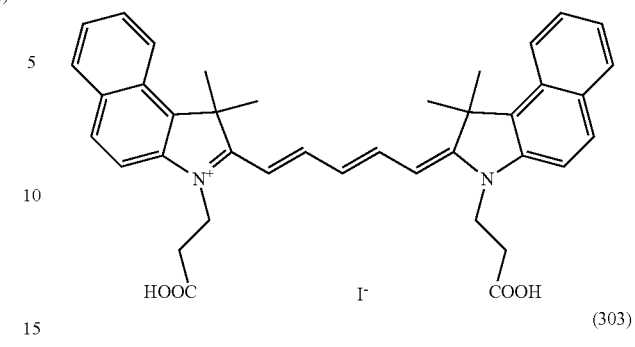

Examples 2-9 to 2-15

As comparative examples to Examples 2-1 to 2-8, a procedure similar to that of Example 2-1 was taken, except that the compounds (dye) shown in the following Formulas (299) to Formula (305) were used instead of the compound shown in Formula (8-1) as a dye.

[Chemical formula 50]

(299)
(300)
(301)

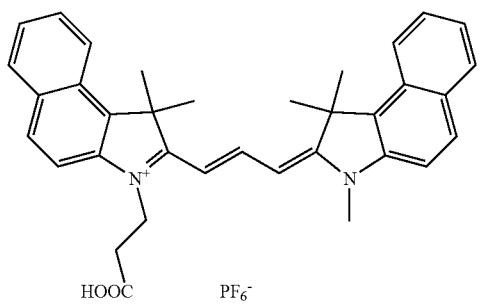

(303)
(304)
(305)

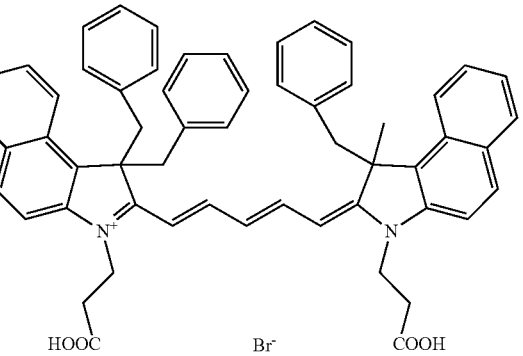

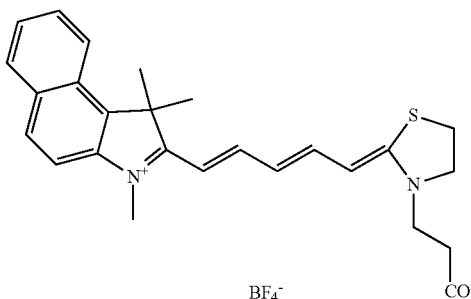

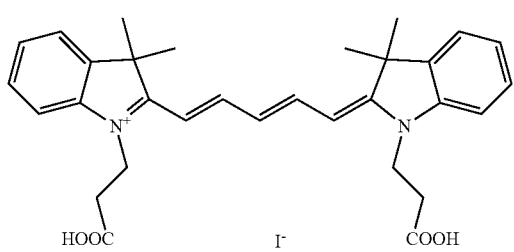

For the dye-sensitized solar cells of Examples 2-1 to 2-15, conversion efficiency was examined, and the results illustrated in Table 2 were obtained. Further, as a representative of these examples, IPCE of the dye-sensitized solar cells of Example 2-7 and Example 2-13 were examined. The results illustrated in Table 3 were obtained.

Figure 3:
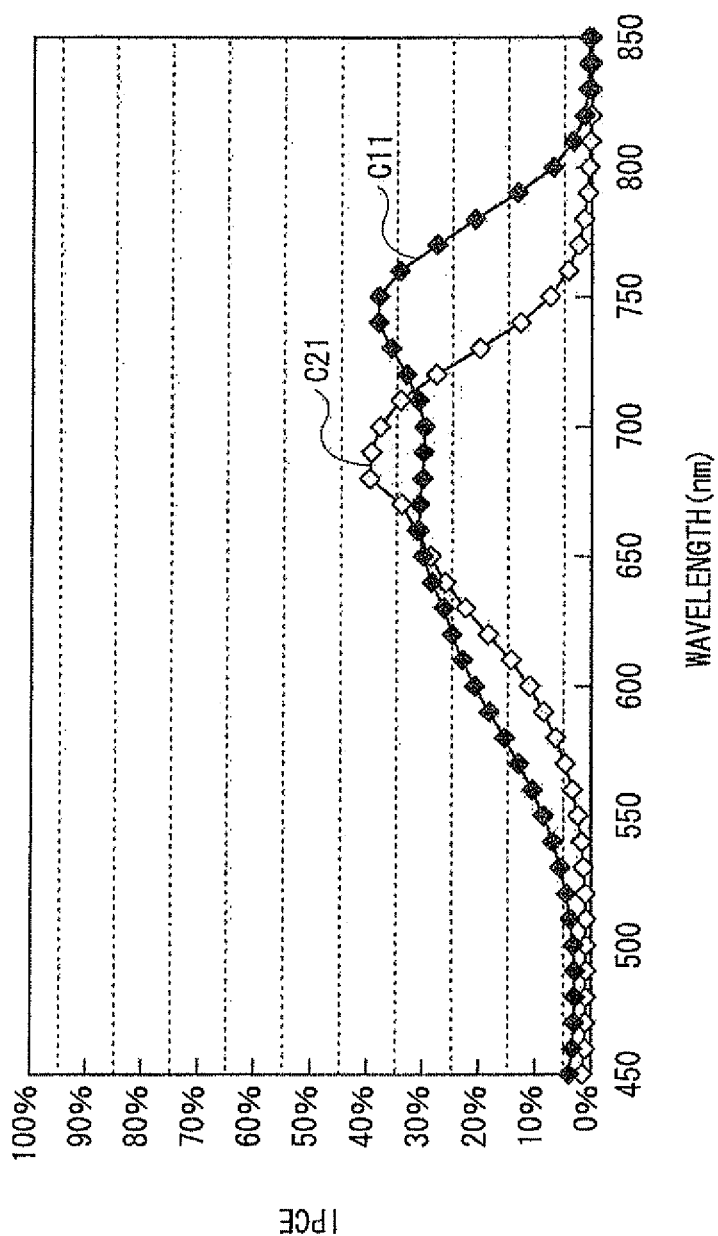
FIG. 3 is a characteristics diagram illustrating a relation between wavelength and IPCE in a dye-sensitized photoelectric conversion device of an example.

The conversion efficiency was obtained with the use of AM1.5 (1000 W/m$^2$) solar simulator as a light source by the following calculation method. First, a voltage of the dye-sensitized solar cells was swept by a source measurement device to measure a response current. Thereby, a value obtained by dividing the maximum output as a product of a voltage and a current by light intensity per 1 cm² was multiplied by 100, and the resultant percent value was regarded as conversion efficiency (η: %). That is, the conversion efficiency is expressed by (maximum output/light intensity per 1 cm²)*100. Further, in measuring IPCE, as a measurement equipment, SM-10AC made by Peecell Technologies Inc was used. In FIG. 3, the measurement result of Example 2-7 and the measurement result of Example 2-13 were respectively indicated by curved line C11 and curved line C21.

TABLE 2

Metal oxide semiconductor layer: ZnO (burning method)

| | Dye | Conversion efficiency (%) |
|---|---|---|
| Example 2-1 | Formula (8-1) | 2.35 |
| Example 2-2 | Formula (9-1) | 1.01 |
| Example 2-3 | Formula (10-1) | 1.11 |
| Example 2-4 | Formula (11-1) | 1.20 |
| Example 2-5 | Formula (12-1) | 1.20 |
| Example 2-6 | Formula (13-1) | 1.31 |
| Example 2-7 | Formula (14-1) | 1.40 |
| Example 2-8 | Formula (15-1) | 1.29 |
| Example 2-9 | Formula (299) | 0.57 |
| Example 2-10 | Formula (300) | 0.62 |
| Example 2-11 | Formula (301) | 0.66 |
| Example 2-12 | Formula (302) | 0.70 |
| Example 2-13 | Formula (303) | 0.81 |
| Example 2-14 | Formula (304) | 0.76 |
| Example 2-15 | Formula (305) | 0.72 |

As illustrated in Table 2, in the case where the metal oxide semiconductor layer 12 was formed by burning method and the metal oxide semiconductor layer 12 contained zinc oxide, in Examples 2-1 to 2-8 in which the dye 13 contained the compound shown in Formula (8-1) that had the phenanthrene skeleton or the like, the conversion efficiency was higher than that of Examples 2-9 to 2-15 in which the compound shown in Formula (299) that did not have the phenanthrene skeleton or the like was used. More specifically, in Example 2-1 using the cyanine compound having the methine chain skeleton with the carbon atomicity of 3, the conversion efficiency was significantly higher, about four times as much as that of Examples 2-9 and 2-10 that had the same methine chain skeleton but did not have the phenanthrene skeleton. As evidenced by comparison between Examples 2-2 to 2-8 and Examples 2-11 to 2-15, such tendency was similarly shown in the case of using the cyanine compound having the methine chain skeleton with the carbon atomicity of 5.

Further, as illustrated in FIG. 3, in Example 2-7 in which the cyanine compound containing the phenanthrene skeleton (Curved line C11) was used, the dye absorbed wider wavelength region light than that of Example 2-13 in which the cyanine compound having the benzene skeleton instead of the phenanthrene skeleton (Curved line C21) was used, and absorbed light was converted to a current. More specifically, in Example 2-7, there was a peak in which IPCE ratio was highest about 40% in about 750 nm wavelength, and the half bandwidth of the peak was about 200 nm. Meanwhile, in Example 2-13, there was a peak in which IPCE ratio was highest about 40% in about 680 nm wavelength, and the half bandwidth of the peak was about 120 nm.

The foregoing results showed the following. That is, the light absorption peak wavelength of the compound shown in Formula (8-1) or the like was shifted to longer wavelength side than the light absorption peak wavelength of the cyanine compound containing the benzene skeleton or the naphthalene skeleton instead of the phenanthrene skeleton (compounds shown in Formula (299) to Formula (305)) for the following reason. That is, in the case where the phenanthrene skeleton was contained, π conjugation was widened as an entire molecule. Meanwhile, the light absorption peak intensity of the compound shown in Formula (8-1) or the like was the same level as that of the cyanine compound containing the benzene skeleton or the naphthalene skeleton instead of the phenanthrene skeleton (compounds shown in Formula (299) to Formula (305)), and the light absorption peak of the compound shown in Formula (8-1) or the like was broadened, and the peak width was broadened. Thus, since the dye 13 contained the compound shown in Formula (8-1) or the like, the dye 13 absorbed wide wavelength region light and was excited, and effectively injected electrons into the metal oxide semiconductor layer 12. Thus, a current amount generated by photoelectric conversion in relation to radiated light amount (light amount of incident light to the dye 13) was increased.

Further, based on comparison between Example 2-3 and Example 2-4, conversion efficiency tended to be higher in the case of using the cyanine compound in which the anchor group (—$CH_2$—$CH_2$—COOH) was introduced to both Y1 and Y2 in Formula (1) than in the case of using the cyanine compound in which the anchor group (—$CH_2$—$CH_2$—COOH) was introduced to one of Y1 and Y2 in Formula (1). From the result, it was found that in the cyanine compound shown in Formula (1), in the case where the anchor group was introduced to both Y1 and Y2, absorption characteristics and electron injection efficiency to the metal oxide semiconductor layer 12 were improved.

Further, based on comparison between Example 2-2 and Example 2-3, conversion efficiency tended to be higher in the case of using the cyanine compound in which a sterically bulky group such as the group shown in Formula (2) such as a benzyl group was introduced as one of R7, R8, R10, and R11 in Formula (1). Further, based on comparison between Example 2-4 and Example 2-6, conversion efficiency tended to be higher in the case of using the cyanine compound in which two benzyl groups were introduced. From the results, it was found that in the compound shown in Formula (1), in the case where the group shown in Formula (2) was introduced as at least one of R7, R8, R10, and R11, formation of aggregate hardly contributing to improvement of conversion efficiency was inhibited.

Further, based on comparison between Example 2-5 and Example 2-8, conversion efficiency tended to be higher in the case of using the cyanine compound in which the cyano group was introduced to the methine chain skeleton. From the result, it was found that in the cyanine compound shown in Formula (1), in the case where the cyano group was introduced to the methine chain skeleton, at least one of absorption characteristics and electron injection efficiency to the metal oxide semiconductor layer 12 was improved.

Accordingly, in the photoelectric conversion device in which the metal oxide semiconductor layer 12 was formed by burning method and the metal oxide semiconductor layer 12 contained zinc oxide, the following was confirmed. That is, in the case where the dye 13 contains the cyanine compound shown in Formula (1) (specifically, the compound shown in Formula (4) or the compound shown in Formula (5)), conversion efficiency is able to be improved without depending on the cyanine compound type. In this case, in the case where both Y1 and Y2 are an anchor group in the cyanine compound shown in Formula (1), conversion efficiency is able to be more improved. Further, in the case where at least one of R7, R8, R10, and R11 is the group shown in Formula (2), higher conversion efficiency is able to be obtained. Furthermore, in the case where the cyano group is introduced to the methine chain skeleton, further higher conversion efficiency is able to be obtained.

Examples 3-1 to 3-15

A procedure similar to that of Examples 2-1 to 2-15 was taken, except that the metal oxide semiconductor layer 12 was formed by electrodeposition method. In forming the metal oxide semiconductor layer 12 by electrodeposition method, the following procedure was taken. First, 40 ml of an electrolytic solution prepared so that respective concentrations of eosin Y, zinc chloride, and potassium chloride were 30 µmol/dm$^3$, 5 mmol/dm$^3$, and 0.09 mol/dm$^3$ in water; a counter electrode composed of a zinc plate; and a reference electrode composed of a silver/silver chloride electrode were prepared. Subsequently, an electrolytic bath liquid was provided with bubbling with the use of oxygen for 15 minutes. After that, a film was formed on the surface of the conductive substrate 11 by providing constant-potential electrolysis with electric potential of −1.0 V for 60 minutes at temperature of a solution in the electrolytic bath liquid of 70 deg C. while providing bubbling. Finally, the substrate was not dried and soaked into a potassium hydroxide aqueous solution (pH11), and was subsequently washed with water, and thereby eosin Y was desorbed. Subsequently, the resultant was dried for 30 minutes at 150 deg C.

For the dye-sensitized solar cells of Examples 3-1 to 3-15, conversion efficiency was examined, and the results illustrated in Table 3 were obtained.

TABLE 3

Metal oxide semiconductor layer: ZnO
(electrolytic precipitation method)

| | Dye | Conversion efficiency (%) |
|---|---|---|
| Example 3-1 | Formula (8-1) | 2.56 |
| Example 3-2 | Formula (9-1) | 1.53 |
| Example 3-3 | Formula (10-1) | 1.72 |
| Example 3-4 | Formula (11-1) | 1.91 |
| Example 3-5 | Formula (12-1) | 1.83 |
| Example 3-6 | Formula (13-1) | 2.04 |
| Example 3-7 | Formula (14-1) | 2.21 |
| Example 3-8 | Formula (15-1) | 1.97 |
| Example 3-9 | Formula (299) | 0.77 |
| Example 3-10 | Formula (300) | 0.89 |
| Example 3-11 | Formula (301) | 0.82 |
| Example 3-12 | Formula (302) | 0.99 |
| Example 3-13 | Formula (303) | 1.22 |
| Example 3-14 | Formula (304) | 0.95 |
| Example 3-15 | Formula (305) | 0.71 |

As illustrated in Table 3, in the case where the metal oxide semiconductor layer 12 was formed by electrodeposition method, results similar to those of Table 2 were obtained. That is, in Examples 3-1 to 3-8 in which the dye 13 contained the compound shown in Formula (8-1) having a phenanthrene skeleton or the like, the conversion efficiency was higher than those of Examples 3-9 to 3-15 using the compound shown in Formula (299) not containing a phenanthrene skeleton or the like.

In this case, again, based on comparison between Example 3-3 and Example 3-4, conversion efficiency tended to be higher in the case of using the cyanine compound in which the anchor group (—CH$_2$—CH$_2$—COOH) was introduced to both Y1 and Y2 in Formula (1). Further, based on comparison between Example 3-2 and Example 3-3 and between Example 3-4 and Example 3-6, conversion efficiency was higher in the case of using the cyanine compound in which the group shown in Formula (2) such as a benzyl group was introduced as one of R7, R8, R10, and R11 in Formula (1). Further, based on comparison between Example 3-5 and Example 3-8, conversion efficiency was higher in the case of using the cyanine compound in which the cyano group was introduced to the methine chain skeleton.

Accordingly, in the photoelectric conversion device in which the metal oxide semiconductor layer 12 was formed by electrodeposition method and the metal oxide semiconductor layer 12 contained zinc oxide, the following was confirmed as well. That is, in the case where the dye 13 contains the cyanine compound shown in Formula (1), conversion efficiency is able to be improved without depending on the cyanine compound type. In this case, in the cyanine compound shown in Formula (1), in the case where both Y1 and Y2 are an anchor group, in the case where at least one of R7, R8, R10, and R11 is the group shown in Formula (2), or in the case where the cyano group is introduced to the ethine chain skeleton, higher conversion efficiency is able to be obtained.

Examples 4-1 to 4-15

A procedure similar to that of Examples 2-1 to 2-15 was taken, except that a metal oxide slurry containing titanium oxide (TiO$_2$) powder was used instead of zinc oxide powder in forming the metal oxide semiconductor layer 12 by burning method. In this case, the metal oxide slurry containing titanium oxide powder was prepared as follows. First, 125 cm$^3$ of titanisopropoxide was added to 750 cm$^3$ of 0.1 mol/dm$^3$ nitric acid aqueous solution while being stirred, and was heavily stirred for 8 hours at 80 deg C. The obtained liquid was poured into a pressure container made of Teflon (registered trademark), and the pressure container was processed in an autoclave for 16 hours at 230 deg C. After that, a liquid (sol liquid) containing precipitate provided with autoclave process was stirred, and thereby was resuspended. Subsequently, the suspending solution was suctioned and filtrated to remove precipitate that was not resuspended, and the sol filtrate was condensed by an evaporator until the concentration of titanium oxide became 11 wt %. After that, to improve coating characteristics to the substrate, one drop of Triton X-100 was added to the concentrated liquid. Subsequently, titanium oxide powder having an average particle diameter of 30 µm (P-25 made by Aerosil Japan) was added to the sol concentrated liquid so that the content ratio of titanium oxide was 33 wt % as a whole. The resultant was provided with centrifugal stirring by using rotation and orbital motion for 1 hour, and was dispersed.

For the dye-sensitized solar cells of Examples 4-1 to 4-15, conversion efficiency was examined, and the results illustrated in Table 4 were obtained.

TABLE 4

Metal oxide semiconductor layer: TiO$_2$ (burning method)

| | Dye | Conversion efficiency (%) |
|---|---|---|
| Example 4-1 | Formula (8-1) | 0.61 |
| Example 4-2 | Formula (9-1) | 0.49 |
| Example 4-3 | Formula (10-1) | 0.50 |
| Example 4-4 | Formula (11-1) | 0.54 |
| Example 4-5 | Formula (12-1) | 0.38 |
| Example 4-6 | Formula (13-1) | 0.55 |
| Example 4-7 | Formula (14-1) | 0.55 |

TABLE 4-continued

Metal oxide semiconductor layer: TiO$_2$ (burning method)

| | Dye | Conversion efficiency (%) |
|---|---|---|
| Example 4-8 | Formula (15-1) | 0.48 |
| Example 4-9 | Formula (299) | 0.40 |
| Example 4-10 | Formula (300) | 0.44 |
| Example 4-11 | Formula (301) | 0.35 |
| Example 4-12 | Formula (302) | 0.32 |
| Example 4-13 | Formula (303) | 0.41 |
| Example 4-14 | Formula (304) | 0.41 |
| Example 4-15 | Formula (305) | 0.33 |

As illustrated in Table 4, in the case where the metal oxide semiconductor layer 12 was formed by burning method and the metal oxide semiconductor layer 12 contained titanium oxide, results similar to those of Table 2 were obtained. That is, in Examples 4-1 to 4-8 in which the dye 13 contained the compound shown in Formula (8-1) having a phenanthrene skeleton or the like, the conversion efficiency was higher than those of Examples 4-9 to 4-15 using the compound shown in Formula (299) not containing a phenanthrene skeleton or the like.

In this case, again, based on comparison between Example 4-3 and Example 4-4, conversion efficiency was higher in the case of using the cyanine compound in which the anchor group (—CH$_2$—CH$_2$—COOH) was introduced to both Y1 and Y2 in Formula (1). Further, based on comparison between Example 4-2 and Example 4-3 and between Example 4-4 and Example 4-6, conversion efficiency was higher in the case of using the cyanine compound in which a benzyl group was introduced as one of R7, R8, R10, and R11 in Formula (1). Further, based on comparison between Example 4-5 and Example 4-8, conversion efficiency was higher in the case of using the cyanine compound in which the cyano group was introduced to the methine chain skeleton.

Accordingly, in the photoelectric conversion device in which the metal oxide semiconductor layer 12 was formed by burning method and the metal oxide semiconductor layer 12 contained titanium oxide, the following was confirmed as well. That is, in the case where the dye 13 contains the cyanine compound shown in Formula (1), conversion efficiency is able to be improved without depending on the cyanine compound type. In this case, in the cyanine compound shown in Formula (1), in the case where both Y1 and Y2 are an anchor group, in the case where at least one of R7, R8, R10, and R11 is the group shown in Formula (2), or in the case where the cyano group is introduced to the methine chain skeleton, higher conversion efficiency is able to be obtained.

Examples 5-1 to 5-15

A procedure similar to that of Examples 2-1 to 2-15 was taken, except that tin oxide (SnO$_2$) powder was used instead of zinc oxide powder in forming the metal oxide semiconductor layer 12 by burning method. In this case, tin oxide powder having a surface area of 50 m$^2$/g and an average primary particle diameter of 30 nm or less (S-2000 made by Jemco) was used.

For the dye-sensitized solar cells of Examples 5-1 to 5-15, conversion efficiency was examined, and the results illustrated in Table 5 were obtained.

TABLE 5

Metal oxide semiconductor layer: SnO$_2$ (burning method)

| | Dye | Conversion efficiency |
|---|---|---|
| Example 5-1 | Formula (8-1) | 0.15 |
| Example 5-2 | Formula (9-1) | 0.10 |
| Example 5-3 | Formula (10-1) | 0.11 |
| Example 5-4 | Formula (11-1) | 0.13 |
| Example 5-5 | Formula (12-1) | 0.10 |
| Example 5-6 | Formula (13-1) | 0.15 |
| Example 5-7 | Formula (14-1) | 0.12 |
| Example 5-8 | Formula (15-1) | 0.15 |
| Example 5-9 | Formula (299) | 0.01 |
| Example 5-10 | Formula (300) | 0.02 |
| Example 5-11 | Formula (301) | 0.01 |
| Example 5-12 | Formula (302) | 0.02 |
| Example 5-13 | Formula (303) | 0.01 |
| Example 5-14 | Formula (304) | 0.02 |
| Example 5-15 | Formula (305) | 0.01 |

As illustrated in Table 5, in the case where the metal oxide semiconductor layer 12 was formed by burning method and the metal oxide semiconductor layer 12 contained tin oxide, results similar to those of Table 2 were obtained. That is, in Examples 5-1 to 5-8 in which the dye 13 contained the compound shown in Formula (8-1) having a phenanthrene skeleton or the like, the conversion efficiency was higher than those of Examples 5-9 to 5-15 using the compound shown in Formula (299) not having a phenanthrene skeleton or the like.

In this case, again, based on comparison between Example 5-3 and Example 5-4, conversion efficiency was higher in the case of using the cyanine compound in which the anchor group (—CH$_2$—CH$_2$—COOH) was introduced to both Y1 and Y2 in Formula (1). Further, based on comparison between Example 5-2 and Example 5-3 and between Example 5-4 and Example 5-6, conversion efficiency was higher in the case of using the cyanine compound in which a benzyl group was introduced as one of R7, R8, R10, and R11 in Formula (1). Further, based on comparison between Example 5-5 and Example 5-8, conversion efficiency was higher in the case of using the cyanine compound in which the cyano group was introduced to the methine chain skeleton.

Accordingly, in the photoelectric conversion device in which the metal oxide semiconductor layer 12 was formed by burning method and the metal oxide semiconductor layer 12 contained tin oxide, the following was confirmed as well. That is, in the case where the dye 13 contained the cyanine compound shown in Formula (1), conversion efficiency is able to be improved without depending on the cyanine compound type. In this case, in the case where both Y1 and Y2 are an anchor group in the cyanine compound shown in Formula (1), in the case where at least one of R7, R8, R10, and R11 is the group shown in Formula (2), or in the case where the cyano group is introduced to the methine chain skeleton, higher conversion efficiency is able to be obtained.

Further, from the results of Table 2 to Table 5, it was confirmed that in the photoelectric conversion device in the examples, in the case where the dye 13 contained the cyanine compound shown in Formula (1), the conversion efficiency was improved without depending on the cyanine compound type, a method of forming the metal oxide semiconductor layer 12, and the metal oxide semiconductor material type. In this case, in the case of using zinc oxide as a metal oxide semiconductor material (refer to Table 2 and Table 3), the conversion efficiency was higher than that in the case of using titanium oxide or tin oxide (refer to Table 4 and Table 5). Accordingly, it was confirmed that in particular, in the case where the metal oxide semiconductor layer 12 contained zinc oxide, the conversion efficiency was more improved.

The present invention has been described with reference to the embodiment and the examples. However, the present invention is not limited to the aspects explained in the foregoing embodiment and the foregoing examples, and various modifications may be made. For example, usage application of the photoelectric conversion device of the present invention is not always limited to the application already explained, but other applications may be adopted. Examples of other applications include a light sensor.

The invention claimed is:

1. A dye for a photoelectric conversion device, wherein the dye has a cyanine structure represented by Formula (1):

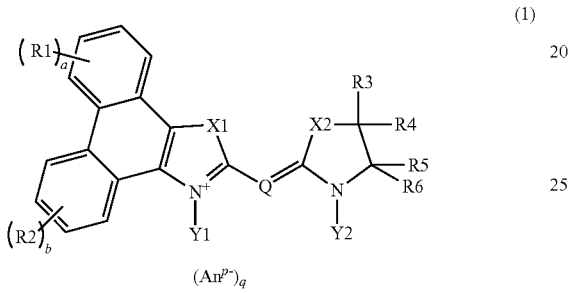

(1)

where:
R1 and R2 are independently:
  a hydroxyl group, a nitro group, a cyano group, or a halogen atom; or
  an alkyl group, an alkoxy group, an aryl group, or an arylalkyl group;
a and b are independently an integer of 0 to 4;
R3, R4, R5, and R6 are independently:
  a hydrogen atom, a hydroxyl group, a nitro group, a cyano group, or a halogen atom; or
  an alkyl group, an alkoxy group, an aryl group, or an arylalkyl group;
at least one of R3 and R4 and at least one of R5 and R6 may be respectively detached to form a double bond, or may be respectively linked with each other to form one or more ring structures;
X1 is a group represented by —C(R7)(R8)-, a group represented by —N(R9)-, a sulfur atom, an oxygen atom, a selenium atom, or a tellurium atom;
X2 is a group represented by —C(R10)(R11)-, a group represented by —N(R12)-, a sulfur atom, an oxygen atom, a selenium atom, or a tellurium atom;
R7, R8, R10, and R11 are independently:
  a hydrogen atom or a group represented by Formula (2); or
  an alkyl group, an alkoxy group, an aryl group, or an arylalkyl group, except for a group corresponding to the group represented by Formula (2);
R9 and R12 are independently:
  a hydrogen atom, a hydroxyl group, a nitro group, a cyano group, or a halogen atom; or
  an alkyl group, an alkoxy group, an aryl group, or an arylalkyl group;
Y1 and Y2 are independently:
  an alkyl group, an alkoxy group, an aryl group, an arylalkyl group, or an anchor group represented by —R30-$Z1_e$, where:

R30 is a saturated hydrocarbon group with (e+1) valency; and
Z1 is a carboxylic acid group, a sulfonic acid group, a phosphoric group, a carboxylic acid ion group, a sulfonic acid ion group, or a phosphoric ion group;
at least one of Y1 and Y2 is an anchor group;
Q is a linkage group selected from the group consisting of linkage groups represented by Formulas (7-1) to (7-10):

(7-1)

(7-2)

(7-3)

(7-4)

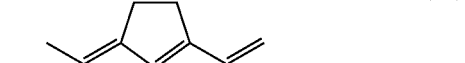

(7-5)

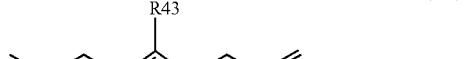

(7-6)

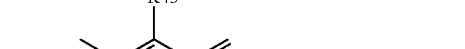

(7-7)

(7-8)

(7-9)

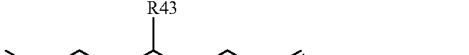

(7-10)

where R43 to R49 are independently a hydrogen atom, a hydroxyl group, a halogen atom, a cyano group, an aryl group having from 6 to 30 carbon atoms, a diphenyl amino group, an alkyl group having from 1 to 8 carbon atoms, or an alkoxyl group having from 1 to 8 carbon atoms;

$An^{p-}$ is an anion with p valency;

p is 1 or 2;

q is a coefficient to maintain neutral electric charge;

Formula (2) has the following structure:

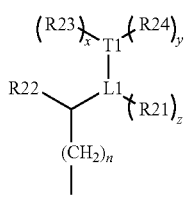

(2)

where:

the bond between L1 and T1 is a double bond or a triple bond;

L1 represents a carbon atom;

T1 represents a carbon atom, an oxygen atom, or a nitrogen atom;

x, y, and z are independently 0 or 1, wherein x and y are 0 if T1 is an oxygen atom, and (y+z) is 0 or 1 if T1 is a nitrogen atom;

R21, R22, and R23 are independently a hydrogen atom, a hydroxyl group, a nitro group, a cyano group, a halogen atom, an alkyl group having 1 to 4 carbon atoms, or a halogenated alkyl group having 1 to 4 carbon atoms;

R24 is a hydrogen atom, a hydroxyl group, a nitro group, a cyano group, a halogen atom, an alkyl group having 1 to 4 carbon atoms, an alkoxy group having 1 to 4 carbon atoms, a halogenated alkyl group having 1 to 4 carbon atoms, or a halogenated alkoxy group having 1 to 4 carbon atoms;

R21 and R24/R22 and R23 may be respectively linked with each other to form one or more ring structures; and n is an integer of 0 to 4.

2. The dye for a photoelectric conversion device according to claim 1, wherein the cyanine structure represented by Formula (1) is a structure represented by Formula (3):

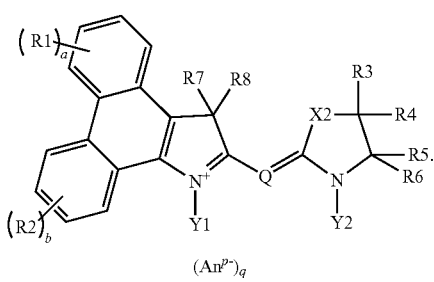

(3)

3. The dye for a photoelectric conversion device according to claim 2, wherein the structure represented by Formula (3) is a structure represented by Formula (4):

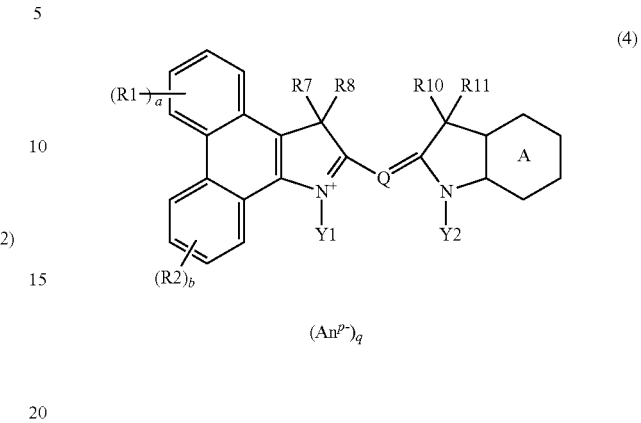

(4)

where:

ring A is a benzene ring, a naphthalene ring, or a phenanthrene ring.

4. The dye for a photoelectric conversion device according to claim 3, wherein the structure represented by Formula (4) is a structure represented by Formula (5):

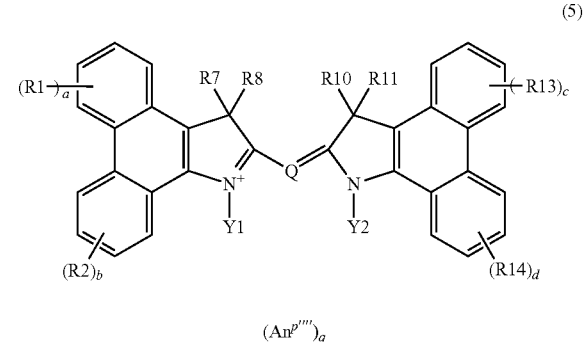

(5)

where:

R13 and R14 are independently:

a hydroxyl group, a nitro group, a cyano group, or a halogen atom; or an alkyl group, an alkoxy group, an aryl group, an arylalkyl group, or a derivative thereof; and c and d are independently an integer of 0 to 4.

5. The dye for a photoelectric conversion device according to claim 1, wherein at least one of R7, R8, R10, and R11 is a group represented by Formula (2).

6. The dye for a photoelectric conversion device according to claim 1, wherein the anchor group is a group represented by —$CH_2$—$CH_2$—C(=O)—OH or a group represented by —$CH_2$—$CH_2$—C(=O)—$O^-$.

7. The dye for a photoelectric conversion device according to claim 1, wherein both Y1 and Y2 are the anchor group.

8. A photoelectric conversion device, comprising:
an electrode having the dye according to claim 1; and
a support that supports the dye

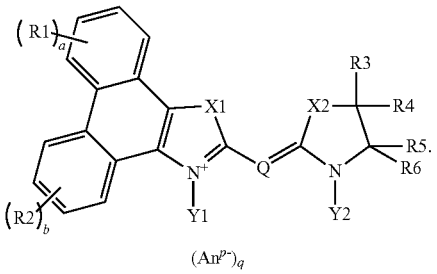

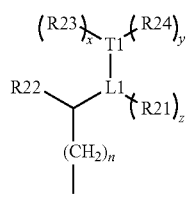

9. A photoelectric conversion device, comprising:
an electrode having the dye according to claim 2; and
a support that supports the dye,

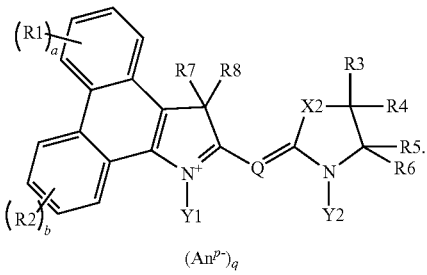

10. A photoelectric conversion device, comprising:
an electrode having the dye according to claim 3; and
a support that supports the dye,

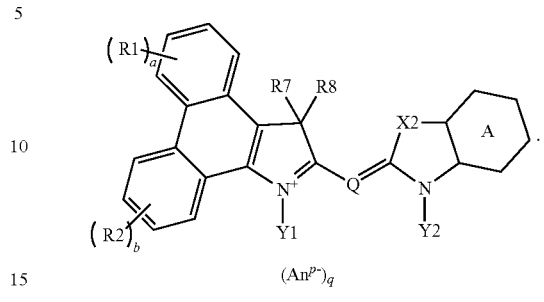

11. A photoelectric conversion device, comprising:
an electrode having the dye according to claim 4; and
a support that supports the dye,

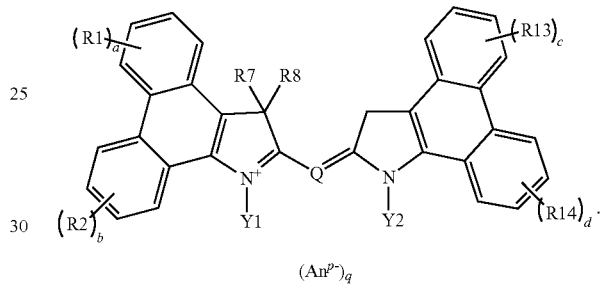

12. The photoelectric conversion device according to claim 8, wherein at least one of R7, R8, R10, and R11 is the group represented by Formula (2).

13. The photoelectric conversion device according to claim 8, wherein the anchor group is a group represented by —CH$_2$—CH$_2$—C(=O)—OH or a group represented by —CH$_2$—CH$_2$—C(=O)—O$^-$.

14. The photoelectric conversion device according to claim 8, wherein both Y1 and Y2 are an anchor group.

15. The photoelectric conversion device according to claim 8, wherein the support contains zinc oxide (ZnO).

* * * * *